(12) United States Patent
Jeong

(10) Patent No.: US 9,368,688 B2
(45) Date of Patent: Jun. 14, 2016

(54) LIGHT EMITTING DEVICE

(71) Applicant: LG INNOTEK CO., LTD., Seoul (KR)

(72) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 150 days.

(21) Appl. No.: 14/153,339

(22) Filed: Jan. 13, 2014

(65) Prior Publication Data
US 2014/0197372 A1    Jul. 17, 2014

(30) Foreign Application Priority Data

Jan. 14, 2013  (KR) .................. 10-2013-0003909
Feb. 14, 2013  (KR) .................. 10-2013-0015941
Feb. 15, 2013  (KR) .................. 10-2013-0016132
Feb. 27, 2013  (KR) .................. 10-2013-0021287
Feb. 27, 2013  (KR) .................. 10-2013-0021288

(51) Int. Cl.
  *H01L 29/06*   (2006.01)
  *H01L 31/00*   (2006.01)
  *H01L 33/38*   (2010.01)
  *H01L 29/786*  (2006.01)
  *H01L 29/66*   (2006.01)

(52) U.S. Cl.
  CPC ......... *H01L 33/382* (2013.01); *H01L 29/66969* (2013.01); *H01L 29/7869* (2013.01); *H01L 33/387* (2013.01)

(58) Field of Classification Search
  CPC ................. H01L 29/7869; H01L 29/66969; H01L 29/78696; H01L 27/1225
  See application file for complete search history.

(56) References Cited

U.S. PATENT DOCUMENTS 7,420,221 B2 *  9/2008  Nagai ................ H01L 33/22
                                        257/100
2003/0230754 A1  12/2003  Steigerwald et al.
(Continued)

FOREIGN PATENT DOCUMENTS

DE  10 2010 025 3    12/2011
JP  2007-287849 A    11/2007
(Continued)

OTHER PUBLICATIONS

Japanese Office Action issued in related Application No. 2014-002980 dated Dec. 24, 2014.
Japanese Office Action issued in Application No. 2014-002980 dated Feb. 9, 2016.
European Search Report dated Apr. 5, 2016 issued in Application No. 14150357.3.

*Primary Examiner* — Zandra Smith
*Assistant Examiner* — John M Parker
(74) *Attorney, Agent, or Firm* — KED & Associates, LLP

(57) ABSTRACT

A light emitting device includes a light emitting structure having a first conductive semiconductor layer, an active layer under the first conductive semiconductor layer, and a second conductive semiconductor layer under the active layer. A first electrode is electrically connected to the first conductive semiconductor layer and is provided under the light emitting structure, and a second electrode is electrically connected to the second conductive semiconductor layer and is provided under the light emitting structure. A first contact portion is provided through the light emitting structure and includes a first region electrically connected to the first electrode. A second region contacts a top surface of the first conductive semiconductor layer, and an insulating ion implantation layer is provided around the first contact portion to insulate the first contact portion from the second conductive semiconductor layer.

19 Claims, 40 Drawing Sheets

(56) References Cited

U.S. PATENT DOCUMENTS

| | | | | |
|---|---|---|---|---|
| 2008/0308823 | A1* | 12/2008 | Kamii | H01L 27/15 257/94 |
| 2012/0241724 | A1 | 9/2012 | Tsang | |
| 2012/0261695 | A1* | 10/2012 | Chen | H01L 33/38 257/98 |
| 2013/0049008 | A1* | 2/2013 | Jeong | H01L 25/0753 257/76 |
| 2013/0049030 | A1* | 2/2013 | Jeong | H01L 33/08 257/88 |
| 2013/0187192 | A1 | 7/2013 | Hoeppel | |
| 2013/0221398 | A1* | 8/2013 | Kim | H01L 33/382 257/99 |

FOREIGN PATENT DOCUMENTS

| | | |
|---|---|---|
| JP | 2009-194109 A | 8/2009 |
| JP | 2010-525585 A | 7/2010 |
| JP | 2011-060996 A | 3/2011 |
| JP | 2011-166150 A | 8/2011 |
| JP | 2012-004297 A | 1/2012 |
| JP | 2012-23375 A | 2/2012 |
| JP | 2012-119428 A | 6/2012 |
| WO | WO 2012/000725 A1 | 1/2012 |
| WO | WO 2012/136460 A1 | 10/2012 |

* cited by examiner

LIGHT EMITTING DEVICE

CROSS-REFERENCE TO RELATED APPLICATIONS

This application claims priority under 35 U.S.C. §119 to Korean Patent Application No. 10-2013-0003909 filed on Jan. 14, 2013, Korean Patent Application No. 10-2013-0015941 filed on Feb. 14, 2013, Korean Patent Application No. 10-2013-0016132 filed on Feb. 15, 2013, Korean Patent Application No. 10-2013-0021287 filed on Feb. 27, 2013, and Korean Patent Application No. 10-2013-0021288 filed on Feb. 27, 2013, which are hereby incorporated by reference in their entirety.

BACKGROUND

1. Field

The embodiment relates to a light emitting device, a light emitting device package, and a light unit.

2. Background

A light emitting diode (LED) has been extensively used as one of light emitting devices. The LED converts electrical signals into the form of light such as infra-red light, visible light and ultra-violet light by using the characteristic of a compound semiconductor.

As the light efficiency of the light emitting device is increased, the light emitting device has been used in various fields such as display apparatuses and lighting appliances.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Hereinafter, a light emitting device, a light emitting device package, a light unit, and a method for fabricating the light emitting device according to the embodiments will be described in detail with reference to accompanying drawings.

Figure 1:
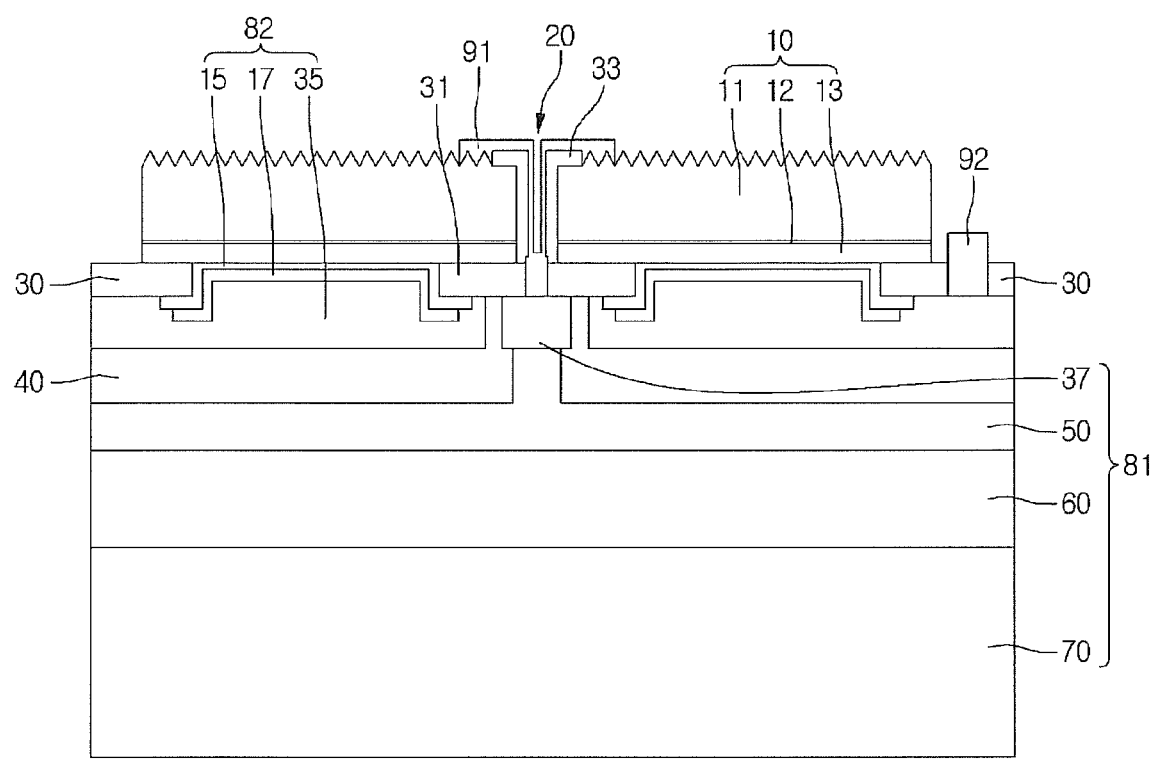
FIG. 1 is a view showing a light emitting device according to the embodiment.
Figure 2:
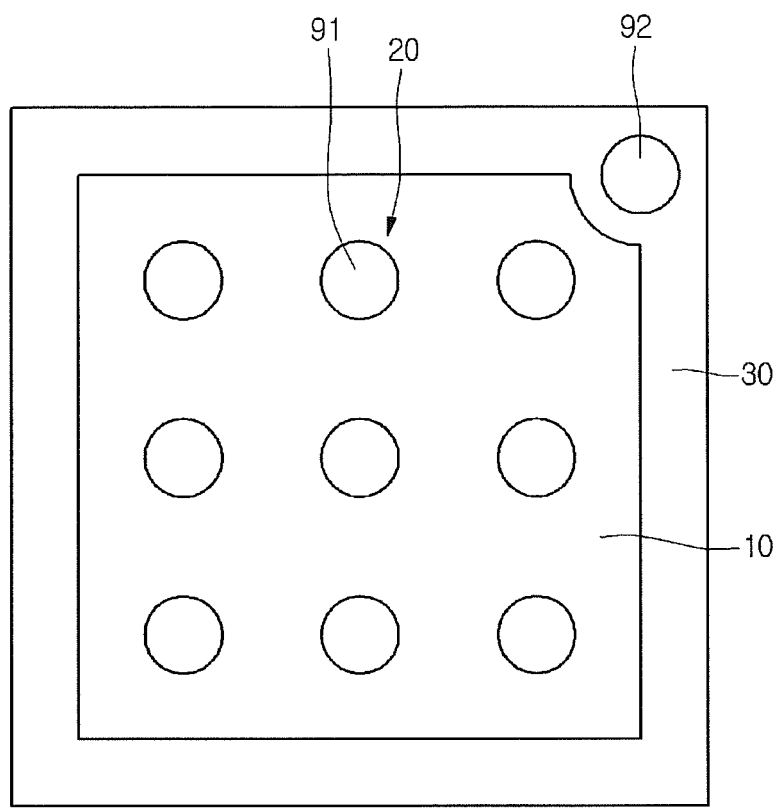
FIG. 2 is a view showing an example of a through hole formed in a light emitting structure of a light emitting device shown in FIG. 1.

As shown in FIGS. 1 and 2, the light emitting device according to the embodiment may include a light emitting structure 10, a first electrode 81, a second electrode 82 and a first contact portion 91.

The light emitting structure 10 may include a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of InxAlyGa1−x−yN (0≤x≤1, 0≤y≤1, 0≤x+y≤1). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of InxAlyGa1−x−yN (0≤x≤1, 0≤y≤1, 0≤x+y≤1). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of InxAlyGa1−x−yN (0≤x≤1, 0≤y≤1, 0≤x+y≤1). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light emitting structure 10 may have various structures, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The light emitting device according to the embodiment may include a reflective layer 17. The reflective layer may be electrically connected to the second conductive semiconductor layer 13. The reflective layer may be disposed under the light emitting structure 10. The reflective layer may be disposed under the second conductive semiconductor layer 13. The reflective layer 17 may reflect light incident thereto from the light emitting structure 10 to increase the quantity of light extracted to an outside.

The light emitting device according to the embodiment may include an ohmic contact layer 15 disposed between the reflective layer 17 and the second conductive semiconductor layer 13. The ohmic contact layer 15 may make contact with the second conductive semiconductor layer 13. The ohmic contact layer 15 may make ohmic contact with the light emitting structure 10. The ohmic contact layer 15 may include a region that makes ohmic-contact with the light emitting structure 10. The ohmic contact layer 15 may include a region that makes ohmic-contact with the second conductive semiconductor layer 13.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

The light emitting device according to the embodiment may include a first metal layer 35 provided under the reflective layer 17. The first metal layer 35 may include at least one of Au, Cu, Ni, Ti, Ti—W, Cr, W, Pt, V, Fe, and Mo.

According to the embodiment, the second electrode 82 may include at least one of the reflective layer 17, the ohmic contact layer 15, and the first metal layer 35. For example, the second electrode 82 may include all of the reflective layer 17, the first metal layer 35, and the ohmic contact layer 15, or may include one or two selected from the reflective layer 17, the first metal layer 35, and the ohmic contact layer 15.

The second electrode 82 according to the embodiment may be disposed under the light emitting structure 10. The second electrode 82 may be electrically connected to the second conductive semiconductor layer 13.

The light emitting device according to the embodiment may include a channel layer 30 provided around a lower portion of the light emitting structure 10. One end of the channel layer 30 may be provided under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the reflective layer 17. The one end of the channel layer 30 may be disposed between the second conductive semiconductor layer 13 and the ohmic contact layer 15.

The channel layer 30 may include an insulating material. For example, the channel layer 30 may be realized by using oxide or nitride. For example, the channel layer 30 may include at least one selected from the group consisting of SiO2, SixOy, Si3N4, SixNy, SiOxNy, Al2O3, TiO2, and AlN. The channel layer 30 may be referred to as an isolation layer. The channel layer 30 may serve as an etching stopper when an isolation process is performed with respect to the light emitting structure 10 later. In addition, the channel layer 30 may prevent the electrical characteristic of the light emitting device from being degraded caused by the isolation process.

The light emitting device according to the embodiment may include a first insulating layer 31. For example, the first insulating layer 31 may be realized by using oxide or nitride. For example, the first insulating layer 31 may include at least one selected from the group consisting of SiO2, SixOy, Si3N4, SixNy, SiOxNy, Al2O3, TiO2, and AlN. The first insulating layer 31 may be formed by using a material constituting the channel layer 30. In addition, the first insulating layer 31 and the channel layer 30 may be formed by mutually different materials.

The light emitting device according to the embodiment may include a second metal layer 37 provided under the first insulating layer 31. The second metal layer 37 may include at least one of Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

A second insulating layer 40 may be disposed between the first and second metal layers 35 and 37. The second insulating layer 40 may be formed by using oxide or nitride. For example, the second insulating layer 40 may include at least one selected from the group consisting of SiO2, SixOy, Si3N4, SixNy, SiOxNy, Al2O3, TiO2, and AlN. The second insulating layer 40 may be disposed under the first metal layer 35. The second insulating layer 40 may be disposed under the first insulating layer 31.

A third metal layer 50 may be disposed under the second metal layer 37. The third metal layer 50 may be electrically connected to the second metal layer 37. A top surface of the third metal layer 50 may make contact with a bottom surface of the second metal layer 37. The third metal layer 50 may be disposed under the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided under the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta.

The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 37, the third metal layer 50, the bonding layer 60 and the conductive support member 70. The first electrode 81 may include all of the second metal layer 37, the third metal layer 50, the bonding layer 60 and the conductive support member 70. In addition, the first electrode 81 may selectively include two or three of the second metal layer 37, the third metal layer 50, the bonding layer 60 and the conductive support member 70.

The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The light emitting device according to the embodiment may include the first contact portion 91. The first contact portion 91 may be disposed through the light emitting structure 10. The first contact portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11.

For instance, the first region of the first contact portion 91 may make contact with the second metal layer 37. The first region of the first contact portion 91 may make contact with the top surface of the second metal layer 37. For example, when the light emitting structure 10 is grown into a GaN semiconductor layer, the first contact portion 91 may make contact with an n face of the first conductive semiconductor layer 11.

Although only one first contact portion 91 is illustrated in the light emitting device shown in FIG. 1, the light emitting structure 10 according to the embodiment may be formed with a plurality of through holes 20 as shown in FIG. 2 and the first contact portion 91 may be formed in each through hole 20.

Each of the first contact portions 91 may include the second region that makes contact with the top surface of the first conductive semiconductor layer 11 and the second regions may be spaced apart from each other. For example, the second regions may be configured in the form of dots. The dots may be arranged in the form of a circle, a rectangle or a triangle. The arrangement of the dots may be variously modified.

Meanwhile, the through hole 20 may have a width or a diameter D in the range of about 5 μm to about 200 μm If the through hole 20 has a width or a diameter less than about 5 μm the process to form the first contact portion 91 may be difficult. In addition, if the through hole 20 has a width or a diameter greater about 200 μm the light emitting area of the light emitting structure 10 is reduced so that the light extraction efficiency may be degraded. The first contact portion 91 disposed in the through hole 20 may also have a width or a diameter in the range of about 5 μm to about 200 μm The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of about 5 μm to about 50 μm According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A third insulating layer 33 may be disposed around the first contact portion 91. A first region of the third insulating layer 33 may be disposed in the light emitting structure 10. A second region of the third insulating layer 33 may be disposed on a top surface of the light emitting structure 10. The second region of the third insulating layer 33 may be disposed between the first conductive semiconductor layer 11 and the first contact portion 91. The first region of the third insulating layer 33 may insulate the first contact portion 91 from the active layer 12 and the second conductive semiconductor layer 13. The first region of the third insulating layer 33 may electrically insulate the first contact portion 91 from the active layer 12. The first region of the third insulating layer 33 may electrically insulate the first contact portion 91 from the second conductive semiconductor layer 13.

The third insulating layer 33, for example, includes an oxide or a nitride. For example, the third insulating layer 33 may be formed by using at least one selected from the group consisting of SiO2, SixOy, Si3N4, SixNy, SiOxNy, Al2O3, TiO2, and AlN.

The third insulating layer 33 may be disposed through the second conductive semiconductor layer 13, the active layer 12 and the first conductive semiconductor layer 11. The third insulating layer 33 may be disposed around the first contact portion 91.

In addition, the light emitting device according to the embodiment may include a second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials.

A roughness may be formed on the top surface of the first conductive semiconductor layer 11. Accordingly, the quantity of light extracted upward at the region where the roughness is formed can be increased.

The light emitting device according to the embodiment may include the second insulating layer 40 disposed between the first metal layer 35 and the third metal layer 50. The second insulating layer 40 may insulate the first metal layer 35 from the third metal layer 50. The second insulating layer 40 may insulate the first metal layer 35 from the conductive support member 70. For example, the second insulating layer 40 may be realized by using oxide or nitride. For example, the second insulating layer 40 may include at least one selected from the group consisting of SiO2, SixOy, Si3N4, SixNy, SiOxNy, Al2O3, TiO2, and AlN.

A portion of the second insulating layer 40 may surround a peripheral portion of the second metal layer 37. An upper portion of the second insulating layer 40 may make contact with the bottom surface of the first insulating layer 31.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Hereinafter, a method of fabricating the light emitting device according to the embodiment will be described with reference to FIGS. 3 to 6.

Figure 3:
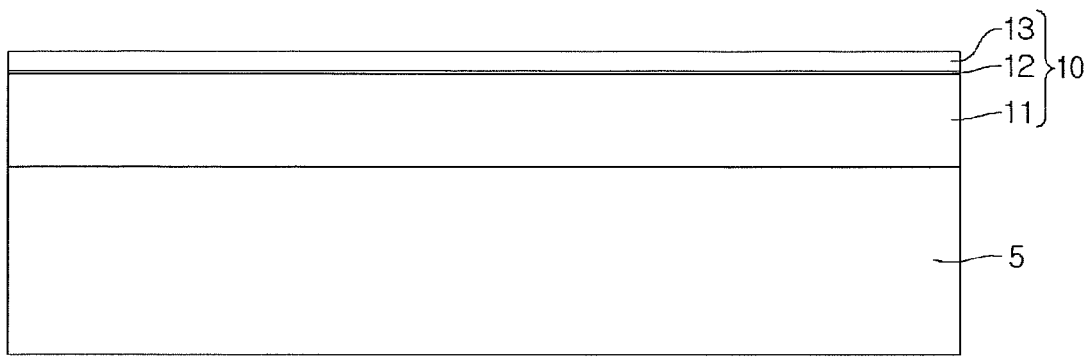
FIGS. 3 to 6 are sectional views showing a method of fabricating a light emitting device according to the embodiment.

According to the method of fabricating the light emitting device of the embodiment, as shown in FIG. 3, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light emitting structure 10.

For example, the substrate 5 may include at least one of a sapphire substrate (Al2O3), SiC, GaAs, GaN, ZnO, Si, GaP, InP, and Ge, but the embodiment is not limited thereto. A buffer layer may be disposed between the first conductive semiconductor layer 11 and the substrate 5.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor. The first conductive semiconductor layer 11 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may include one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may include one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided on the second conductive semiconductor layer 13.

Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform doping concentration. In other words, the light emitting structure 10 may have various structures, and the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

Figure 4:
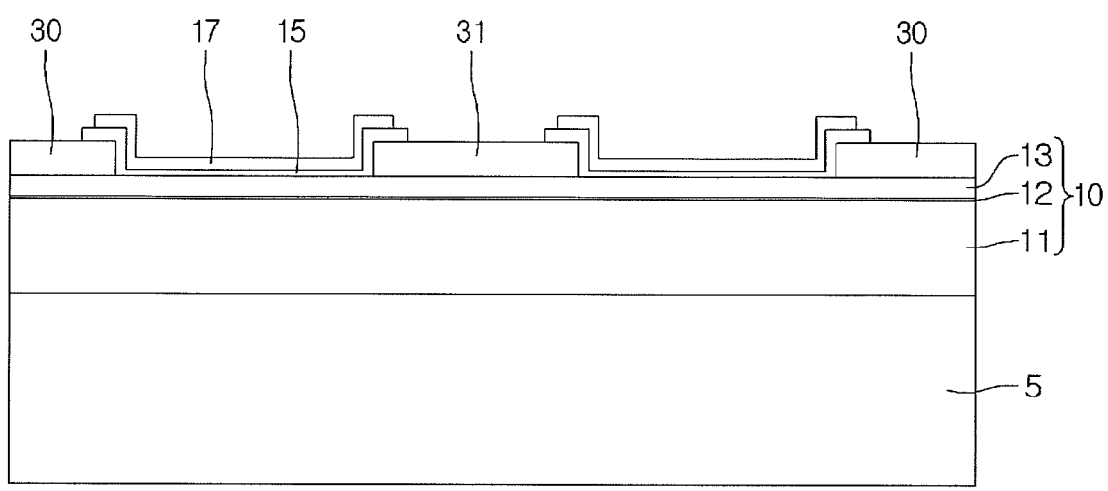

Next, as shown in FIG. 4, the channel layer 30 and the first insulating layer 31 may be formed on the light emitting structure 10. The first insulating layer 31 and the channel layer 30 may be formed by using the same material or mutually different materials.

The channel layer 30 and the first insulating layer 31 may be formed by using insulating materials. For example, the channel layer 30 and the first insulating layer 31 may be formed by using oxide or nitride. For instance, the channel layer 30 and the first insulating layer 31 may be formed by using at least one selected from the group consisting of $SiO_2$, $Si_xO_y$, $Si_3N_4$, $Si_xN_y$, $SiO_xN_y$, $Al_2O_3$, $TiO_2$, and AlN.

Then, as shown in FIG. 4, the light emitting structure 10 may be provided therein with the ohmic contact layer 15 and the reflective layer 17.

The ohmic contact layer 15 may be disposed between the reflective layer 17 and the second conductive semiconductor layer 13. The ohmic contact layer 15 may make contact with the second conductive semiconductor layer 13.

The ohmic contact layer 15 may make ohmic-contact with the light emitting structure 10. The reflective layer 17 may be electrically connected to the second conductive semiconductor layer 13. The ohmic contact layer 15 may include an ohmic-contact region that makes ohmic-contact with the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a TI layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

Figure 5:
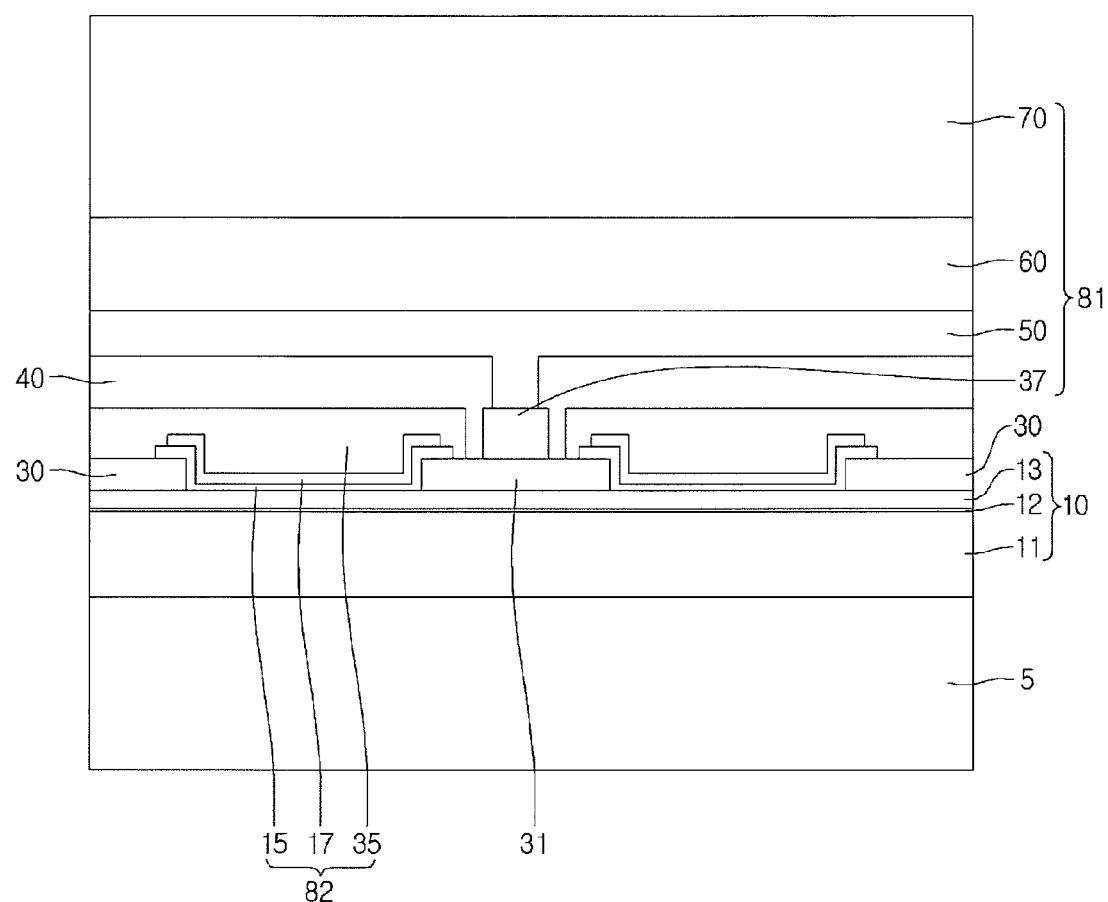

Thereafter, as shown in FIG. 5, the first metal layer 35, the second metal layer 37, the second insulating layer 40, the third metal layer 50, the bonding layer 60, and the conductive support member 70 may be formed on the reflective layer 17.

The first metal layer 35 may include at least one selected from the group consisting of Au, Cu, Ni, Ti, Ti—W, Cr, W, Pt, V, Fe, and Mo. According to the embodiment, the second electrode 82 may include at least one of the reflective layer 17, the ohmic contact layer 15, and the first metal layer 35. For example, the second electrode 82 may include all of the reflective layer 17, the ohmic contact layer 15, and the first metal layer 35 or may selectively include one or two of the reflective layer 17, the ohmic contact layer 15, and the first metal layer 35.

The light emitting device according to the embodiment may include the second metal layer 37 formed on the first insulating layer 31. The second metal layer 37 may include at least one of Au, Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

The second insulating layer 40 may be disposed between the first and second metal layers 35 and 37. The second insulating layer 40 may be formed by using oxide or nitride. For example, the second insulating layer 40 may include at least one selected from the group consisting of SiO 2, SixOy, Si3N4, SixNy, SiOxNy, Al2O3, TiO2, and AlN. The second insulating layer 40 may be disposed on the first metal layer 35. The second insulating layer 40 may be disposed on the first insulating layer 31. A portion of the second insulating layer 40 may surround the second metal layer 37.

The third metal layer 50 may be disposed on the second metal layer 37. The third metal layer 50 may be electrically connected to the second metal layer 37. A bottom surface of the third metal layer 50 may make contact with a top surface of the second metal layer 37. The third metal layer 50 may be disposed on the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided on the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 37, the third metal layer 50, the bonding layer 60 and the conductive support member 70. The first electrode 81 may include all of the second metal layer 37, the third metal layer 50, the bonding layer 60 and the conductive support member 70. In addition, the first electrode 81 may selectively include two or three of the second metal layer 37, the third metal layer 50, the bonding layer 60 and the conductive support member 70.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Figure 6:
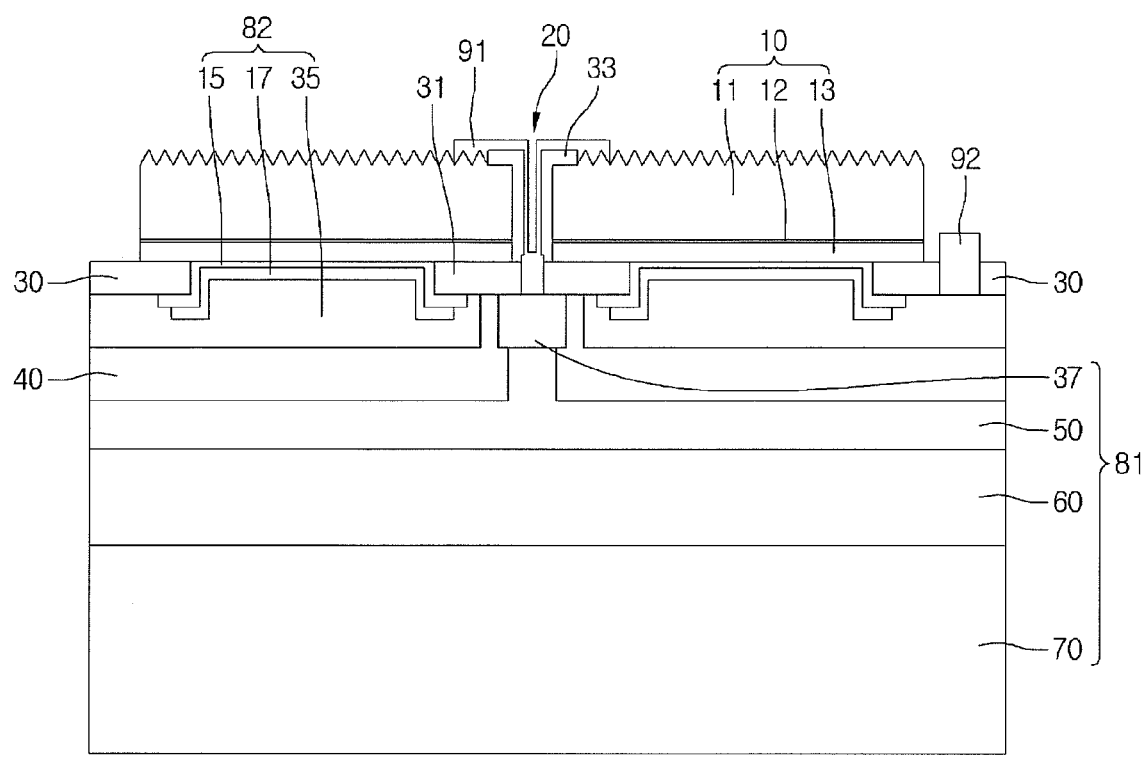

In addition, as shown in FIG. 6, the lateral side of the light emitting structure 10 is etched through an isolation etching process to expose a portion of the channel layer 30. The isolation etching process may be performed through a dry etching process such as an inductively coupled plasma (ICP) process, but the embodiment is not limited thereto.

The roughness may be formed on the top surface of the first conductive semiconductor layer 11. Accordingly, a light extraction pattern may be provided on the light emitting structure 10. A concave-convex pattern may be provided on the light emitting structure 10. For example, the light extraction pattern provided on the light emitting structure 10 may be formed through a PEC (photo electro chemical) etching process. Therefore, according to the embodiment, the external light extraction effect can be increased.

Next, as shown in FIG. 6, the third insulating layer 33, and the first and second contact portions 91 and 92 may be formed.

First, the through hole 20 may be disposed through the light emitting structure 10. The third insulating layer 33 may be formed in the through hole 20. Then, the first contact portion 91 may be formed in the through hole 20.

The first contact portion 91 may be disposed through the light emitting structure 10. The first contact portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10.

A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37.

Although only one first contact portion 91 is illustrated in the light emitting device shown in FIG. 6, the light emitting structure 10 according to the embodiment may be formed with a plurality of through holes 20 as shown in FIG. 2 and the first contact portion 91 may be formed in each through hole 20.

Meanwhile, the through hole 20 may have a width or a diameter D in the range of about 5 μm to about 200 μm. If the through hole 20 has a width or a diameter less than about 5 μm, the process to form the first contact portion 91 may be difficult. In addition, if the through hole 20 has a width or a diameter greater about 200 μm, the light emitting area of the light emitting structure 10 is reduced so that the light extraction efficiency may be degraded. The first contact portion 91 disposed in the through hole 20 may also have a width or a diameter in the range of about 5 μm to about 200 μm.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of about 5 μm to about 50 μm.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

The first region of the third insulating layer 33 may be disposed in the light emitting structure 10. The second region of the third insulating layer 33 may be disposed on a top surface of the light emitting structure 10. The second region of the third insulating layer 33 may be disposed between the first conductive semiconductor layer 11 and the first contact portion 91.

The first region of the third insulating layer 33 may insulate the first contact portion 91 from the active layer 12 and the second conductive semiconductor layer 13. The first region of the third insulating layer 33 may electrically insulate the first contact portion 91 from the active layer 12. The first region of the third insulating layer 33 may electrically insulate the first contact portion 91 from the second conductive semiconductor layer 13.

The third insulating layer 33, for example, includes an oxide or a nitride. For example, the third insulating layer 33 may be formed by using at least one selected from the group consisting of SiO2, SixOy, Si3N4, SixNy, SiOxNy, Al2O3, TiO2, and AlN.

The third insulating layer 33 may be disposed through the second conductive semiconductor layer 13, the active layer 12 and the first conductive semiconductor layer 11. The third insulating layer 33 may be disposed around the first contact portion 91.

In addition, the light emitting device according to the embodiment may include a second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Figure 7:
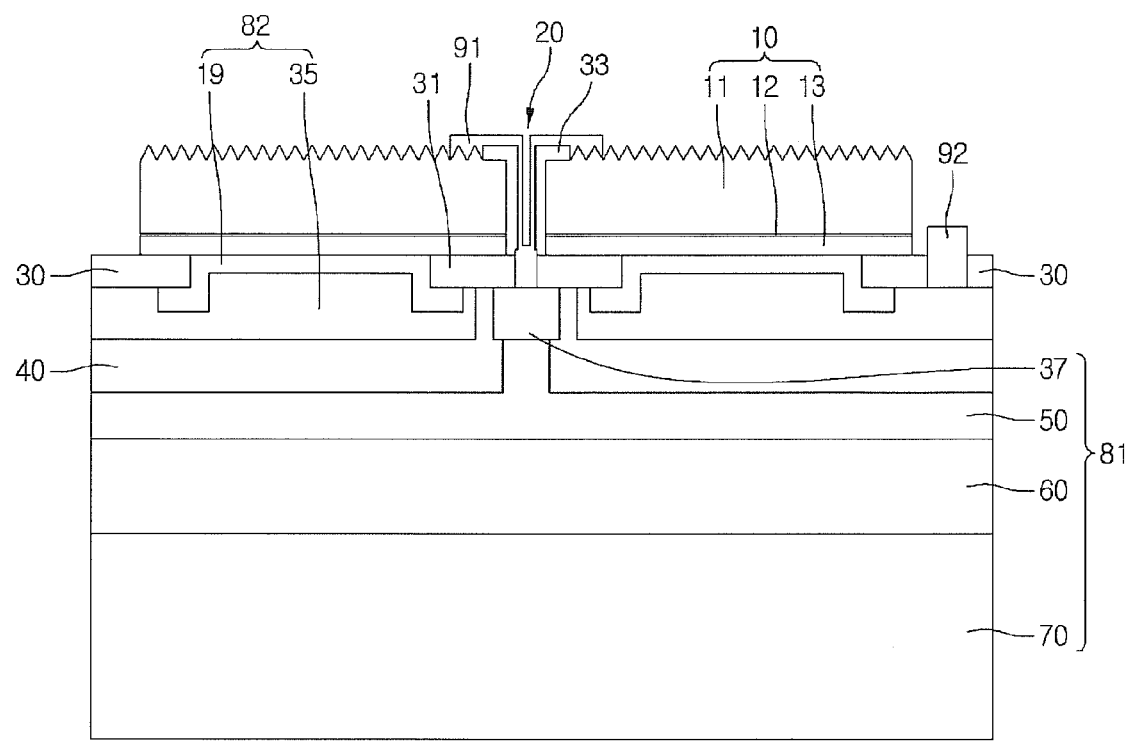
FIG. 7 is a sectional view showing a light emitting device according to another embodiment.

FIG. 7 is a sectional view showing another example of a light emitting device according to the embodiment. In the following description about the light emitting device shown in FIG. 7, components and structures the same as those described with reference to FIGS. 1 and 2 will not be further described in order to avoid redundancy.

According to the light emitting device of the embodiment, an ohmic reflective layer 19 may be provided under the light emitting structure 10. The ohmic reflective layer 19 may be realized such that the ohmic reflective layer 19 may serve as both of the reflective layer 17 and the ohmic contact layer 15. Accordingly, the ohmic reflective layer 19 may make ohmic-contact with the second conductive semiconductor layer 13, and reflect the light incident thereto from the light emitting structure 10.

In this case, the ohmic reflective layer 19 may include multiple layers. For example, the ohmic reflective layer 19 may have a structure in which an Ag layer and a Ni layer are alternately formed, or may include a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19.

The second electrode 82 according to the embodiment may include at least one of the ohmic reflective layer 19 and the first metal layer 35. In the light emitting device according to the embodiment, the conductive support member 70 provided under the second electrode 82 may be electrically connected to the first conductive semiconductor layer 11 provided on the second electrode 82 through the first contact portion 91.

The first contact portion 91 may be disposed through the light emitting structure 10. The first contact portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10.

A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37.

Although only one first contact portion 91 is illustrated in the light emitting device shown in FIG. 7, the light emitting structure 10 according to the embodiment may be formed with a plurality of through holes 20 as shown in FIG. 2 and the first contact portion 91 may be formed in each through hole 20.

Meanwhile, the through hole 20 may have a width or a diameter D in the range of about 5 μm to about 200 μm. If the through hole 20 has a width or a diameter less than about 5 μm, the process to form the first contact portion 91 may be difficult. In addition, if the through hole 20 has a width or a diameter greater about 200 μm, the light emitting area of the light emitting structure 10 is reduced so that the light extraction efficiency may be degraded. The first contact portion 91 disposed in the through hole 20 may also have a width or a diameter in the range of about 5 μm to about 200 μm.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of about 5 μm to about 50 μm.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

The third insulating layer 33 may be disposed around the first contact portion 91. A first region of the third insulating layer 33 may be disposed in the light emitting structure 10. A second region of the third insulating layer 33 may be disposed on a top surface of the light emitting structure 10. The second region of the third insulating layer 33 may be disposed between the first conductive semiconductor layer 11 and the first contact portion 91.

The first region of the third insulating layer 33 may insulate the first contact portion 91 from the active layer 12 and the second conductive semiconductor layer 13. The first region of the third insulating layer 33 may electrically insulate the first contact portion 91 from the active layer 12. The first region of the third insulating layer 33 may electrically insulate the first contact portion 91 from the second conductive semiconductor layer 13.

The third insulating layer 33, for example, includes an oxide or a nitride. For example, the third insulating layer 33 may be formed by using at least one selected from the group consisting of $SiO_2$, $Si_xO_y$, $Si_3N_4$, $Si_xN_y$, $SiO_xN_y$, $Al_2O_3$, $TiO_2$, and AlN.

The third insulating layer 33 may be disposed through the second conductive semiconductor layer 13, the active layer 12 and the first conductive semiconductor layer 11. The third insulating layer 33 may be disposed around the first contact portion 91.

In addition, the light emitting device according to the embodiment may include a second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Figure 8:
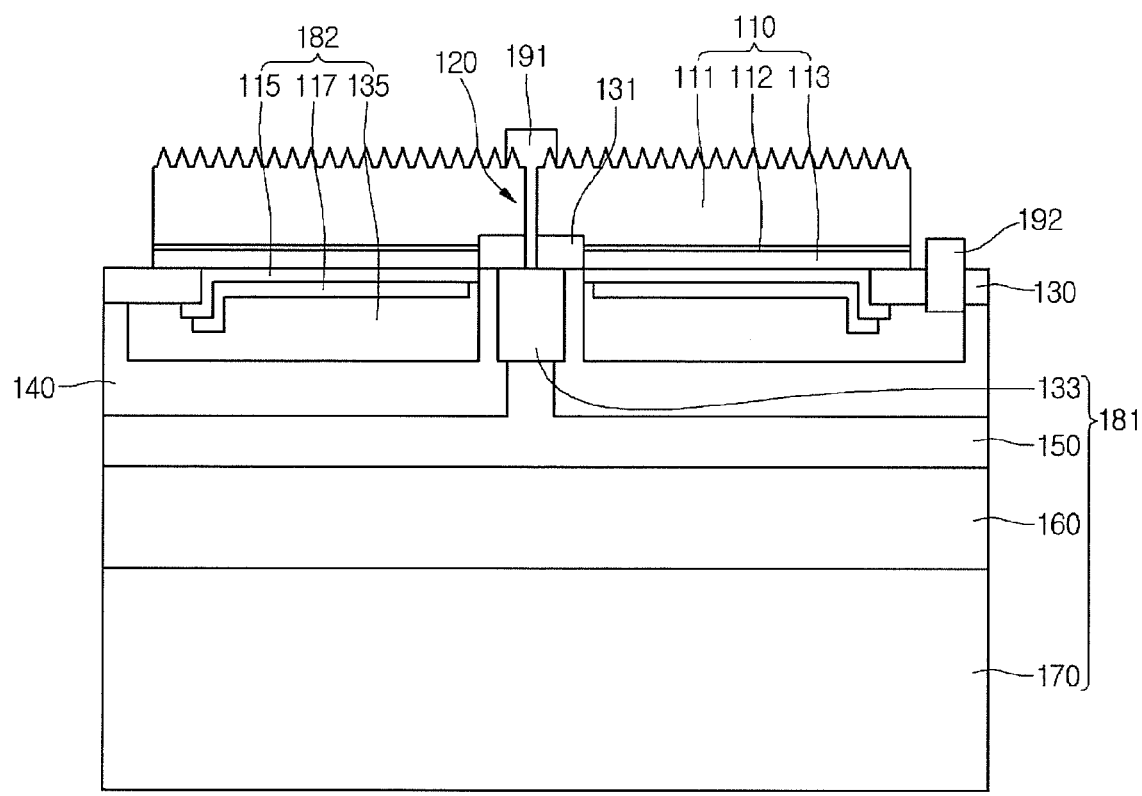
FIG. 8 is a sectional view showing a light emitting device according to still another embodiment.
Figure 9:
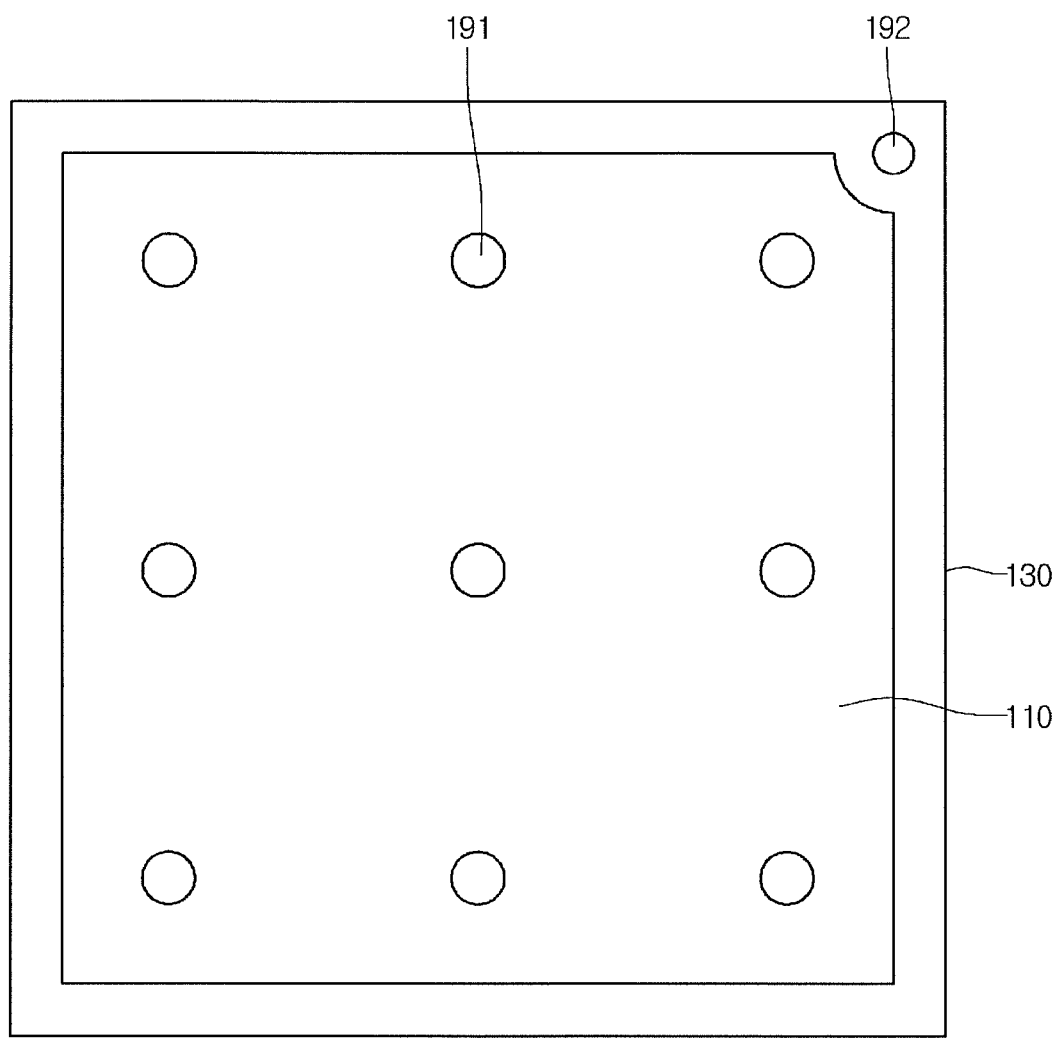
FIG. 9 is a view showing an arrangement of a first contact portion of a light emitting device shown in FIG. 8.

FIG. 8 is a sectional view showing a light emitting device according to the embodiment and FIG. 9 is a view showing an arrangement of the first contact portion of the light emitting device shown in FIG. 8. The description about the structures and elements that have been described with reference to FIGS. 1 to 7 may be simplified or omitted in order to avoid redundancy.

As shown in FIGS. 8 and 9, the light emitting device according to the embodiment may include a light emitting structure 110, a first semiconductor layer 130, a first electrode 181, a second electrode 182 and a first contact portion 191.

The light emitting structure 110 may include a first conductive semiconductor layer 111, an active layer 112, and a second conductive semiconductor layer 113. The active layer 112 may be disposed between the first conductive semiconductor layer 111 and the second conductive semiconductor layer 113. The active layer 112 may be provided under the first conductive semiconductor layer 111, and the second conductive semiconductor layer 113 may be provided under the active layer 112.

The light emitting device according to the embodiment may include a reflective layer 117. The reflective layer 117 may be electrically connected to the second conductive semiconductor layer 113. The reflective layer 117 may be disposed under the light emitting structure 110. The reflective layer 117 may be disposed under the second conductive semiconductor layer 113. The reflective layer 117 may reflect light incident thereto from the light emitting structure 110 to increase the quantity of light extracted to an outside.

The light emitting device according to the embodiment may include an ohmic contact layer 115 disposed between the reflective layer 117 and the second conductive semiconductor layer 113. The ohmic contact layer 115 may make contact with the second conductive semiconductor layer 113. The ohmic contact layer 115 may make ohmic contact with the light emitting structure 110. The ohmic contact layer 115 may include a region that makes ohmic-contact with the light emitting structure 110. The ohmic contact layer 115 may include a region that makes ohmic-contact with the second conductive semiconductor layer 113.

The light emitting device according to the embodiment may include a second metal layer 135 provided under the reflective layer 117. The second metal layer 135 may include at least one of Au, Cu, Ni, Ti, Ti—W, Cr, W, Pt, V, Fe, and Mo.

According to the embodiment, the second electrode 182 may include at least one of the reflective layer 117, the ohmic contact layer 115, and the second metal layer 135. For example, the second electrode 182 may include all of the reflective layer 117, the second metal layer 135, and the ohmic contact layer 115, or may include one or two selected from the reflective layer 117, the second metal layer 135, and the ohmic contact layer 115.

The second electrode 182 according to the embodiment may be disposed under the light emitting structure 110. The second electrode 182 may be electrically connected to the second conductive semiconductor layer 113.

The light emitting device according to the embodiment may include a channel layer 130 provided around a lower portion of the light emitting structure 110. One end of the channel layer 130 may be provided under the second conductive semiconductor layer 113. The one end of the channel layer 130 may make contact with a bottom surface of the second conductive semiconductor layer 113. The one end of the channel layer 130 may be disposed between the second conductive semiconductor layer 113 and the reflective layer 117. The one end of the channel layer 130 may be disposed between the second conductive semiconductor layer 113 and the ohmic contact layer 115.

The light emitting device according to the embodiment may include the first contact portion 191. The first contact portion 191 may be disposed through the light emitting structure 110. The first contact portion 191 may be disposed through the first conductive semiconductor layer 111, the active layer 112 and the second conductive semiconductor layer 113.

For example, as shown in FIG. 9, a plurality of first contact portions 191 may be formed in the light emitting structure 110. The first contact portions 191 may be disposed along the through holes 120 of the light emitting structure 110. A first region of the first contact portion 191 may be electrically connected to the first electrode 181 and a second region of the first contact portion 191 may make contact with a top surface of the first conductive semiconductor layer 111. For instance, the first region of the first contact portion 191 may make contact with a first metal layer 133. The first region of the first contact portion 191 may make contact with the top surface of the first metal layer 133. For example, when the light emitting structure 110 is grown into a GaN semiconductor layer, the first contact portion 191 may make contact with an n face of the first conductive semiconductor layer 111.

Although only one first contact portion 191 is illustrated in the light emitting device shown in FIG. 8, the light emitting structure 110 according to the embodiment may be formed with a plurality of first contact portions 191 as shown in FIG. 9 and the first contact portions 191 may be formed in the through holes 120, respectively.

The first contact portions 191 may be spaced apart from each other on the top surface of the first conductive semiconductor layer 111. Since the first contact portions 191 are distributed on the light emitting structure 110, current applied to the first conductive semiconductor layer 111 may be spread. Thus, the degradation of the first conductive semiconductor layer 111 can be prevented and the combination efficiency of the electrons and holes in the active layer 112 can be improved.

The light emitting device according to the embodiment may include an insulating ion implantation layer 131. The insulating ion implantation layer 131 may be disposed around the first contact portion 191. The insulating ion implantation layer 131 may be disposed in the light emitting structure 110. The insulating ion implantation layer 131 may be disposed between the second conductive semiconductor layer 113 and the first contact portion 191. The insulating ion implantation layer 131 may make contact with a lateral side of the first contact portion 191.

The insulating ion implantation layer 131 may be disposed through the active layer 112 and the second conductive semiconductor layer 113. The insulating ion implantation layer 131 may insulate the first contact portion 191 from the second conductive semiconductor layer 113. The insulating ion implantation layer 131 may be disposed between the active layer 112 and the first contact portion 191. The insulating ion implantation layer 131 may insulate the first contact portion 191 from the active layer 112. A top surface of the insulating ion implantation layer 131 may make contact with the first conductive semiconductor layer 111.

A bottom surface of the insulating ion implantation layer 131 may be arranged on the same plane with a bottom surface of the first contact portion 191. The bottom surface of the insulating ion implantation layer 131 may be arranged on the same plane with a bottom surface of the second conductive semiconductor layer 113. The bottom surface of the first contact portion 191 may be arranged on the same plane with the bottom surface of the second conductive semiconductor layer 113. The bottom surface of the first contact portion 191 may be arranged on the same plane with a top surface of the channel layer 130.

The insulating ion implantation layer 131 may be formed by implanting insulating ions into the light emitting structure 110 through an ion implantation process. The insulating ion implantation layer 131 may be implanted in a portion of the second conductive semiconductor layer 113. The insulating ion implantation layer 131 may be implanted in a portion of the active layer 112. The insulating ion implantation layer 131 may be implanted in a portion of the first conductive semiconductor layer 111. For example, the insulating ion implantation layer 131 may be formed by implanting at least one of an N ion, an O ion and an Ar ion.

The second conductive semiconductor layer 113 may be disposed around the insulating ion implantation layer 131. The second conductive semiconductor layer 113 may be disposed around a lateral side of the insulating ion implantation layer 131. The second conductive semiconductor layer 113 may make contact with the lateral side of the insulating ion implantation layer 131. The active layer 112 may be disposed around the insulating ion implantation layer 131. The active layer 112 may be disposed around the lateral side of the insulating ion implantation layer 131. The active layer 112 may make contact with the lateral side of the insulating ion implantation layer 131.

The insulating ion implantation layer 131 may be formed in a portion of a semiconductor layer constituting the light emitting structure 110 through the implantation process. Thus, an additional patterning process to form the insulating layer around the first contact portion 191 may not be necessary.

In addition, when forming the first contact portion 191 in the light emitting structure 110, the through hole 120 is formed corresponding to a space where the first contact portion 191 is provided so that the width of the through hole 120 can be minimized. Thus, the through hole 120 may have the width in the range of about 3 μm to about 5 μm. The first contact portion 191 formed in the through hole 120 may also have the width in the range of about 3 μm to about 5 μm. That is, the first contact portion 191 disposed in the light emitting structure 110 may have the width in the range of about 3 μm to about 5 μm. In this manner, since the width of the first contact portion 191 can be diminished, the area for the active layer 112 can be enlarged so that the light emission area can be increased.

Meanwhile, according to the embodiment, a part of the first contact portion 191 may include a conductive ion implantation layer. For example, a region of the first contact portion 191, which is disposed in the light emitting structure 110, may be formed as the conductive ion implantation layer. At this time, the conductive ion implantation layer can be formed by implanting conductive ions into the light emitting structure 110 through the implantation process. For example, the conductive ion implantation layer may be formed by implanting at least one of a Ti ion, an Al ion, or an Au ion.

The light emitting device according to the embodiment may include a first metal layer 133 provided under the insulating ion implantation layer 131. The first metal layer 133 may include at least one of Au, Cu, Ni, Ti, Ti—W, Cr, W, Pt, V, Fe and Mo.

A top surface of the first metal layer 133 may make contact with a bottom surface of the insulating ion implantation layer 131. The first metal layer 133 may be disposed under the first contact portion 191. The first metal layer 133 may be electrically connected to the first contact portion 191. The top surface of the first metal layer 133 may make contact with the bottom surface of the first contact portion 191. The top surface of the first metal layer 133 may be arranged on the same plane with the bottom surface of the first contact portion 191.

An insulating layer 140 may be disposed between the first and second metal layers 133 and 135. The insulating layer 140 may be formed by using oxide or nitride. For example, the insulating layer 140 may include at least one selected from the group consisting of SiO2, SixOy, Si3N4, SixNy, SiOxNy, Al2O3, TiO2, and AlN. The insulating layer 140 may be disposed under the second metal layer 135. The insulating layer 140 may be disposed under the insulating ion implantation layer 131. A top surface of the insulating layer 140 may make contact with the bottom surface of the insulating ion implantation layer 131. The insulating layer 140 may be disposed under the second electrode 182. The insulating layer 140 may be disposed under the channel layer 130.

The third metal layer 150 may be disposed under the first metal layer 133. The third metal layer 150 may be electrically connected to the first contact portion 191. A top surface of the third metal layer 150 may make contact with a bottom surface of the first metal layer 133. The third metal layer 150 may be disposed under the insulating layer 140.

The third metal layer 150 may include at least one of Cu, Ni, Ti, Ti—W, Cr, W, Pt, V, Fe, and Mo. The third metal layer 150 may serve as a diffusion barrier layer. A bonding layer 160 and a conductive support member 170 may be provided under the third metal layer 150.

The third metal layer 150 may prevent a material included in the bonding layer 160 from being diffused to the reflective layer 117 in the process of providing the bonding layer 160. The third metal layer 150 may prevent a material, such as Sn, included in the bonding layer 160 from exerting an influence on the reflective layer 117.

According to the embodiment, the first electrode 181 may include at least one of the first metal layer 133, the third metal layer 150, the bonding layer 160 and the conductive support member 170. The first electrode 181 may include all of the first metal layer 133, the third metal layer 150, the bonding layer 160 and the conductive support member 170. In addition, the first electrode 181 may selectively include two or three of the first metal layer 133, the third metal layer 150, the bonding layer 160 and the conductive support member 170.

The first electrode 181 may be disposed under the light emitting structure 110. The first electrode 181 may be electrically connected to the first conductive semiconductor layer 111. A bottom surface of the first electrode 181 may be located lower than a bottom surface of the second electrode 182. The top surface of the first electrode 181 may be arranged on the same plane with the top surface of the second electrode 182. The insulating layer 140 may be disposed between the first and second electrodes 181 and 182.

In addition, the light emitting device according to the embodiment may include the second contact portion 192. The second contact portion 192 may be spaced apart from the light emitting structure 110. The second contact portion 192 may be electrically connected to the second electrode 182. The second contact portion 192 may be electrically connected to the second electrode 182 by passing through the channel layer 130. The second contact portion 192 may be electrically connected to the second metal layer 135. The second contact portion 192 may come into contact with the top surface of the second metal layer 135. The second contact portion 192 may include at least one of Cr, V, W, Ti, Zn, Ni, Cu, Al, Au, and Mo. The second contact portion 192 may be formed by using a material constituting the first contact portion 191. In addition, the first and second contact portions 191 and 192 may be formed by using mutually different materials.

A roughness may be formed on the top surface of the first conductive semiconductor layer 111. Accordingly, the quantity of light extracted upward at the region where the roughness is formed can be increased.

The light emitting device according to the embodiment may include the insulating layer 140 disposed between the second metal layer 135 and the third metal layer 150. The insulating layer 140 may insulate the second metal layer 135 from the third metal layer 150. The insulating layer 140 may insulate the second metal layer 135 from the conductive support member 170. For example, the insulating layer 140 may include oxide or nitride. For example, the insulating layer 140 may include at least one selected from the group consisting of SiO2, SixOy, Si3N4, SixNy, SiOxNy, Al2O3, TiO2, and AlN. The insulating layer 140 may be disposed between the first and second electrodes 181 and 182. The insulating layer 140 may electrically insulate the first electrode 181 from the second electrode 182.

According to the embodiment, power may be applied to the light emitting structure 110 through the first electrode 181 and the second electrode 182. For example, in the light emitting device according to the embodiment, the power may be applied to the light emitting structure 110 through the conductive support member 170 of the first electrode 181 and the second contact portion 192.

Accordingly, power may be supplied to the first conductive semiconductor layer 111 through a scheme of attaching the conductive support member 170 to the bonding pad. According to the embodiment, the second contact portion 192 may be electrically connected to the second electrode 182. Therefore, the second contact portion 192 is connected to a power pad through a wire bonding scheme, thereby supplying power to the second conductive semiconductor layer 113.

According to the light emitting device of the embodiment, power may be supplied to the light emitting structure 110 through the conductive support member 170 and the second contact portion 192. Therefore, according to the embodiment, current concentration can be prevented, and the electrical reliability can be improved.

In the light emitting device according to the embodiment, the through holes 120 are formed from the top surface of the light emitting structure 110. In addition, the insulating ion implantation layer 131 can be formed around the first contact portion 191 through the implantation process so that the widths of the through holes 120 and the first contact portion 191 can be reduced. Thus, the manufacturing process can be simplified and the product yield can be improved. In addition, according to the light emitting device of the embodiment, an area of the electrode disposed on the top surface of the light emitting structure 110 can be reduced so that a protective layer may be omitted from the top surface or lateral side of the light emitting structure 110. Therefore, the extraction efficiency of light emitted to the outside from the light emitting structure 110 can be improved.

Hereinafter, a method of fabricating the light emitting device according to the embodiment will be described with reference to FIGS. 10 to 13. The description that has been described with reference to FIGS. 1 to 7 may be simplified or omitted in order to avoid redundancy.

Figure 10:
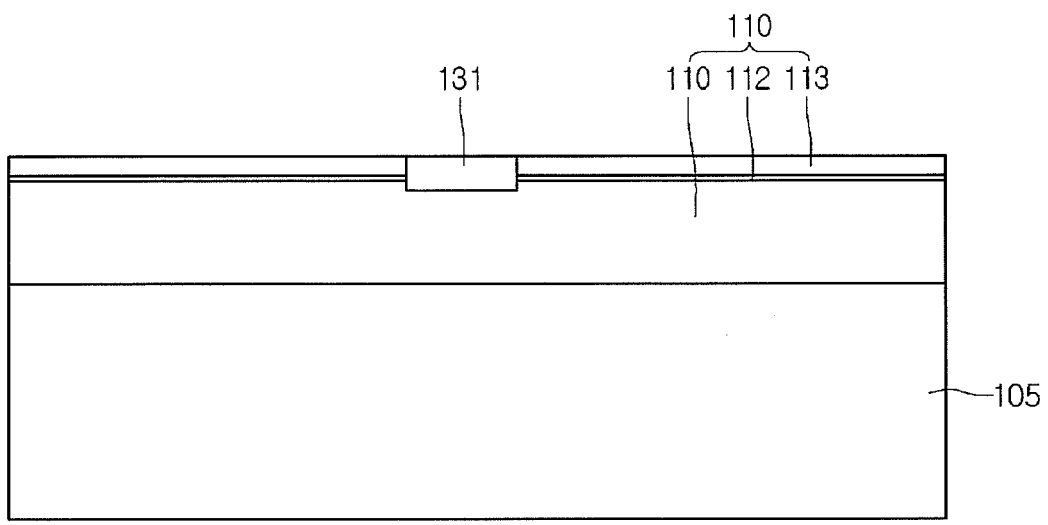
FIGS. 10 to 13 are sectional views showing a method of fabricating a light emitting device according to the embodiment.

According to the method of fabricating the light emitting device of the embodiment, as shown in FIG. 10, the first conductive semiconductor layer 111, the active layer 112, and the second conductive semiconductor layer 113 may be formed on a substrate 105. The first conductive semiconductor layer 111, the active layer 112, and the second conductive semiconductor layer 113 may be defined as the light emitting structure 110.

Then, as shown in FIG. 10, the insulating ion implantation layer 131 may be disposed in the light emitting structure 110. The insulating ion implantation layer 131 may be formed in a portion of the light emitting structure 110. The insulating ion implantation layer 131 may be formed in a portion of the first conductive semiconductor layer 111, in a portion of the active layer 112, and in a portion of the second conductive semiconductor layer 113.

The insulating ion implantation layer 131 may be formed by implanting insulating ions into the light emitting structure 110 through an ion implantation process. The insulating ion implantation layer 131 may be implanted in a portion of the second conductive semiconductor layer 113. The insulating ion implantation layer 131 may be implanted in a portion of the active layer 112. The insulating ion implantation layer 131 may be implanted in a portion of the first conductive semiconductor layer 111. For example, the insulating ion implantation layer 131 may be formed by implanting at least one of an N ion, an O ion and an Ar ion.

Figure 11:
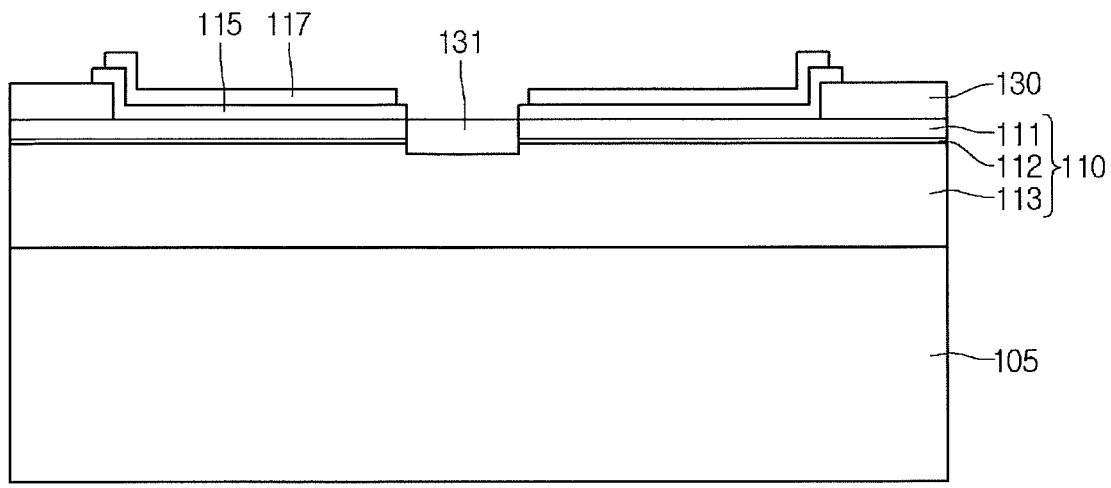

Next, as shown in FIG. 11, the ohmic contact layer 115 and the reflective layer 117 may be formed in the light emitting structure 110.

The ohmic contact layer 115 may be disposed between the reflective layer 117 and the second conductive semiconductor layer 113. The ohmic contact layer 115 may make contact with the second conductive semiconductor layer 113.

The ohmic contact layer 115 may make ohmic-contact with the light emitting structure 110. The reflective layer 117 may be electrically connected to the second conductive semiconductor layer 113. The ohmic contact layer 115 may include an ohmic-contact region that makes ohmic-contact with the light emitting structure 110.

Figure 12:
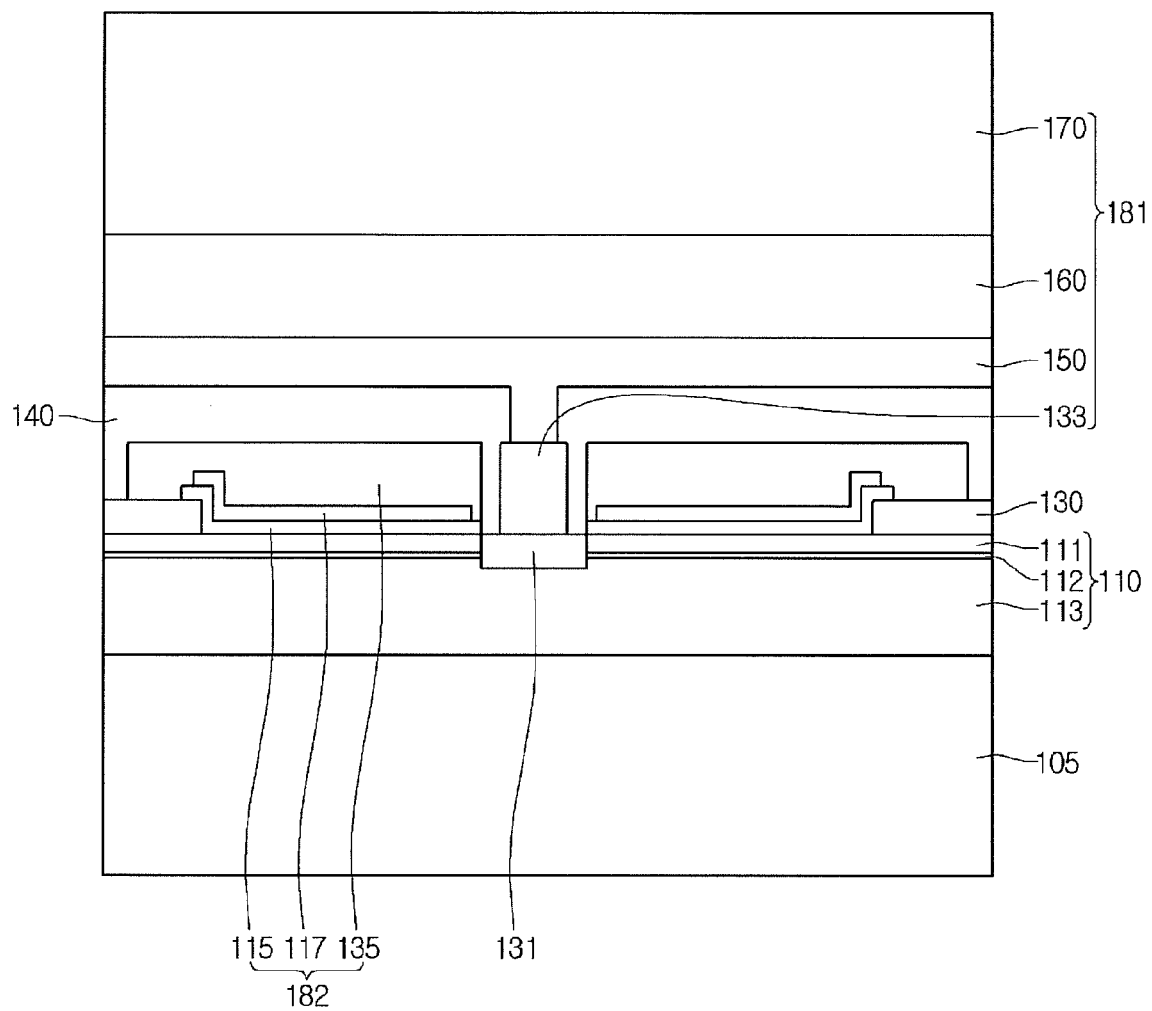

Then, as shown in FIG. 12, the first metal layer 133, the second metal layer 135, the insulating layer 140, the third metal layer 150, the bonding layer 160, and the conductive support member 170 may be formed on the light emitting structure 110.

The first metal layer 133 may include at least one selected from the group consisting of Au, Cu, Ni, Ti, Ti—W, Cr, W, Pt, V, Fe, and Mo. The second metal layer 135 may include at least one selected from the group consisting of Au, Cu, Ni, Ti, Ti—W, Cr, W, Pt, V, Fe, and Mo. The first metal layer 133 and the second metal layer 135 may be formed by using the same material or mutually different materials.

According to the embodiment, the second electrode 182 may include at least one of the reflective layer 117, the ohmic contact layer 115, and the second metal layer 135. For example, the second electrode 82 may include all of the reflective layer 117, the ohmic contact layer 115, and the second metal layer 135 or may selectively include one or two of the reflective layer 117, the ohmic contact layer 115, and the second metal layer 135.

The insulating layer 140 may be formed on the second metal layer 135. The insulating layer 140 may be formed by using oxide or nitride. For example, the insulating layer 140 may include at least one selected from the group consisting of SiO2, SixOy, Si3N4, SixNy, SiOxNy, Al2O3, TiO2, and AlN.

The third metal layer 150 may be formed on the insulating layer 140. The third metal layer 150 may include at least one of Cu, Ni, Ti, Ti—W, Cr, W, Pt, V, Fe, and Mo. The third metal layer 150 may serve as a diffusion barrier layer. The bonding layer 160 and the conductive support member 170 may be provided on the third metal layer 150.

The third metal layer 150 may prevent a material included in the bonding layer 160 from being diffused to the reflective layer 117 in the process of providing the bonding layer 160. The third metal layer 150 may prevent a material, such as Sn, included in the bonding layer 160 from exerting an influence on the reflective layer 117.

According to the embodiment, the first electrode 181 may include at least one of the first metal layer 133, the third metal layer 150, the bonding layer 160 and the conductive support member 170. The first electrode 181 may include all of the first metal layer 133, the third metal layer 150, the bonding layer 160 and the conductive support member 170. In addition, the first electrode 181 may selectively include one or two of the first metal layer 133, the third metal layer 150, the bonding layer 160 and the conductive support member 170.

Next, the substrate 105 is removed from the first conductive semiconductor layer 111. According to one example, the substrate 105 may be removed through a laser lift off (LLO) process. The LLO process is a process to delaminate the substrate 105 from the first conductive semiconductor layer 111 by irradiating a laser to the bottom surface of the substrate 105.

Figure 13:
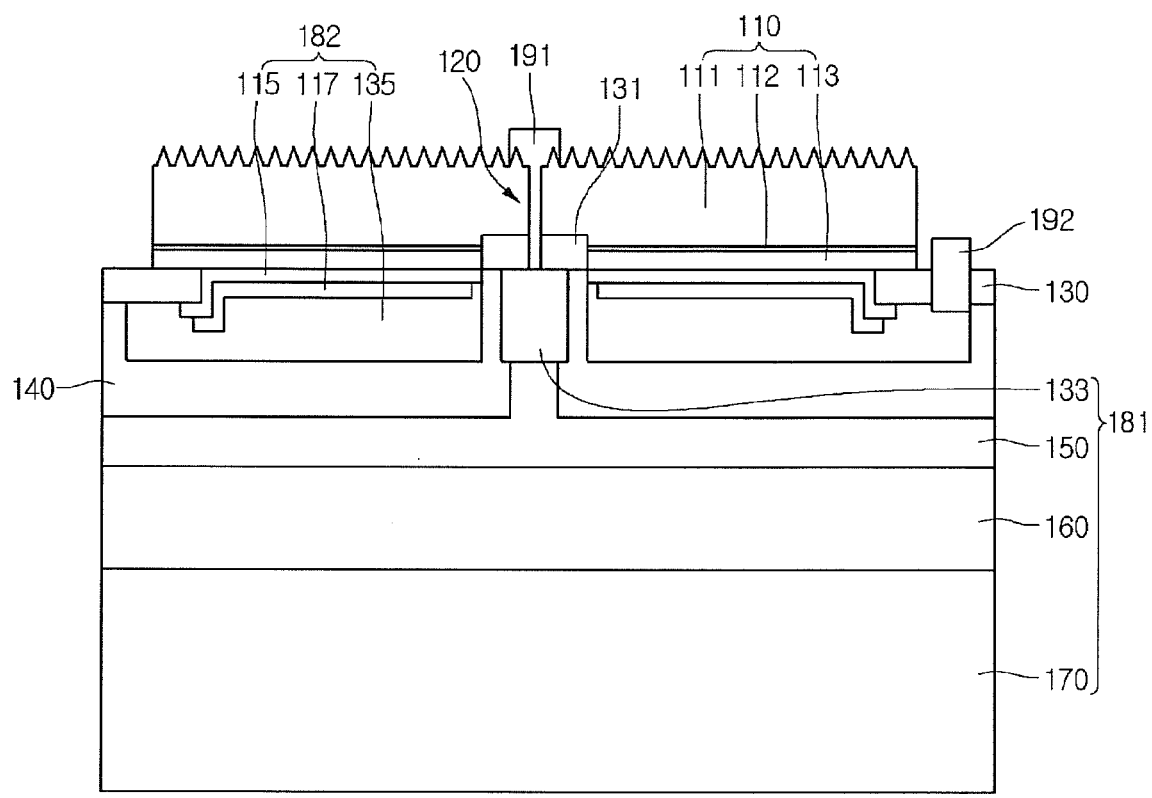

In addition, as shown in FIG. 13, the lateral side of the light emitting structure 110 is etched through an isolation etching process to expose a portion of the channel layer 130. The isolation etching process may be performed through a dry etching process such as an inductively coupled plasma (ICP) process, but the embodiment is not limited thereto.

The roughness may be formed on the top surface of the first conductive semiconductor layer 110. Accordingly, a light extraction pattern may be provided on the light emitting structure 110. A concave-convex pattern may be provided on the light emitting structure 110. For example, the light extraction pattern provided on the light emitting structure 110 may be formed through a PEC (photo electro chemical) etching process. Therefore, according to the embodiment, the external light extraction effect can be increased.

Next, as shown in FIG. 13, the first and second contact portions 191 and 192 may be formed.

The through hole 120 may be formed in the light emitting structure 110. The first contact portion 191 may be formed in the through hole 120. The first contact portion 191 may be disposed through the light emitting structure 110. The first contact portion 191 may be disposed through the first conductive semiconductor layer 111, the active layer 112 and the second conductive semiconductor layer 113.

For example, as shown in FIG. 9, a plurality of first contact portions 191 may be formed in the light emitting structure 110. The first contact portions 191 may be disposed along the through holes 120 of the light emitting structure 110. A first region of the first contact portion 191 may be electrically connected to the first electrode 181 and a second region of the first contact portion 191 may make contact with a top surface of the first conductive semiconductor layer 111. For instance, the first region of the first contact portion 191 may make contact with a first metal layer 133. The first region of the first contact portion 191 may make contact with the top surface of the first metal layer 133.

For example, as shown in FIG. 9, a plurality of first contact portions 191 may be formed in the light emitting structure 110. The first contact portions 191 may be disposed along the through holes 120 of the light emitting structure 110. A first region of the first contact portion 191 may be electrically connected to the first electrode 181 and a second region of the first contact portion 191 may make contact with a top surface of the first conductive semiconductor layer 111. For instance, the first region of the first contact portion 191 may make contact with a first metal layer 133. The first region of the first contact portion 191 may make contact with the top surface of the first metal layer 133. For example, when the light emitting structure 110 is grown into a GaN semiconductor layer, the first contact portion 191 may make contact with an n face of the first conductive semiconductor layer 111.

Although only one first contact portion 191 is illustrated in the light emitting device shown in FIG. 13, the light emitting structure 110 according to the embodiment may be formed with a plurality of first contact portions 191 as shown in FIG. 9 and the first contact portions 191 may be formed in the through holes 120, respectively.

The first contact portions 191 may be spaced apart from each other on the top surface of the first conductive semiconductor layer 111. Since the first contact portions 191 are distributed on the light emitting structure 110, current applied to the first conductive semiconductor layer 111 may be spread. Thus, the degradation of the first conductive semiconductor layer 111 can be prevented and the combination efficiency of the electrons and holes in the active layer 112 can be improved.

The insulating ion implantation layer 131 may be disposed around the first contact portion 191. The insulating ion implantation layer 131 may be disposed in the light emitting structure 110. The insulating ion implantation layer 131 may be disposed between the second conductive semiconductor layer 113 and the first contact portion 191. The insulating ion implantation layer 131 may make contact with a lateral side of the first contact portion 191.

The insulating ion implantation layer 131 may be disposed through the active layer 112 and the second conductive semiconductor layer 113. The insulating ion implantation layer 131 may insulate the first contact portion 191 from the second conductive semiconductor layer 113. The insulating ion implantation layer 131 may be disposed between the active layer 112 and the first contact portion 191. The insulating ion implantation layer 131 may insulate the first contact portion 191 from the active layer 112. A top surface of the insulating ion implantation layer 131 may make contact with the first conductive semiconductor layer 111.

A bottom surface of the insulating ion implantation layer 131 may be arranged on the same plane with a bottom surface of the first contact portion 191. The bottom surface of the insulating ion implantation layer 131 may be arranged on the same plane with a bottom surface of the second conductive semiconductor layer 113. The bottom surface of the first contact portion 191 may be arranged on the same plane with the bottom surface of the second conductive semiconductor layer 113. The bottom surface of the first contact portion 191 may be arranged on the same plane with a top surface of the channel layer 130.

The second conductive semiconductor layer 113 may be disposed around the insulating ion implantation layer 131. The second conductive semiconductor layer 113 may be disposed around a lateral side of the insulating ion implantation layer 131. The second conductive semiconductor layer 113 may make contact with the lateral side of the insulating ion implantation layer 131. The active layer 112 may be disposed around the insulating ion implantation layer 131. The active layer 112 may be disposed around the lateral side of the insulating ion implantation layer 131. The active layer 112 may make contact with the lateral side of the insulating ion implantation layer 131.

The insulating ion implantation layer 131 may be formed in a portion of a semiconductor layer constituting the light emitting structure 110 through the implantation process.

Thus, an additional patterning process to form the insulating layer around the first contact portion 191 may not be necessary.

In addition, when forming the first contact portion 191 in the light emitting structure 110, the through hole 120 is formed corresponding to a space where the first contact portion 191 is provided so that the width of the through hole 120 can be minimized. Thus, the through hole 120 may have the width in the range of about 3 µm to about 5 µm. The first contact portion 191 formed in the through hole 120 may also have the width in the range of about 3 µm to about 5 µm. That is, the first contact portion 191 disposed in the light emitting structure 110 may have the width in the range of about 3 µm to about 5 µm. In this manner, since the width of the first contact portion 191 can be diminished, the area for the active layer 112 can be enlarged so that the light emission area can be increased.

Meanwhile, according to the embodiment, a part of the first contact portion 191 may include a conductive ion implantation layer. For example, a region of the first contact portion 191, which is disposed in the light emitting structure 110, may be formed as the conductive ion implantation layer. At this time, the conductive ion implantation layer can be formed by implanting conductive ions into the light emitting structure 110 through the implantation process. For example, the conductive ion implantation layer may be formed by implanting at least one of a Ti ion, an Al ion, or an Au ion.

In addition, the light emitting device according to the embodiment may include the second contact portion 192. The second contact portion 192 may be spaced apart from the light emitting structure 110. The second contact portion 192 may be electrically connected to the second electrode 182. The second contact portion 192 may be electrically connected to the second electrode 182 by passing through the channel layer 130. The second contact portion 192 may be electrically connected to the second metal layer 135. The second contact portion 192 may come into contact with the top surface of the second metal layer 135.

Meanwhile, the above fabrication process is illustrative purpose only and may be variously modified according to the designs.

According to the embodiment, power may be applied to the light emitting structure 110 through the first electrode 181 and the second electrode 182. For example, in the light emitting device according to the embodiment, the power may be applied to the light emitting structure 110 through the conductive support member 170 of the first electrode 181 and the second contact portion 192.

Accordingly, power may be supplied to the first conductive semiconductor layer 111 through a scheme of attaching the conductive support member 170 to the bonding pad. According to the embodiment, the second contact portion 192 may be electrically connected to the second electrode 182. Therefore, the second contact portion 192 is connected to a power pad through a wire bonding scheme, thereby supplying power to the second conductive semiconductor layer 113.

According to the light emitting device of the embodiment, power may be supplied to the light emitting structure 110 through the conductive support member 170 and the second contact portion 192. Therefore, according to the embodiment, current concentration can be prevented, and the electrical reliability can be improved.

In the light emitting device according to the embodiment, the through holes 120 are formed from the top surface of the light emitting structure 110. In addition, the insulating ion implantation layer 131 can be formed around the first contact portion 191 through the implantation process so that the widths of the through holes 120 and the first contact portion 191 can be reduced. Thus, the manufacturing process can be simplified and the product yield can be improved. In addition, according to the light emitting device of the embodiment, an area of the electrode disposed on the top surface of the light emitting structure 110 can be reduced so that a protective layer may be omitted from the top surface or lateral side of the light emitting structure 110. Therefore, the extraction efficiency of light emitted to the outside from the light emitting structure 110 can be improved.

Figure 14:
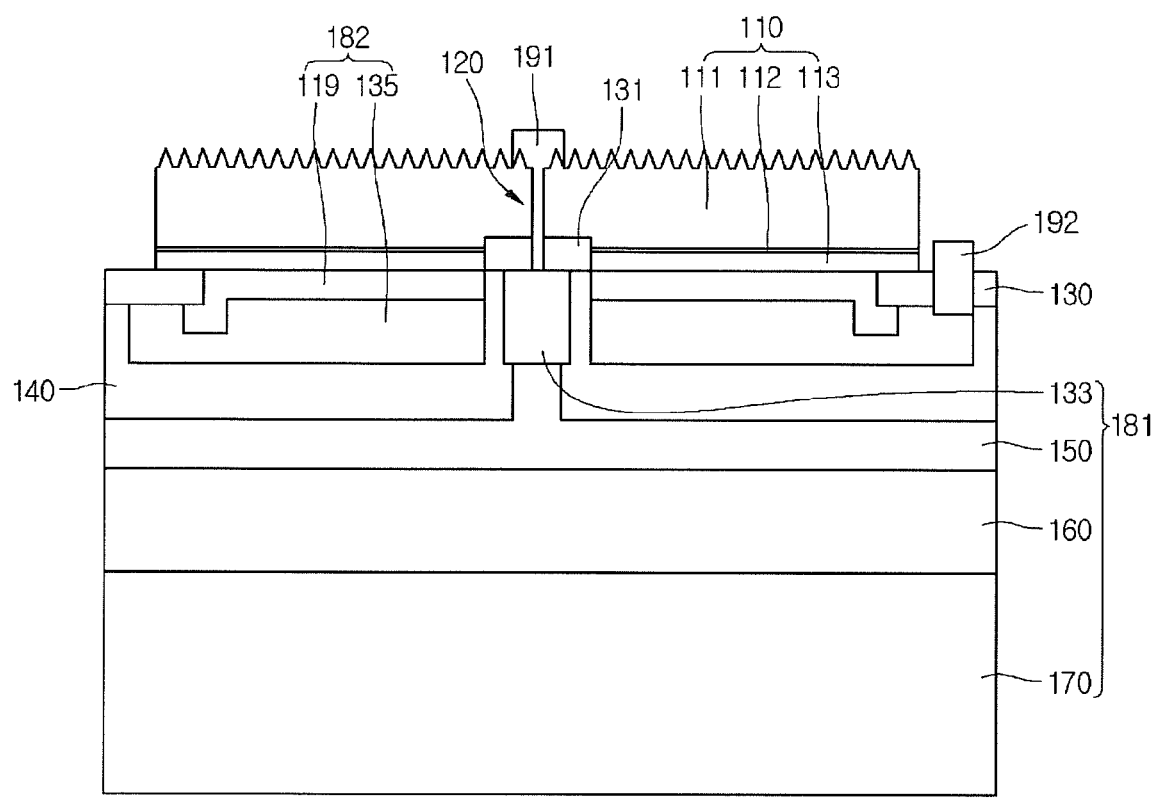
FIG. 14 is a sectional view showing a light emitting device according to still another embodiment.

FIG. 14 is a sectional view showing another example of a light emitting device according to the embodiment. In the description about the light emitting device shown in FIG. 14, the description that has been described with reference to FIGS. 8 and 9 may be simplified or omitted in order to avoid redundancy.

According to the light emitting device of the embodiment, an ohmic reflective layer 119 may be provided under the light emitting structure 110. The ohmic reflective layer 119 may be realized such that the ohmic reflective layer 119 may serve as both of the reflective layer 117 and the ohmic contact layer 115. Accordingly, the ohmic reflective layer 119 may make ohmic-contact with the second conductive semiconductor layer 113, and reflect the light incident thereto from the light emitting structure 110.

In this case, the ohmic reflective layer 119 may include multiple layers. For example, the ohmic reflective layer 119 may have a structure in which an Ag layer and a Ni layer are alternately formed, or may include a Ni/Ag/Ni layer, a Ti layer, or a Pt layer.

According to the light emitting device of the embodiment, the conductive support member 170 provided under the ohmic reflective layer 119 may be electrically connected to the first conductive semiconductor layer 111 provided on the ohmic reflective layer 119.

The second electrode 182 according to the embodiment may include at least one of the ohmic reflective layer 119 and the second metal layer 135. In the light emitting device according to the embodiment, the conductive support member 170 provided under the second electrode 182 may be electrically connected to the first conductive semiconductor layer 111 provided on the second electrode 182 through the first contact portion 191.

The light emitting device according to the embodiment may include a channel layer 130 provided around a lower portion of the light emitting structure 110. One end of the channel layer 130 may be provided under the second conductive semiconductor layer 113. The one end of the channel layer 130 may make contact with a bottom surface of the second conductive semiconductor layer 113. The one end of the channel layer 130 may be disposed between the second conductive semiconductor layer 113 and the ohmic reflective layer 119.

The light emitting device according to the embodiment may include the first contact portion 191. The first contact portion 191 may be disposed through the light emitting structure 110. The first contact portion 191 may be disposed through the first conductive semiconductor layer 111, the active layer 112 and the second conductive semiconductor layer 113.

For example, as shown in FIG. 9, a plurality of first contact portions 191 may be formed in the light emitting structure 110. The first contact portions 191 may be disposed along the through holes 120 of the light emitting structure 110. A first region of the first contact portion 191 may be electrically connected to the first electrode 181 and a second region of the first contact portion 191 may make contact with a top surface of the first conductive semiconductor layer 111. For instance, the first region of the first contact portion 191 may make contact with a first metal layer 133. The first region of the first contact portion 191 may make contact with the top surface of the first metal layer 133. For example, when the light emitting structure 110 is grown into a GaN semiconductor layer, the first contact portion 191 may make contact with an n face of the first conductive semiconductor layer 111.

Although only one first contact portion 191 is illustrated in the light emitting device shown in FIG. 14, the light emitting structure 110 according to the embodiment may be formed with a plurality of first contact portions 191 as shown in FIG. 9 and the first contact portions 191 may be formed in the through holes 120, respectively.

The first contact portions 191 may be spaced apart from each other on the top surface of the first conductive semiconductor layer 111. Since the first contact portions 191 are distributed on the light emitting structure 110, current applied to the first conductive semiconductor layer 111 may be spread. Thus, the degradation of the first conductive semiconductor layer 111 can be prevented and the combination efficiency of the electrons and holes in the active layer 112 can be improved.

The light emitting device according to the embodiment may include an insulating ion implantation layer 131. The insulating ion implantation layer 131 may be disposed around the first contact portion 191. The insulating ion implantation layer 131 may be disposed in the light emitting structure 110. The insulating ion implantation layer 131 may be disposed between the second conductive semiconductor layer 113 and the first contact portion 191. The insulating ion implantation layer 131 may make contact with a lateral side of the first contact portion 191.

The insulating ion implantation layer 131 may be disposed through the active layer 112 and the second conductive semiconductor layer 113. The insulating ion implantation layer 131 may insulate the first contact portion 191 from the second conductive semiconductor layer 113. The insulating ion implantation layer 131 may be disposed between the active layer 112 and the first contact portion 191. The insulating ion implantation layer 131 may insulate the first contact portion 191 from the active layer 112. A top surface of the insulating ion implantation layer 131 may make contact with the first conductive semiconductor layer 111.

A bottom surface of the insulating ion implantation layer 131 may be arranged on the same plane with a bottom surface of the first contact portion 191. The bottom surface of the insulating ion implantation layer 131 may be arranged on the same plane with a bottom surface of the second conductive semiconductor layer 113. The bottom surface of the first contact portion 191 may be arranged on the same plane with the bottom surface of the second conductive semiconductor layer 113. The bottom surface of the first contact portion 191 may be arranged on the same plane with a top surface of the channel layer 130.

The insulating ion implantation layer 131 may be formed by implanting insulating ions into the light emitting structure 110 through an ion implantation process. The insulating ion implantation layer 131 may be implanted in a portion of the second conductive semiconductor layer 113. The insulating ion implantation layer 131 may be implanted in a portion of the active layer 112. The insulating ion implantation layer 131 may be implanted in a portion of the first conductive semiconductor layer 111. For example, the insulating ion implantation layer 131 may be formed by implanting at least one of an N ion, an O ion and an Ar ion.

The second conductive semiconductor layer 113 may be disposed around the insulating ion implantation layer 131. The second conductive semiconductor layer 113 may be disposed around a lateral side of the insulating ion implantation layer 131. The second conductive semiconductor layer 113 may make contact with the lateral side of the insulating ion implantation layer 131. The active layer 112 may be disposed around the insulating ion implantation layer 131. The active layer 112 may be disposed around the lateral side of the insulating ion implantation layer 131. The active layer 112 may make contact with the lateral side of the insulating ion implantation layer 131.

The insulating ion implantation layer 131 may be formed in a portion of a semiconductor layer constituting the light emitting structure 110 through the implantation process. Thus, an additional patterning process to form the insulating layer around the first contact portion 191 may not be necessary.

In addition, when forming the first contact portion 191 in the light emitting structure 110, the through hole 120 is formed corresponding to a space where the first contact portion 191 is provided so that the width of the through hole 120 can be minimized. Thus, the through hole 120 may have the width in the range of about 3 μm to about 5 μm. The first contact portion 191 formed in the through hole 120 may also have the width in the range of about 3 μm to about 5 μm. That is, the first contact portion 191 disposed in the light emitting structure 110 may have the width in the range of about 3 μm to about 5 μm. In this manner, since the width of the first contact portion 191 can be diminished, the area for the active layer 112 can be enlarged so that the light emission area can be increased.

Meanwhile, according to the embodiment, a part of the first contact portion 191 may include a conductive ion implantation layer. For example, a region of the first contact portion 191, which is disposed in the light emitting structure 110, may be formed as the conductive ion implantation layer. At this time, the conductive ion implantation layer can be formed by implanting conductive ions into the light emitting structure 110 through the implantation process. For example, the conductive ion implantation layer may be formed by implanting at least one of a Ti ion, an Al ion, or an Au ion.

The light emitting device according to the embodiment may include a first metal layer 133 provided under the insulating ion implantation layer 131. The first metal layer 133 may include at least one of Au, Cu, Ni, Ti, Ti—W, Cr, W, Pt, V, Fe and Mo. A top surface of the first metal layer 133 may make contact with a bottom surface of the insulating ion implantation layer 131. The first metal layer 133 may be disposed under the first contact portion 191. The first metal layer 133 may be electrically connected to the first contact portion 191. The top surface of the first metal layer 133 may make contact with the bottom surface of the first contact portion 191. The top surface of the first metal layer 133 may be arranged on the same plane with the bottom surface of the first contact portion 191.

The insulating layer 140 may be disposed between the first and second metal layers 133 and 135. The insulating layer 140 may be disposed under the second metal layer 135. The insulating layer 140 may be disposed under the insulating ion implantation layer 131. A top surface of the insulating layer 140 may make contact with the bottom surface of the insulating ion implantation layer 131. The insulating layer 140 may be disposed under the second electrode 182. The insulating layer 140 may be disposed under the channel layer 130.

The third metal layer 150 may be disposed under the first metal layer 133. The third metal layer 150 may be electrically connected to the first contact portion 191. A top surface of the third metal layer 150 may make contact with a bottom surface of the first metal layer 133. The third metal layer 150 may be disposed under the insulating layer 140.

The third metal layer 150 may include at least one of Cu, Ni, Ti, Ti—W, Cr, W, Pt, V, Fe, and Mo. The third metal layer 150 may serve as a diffusion barrier layer. A bonding layer 160 and a conductive support member 170 may be provided under the third metal layer 150.

According to the embodiment, the first electrode 181 may include at least one of the first metal layer 133, the third metal layer 150, the bonding layer 160 and the conductive support member 170. The first electrode 181 may include all of the first metal layer 133, the third metal layer 150, the bonding layer 160 and the conductive support member 170. In addition, the first electrode 181 may selectively include two or three of the first metal layer 133, the third metal layer 150, the bonding layer 160 and the conductive support member 170.

The first electrode 181 may be disposed under the light emitting structure 110. The first electrode 181 may be electrically connected to the first conductive semiconductor layer 111. A bottom surface of the first electrode 181 may be located lower than a bottom surface of the second electrode 182. The top surface of the first electrode 181 may be arranged on the same plane with the top surface of the second electrode 182. The insulating layer 140 may be disposed between the first and second electrodes 181 and 182.

In addition, the light emitting device according to the embodiment may include the second contact portion 192. The second contact portion 192 may be spaced apart from the light emitting structure 110. The second contact portion 192 may be electrically connected to the second electrode 182. The second contact portion 192 may be electrically connected to the second electrode 182 by passing through the channel layer 130. The second contact portion 192 may be electrically connected to the second metal layer 135. The second contact portion 192 may come into contact with the top surface of the second metal layer 135.

According to the embodiment, power may be applied to the light emitting structure 110 through the first electrode 181 and the second electrode 182. For example, in the light emitting device according to the embodiment, the power may be applied to the light emitting structure 110 through the conductive support member 170 of the first electrode 181 and the second contact portion 192.

Accordingly, power may be supplied to the first conductive semiconductor layer 111 through a scheme of attaching the conductive support member 170 to the bonding pad. According to the embodiment, the second contact portion 192 may be electrically connected to the second electrode 182. Therefore, the second contact portion 192 is connected to a power pad through a wire bonding scheme, thereby supplying power to the second conductive semiconductor layer 113.

According to the light emitting device of the embodiment, power may be supplied to the light emitting structure 110 through the conductive support member 170 and the second contact portion 192. Therefore, according to the embodiment, current concentration can be prevented, and the electrical reliability can be improved.

In the light emitting device according to the embodiment, the through holes 120 are formed from the top surface of the light emitting structure 110. In addition, the insulating ion implantation layer 131 can be formed around the first contact portion 191 through the implantation process so that the widths of the through holes 120 and the first contact portion 191 can be reduced. Thus, the manufacturing process can be simplified and the product yield can be improved. In addition, according to the light emitting device of the embodiment, an area of the electrode disposed on the top surface of the light emitting structure 110 can be reduced so that a protective layer may be omitted from the top surface or lateral side of the light emitting structure 110. Therefore, the extraction efficiency of light emitted to the outside from the light emitting structure 110 can be improved.

Figure 15:
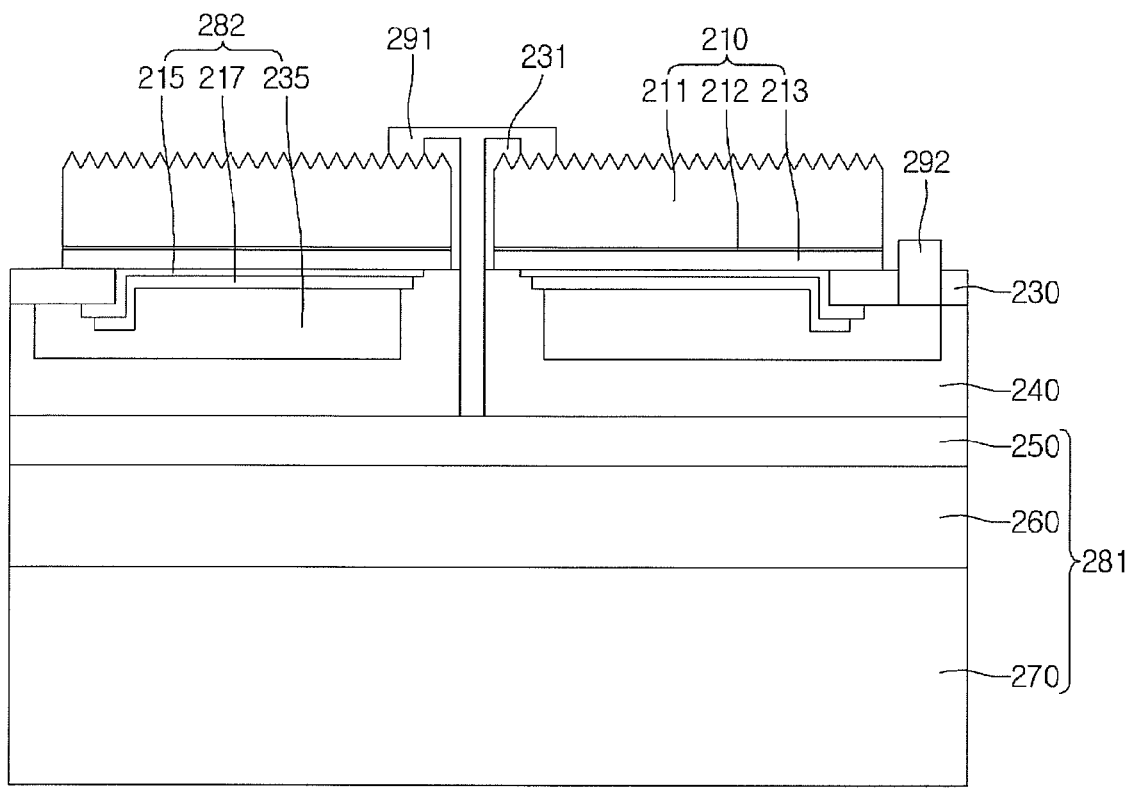
FIG. 15 is a sectional view showing a light emitting device according to still another embodiment.
Figure 16:
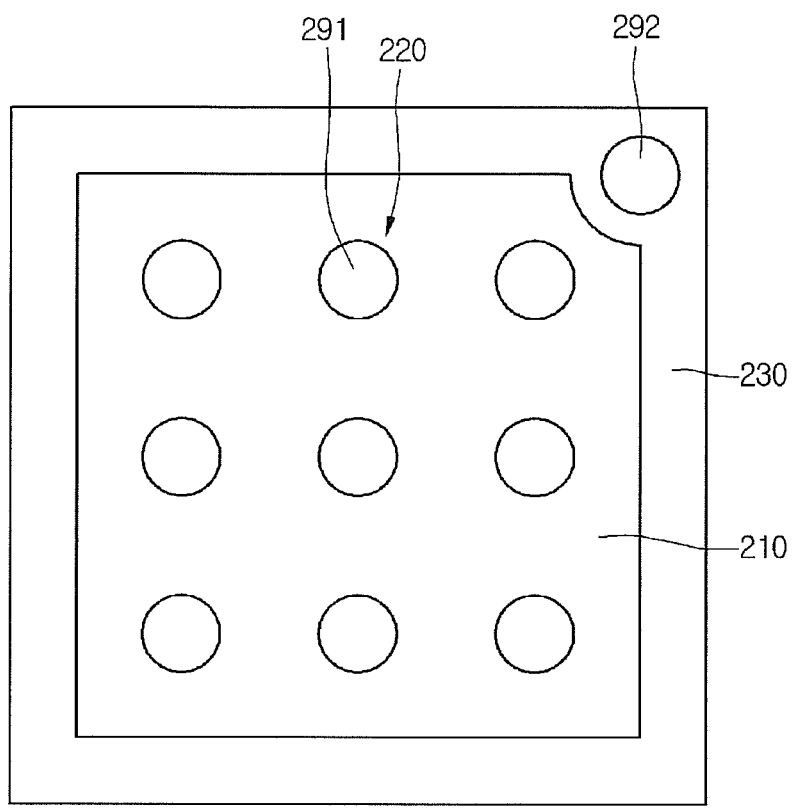
FIG. 16 is a view showing an arrangement of a first contact portion of a light emitting device shown in FIG. 15.

FIG. 15 is a sectional view showing a light emitting device according to still another embodiment and FIG. 16 is a view showing an arrangement of a first contact portion of the light emitting device shown in FIG. 15. The description that has been described with reference to FIGS. 1 to 7 may be simplified or omitted in order to avoid redundancy.

As shown in FIGS. 15 and 16, the light emitting device according to the embodiment may include a light emitting structure 210, a first electrode 281, a second electrode 282 and a first contact portion 291.

The light emitting structure 210 may include a first conductive semiconductor layer 211, an active layer 212, and a second conductive semiconductor layer 213. The active layer 212 may be disposed between the first conductive semiconductor layer 211 and the second conductive semiconductor layer 213. The active layer 212 may be provided under the first conductive semiconductor layer 211, and the second conductive semiconductor layer 213 may be provided under the active layer 212.

The light emitting device according to the embodiment may include a reflective layer 217. The reflective layer 217 may be electrically connected to the second conductive semiconductor layer 213. The reflective layer 217 may be disposed under the light emitting structure 210. The reflective layer 217 may be disposed under the second conductive semiconductor layer 213. The reflective layer 217 may reflect light incident thereto from the light emitting structure 210 to increase the quantity of light extracted to an outside.

The light emitting device according to the embodiment may include an ohmic contact layer 215 disposed between the reflective layer 217 and the second conductive semiconductor layer 213. The ohmic contact layer 215 may make contact with the second conductive semiconductor layer 213. The ohmic contact layer 215 may make ohmic contact with the light emitting structure 210. The ohmic contact layer 215 may include a region that makes ohmic-contact with the light emitting structure 210. The ohmic contact layer 215 may include a region that makes ohmic-contact with the second conductive semiconductor layer 213.

The light emitting device according to the embodiment may include a first metal layer 235 provided under the reflective layer 217. The first metal layer 235 may include at least one of Au, Cu, Ni, Ti, Ti—W, Cr, W, Pt, V, Fe, and Mo.

According to the embodiment, the second electrode 282 may include at least one of the reflective layer 217, the ohmic contact layer 215, and the first metal layer 235. For example, the second electrode 282 may include all of the reflective layer 217, the first metal layer 235, and the ohmic contact layer 215, or may include one or two selected from the reflective layer 217, the first metal layer 235, and the ohmic contact layer 215.

The second electrode 282 according to the embodiment may be disposed under the light emitting structure 210. The second electrode 282 may be electrically connected to the second conductive semiconductor layer 213.

The light emitting device according to the embodiment may include a channel layer 230 provided around a lower portion of the light emitting structure 210. One end of the channel layer 230 may be provided under the second conductive semiconductor layer 213. The one end of the channel layer 230 may make contact with a bottom surface of the second conductive semiconductor layer 213. The one end of the channel layer 230 may be disposed between the second conductive semiconductor layer 213 and the reflective layer 217. The one end of the channel layer 230 may be disposed between the second conductive semiconductor layer 213 and the ohmic contact layer 215.

A second insulating layer 240 may be disposed under the first metal layer 235. The second insulating layer 240 may be formed by using oxide or nitride. For example, the second insulating layer 240 may include at least one selected from the group consisting of SiO2, SixOy, Si3N4, SixNy, SiOxNy, Al2O3, TiO2, and AlN.

The second insulating layer 240 may be disposed under the light emitting structure 210. The second insulating layer 240 may be disposed under the second conductive semiconductor layer 213. A first region of the second insulating layer 240 may make contact with a bottom surface of the light emitting structure 210. The first region of the second insulating layer 240 may make contact with a bottom surface of the second conductive semiconductor layer 213. A second region of the second insulating layer 240 may be disposed at a lateral side of the first metal layer 235. A portion of the second insulating layer 240 may be disposed around the first metal layer 235. The second insulating layer 240 may come into contact with the reflective layer 217 and the ohmic contact layer 215.

A second metal layer 250 may be formed under the second insulating layer 240. The second metal layer 250 may be electrically connected to the first conductive semiconductor layer 211. The second metal layer 250 may include at least one of Cu, Ni, Ti, Ti—W, Cr, W, Pt, V, Fe, and Mo. The second metal layer 250 may serve as a diffusion barrier layer. The bonding layer 260 and the conductive support member 270 may be provided under the second metal layer 250.

The second metal layer 250 may prevent a material included in the bonding layer 260 from being diffused to the reflective layer 217 in the process of providing the bonding layer 260. The second metal layer 250 may prevent a material, such as Sn, included in the bonding layer 260 from exerting an influence on the reflective layer 217.

According to the embodiment, the first electrode 281 may include at least one of the second metal layer 250, the bonding layer 260 and the conductive support member 270. The first electrode 281 may include all of the second metal layer 250, the bonding layer 260 and the conductive support member 270. In addition, the first electrode 281 may selectively include one or two of the second metal layer 250, the bonding layer 260 and the conductive support member 270.

The first electrode 281 may be disposed under the light emitting structure 210. The first electrode 281 may be electrically connected to the first conductive semiconductor layer 211. A bottom surface of the first electrode 281 may be located lower than a bottom surface of the second electrode 282.

The second electrode 282 may be disposed under the light emitting structure 210. The second electrode 282 may be electrically connected to the second conductive semiconductor layer 213. A bottom surface of the second electrode 282 may be located higher than a top surface of the first electrode 281.

The second insulating layer 240 may be disposed between the first and second electrodes 281 and 282. The second insulating layer 240 may be disposed between the light emitting structure 210 and the first electrode 281.

The light emitting device according to the embodiment may include the first contact portion 291. The first contact portion 291 may be disposed through the light emitting structure 210. The first contact portion 291 may be disposed through the first conductive semiconductor layer 211, the active layer 212 and the second conductive semiconductor layer 213.

For example, as shown in FIG. 9, a plurality of through holes 220 may be formed in the light emitting structure 210. The first contact portions 291 may be disposed along the through holes 220 of the light emitting structure 210. A first region of the first contact portion 291 may be electrically connected to the first electrode 281 and a second region of the first contact portion 291 may make contact with a top surface of the first conductive semiconductor layer 211. For instance, the first region of the first contact portion 291 may make contact with the top surface of the second metal layer 250. When the light emitting structure 210 is grown into a GaN semiconductor layer, the first contact portion 291 may make contact with an n face of the first conductive semiconductor layer 211.

Although only one first contact portion 291 is illustrated in the light emitting device shown in FIG. 15, the light emitting structure 210 according to the embodiment may be formed with a plurality of through holes 220 as shown in FIG. 16 and the first contact portions 291 may be formed in the through holes 220, respectively.

Each of the first contact portions 291 may include the second region that makes contact with the top surface of the first conductive semiconductor layer 211 and the second regions may be spaced apart from each other. For example, the second regions may be configured in the form of dots. The dots may be arranged in the form of a circle, a rectangle or a triangle. The arrangement of the dots may be variously modified.

Meanwhile, the through hole 220 may have a width or a diameter in the range of about 5 μm to about 200 μm. If the through hole 220 has a width or a diameter less than about 5 μm, the process to form the first contact portion 291 may be difficult. In addition, if the through hole 220 has a width or a diameter greater about 200 μm, the light emitting area of the light emitting structure 210 is reduced so that the light extraction efficiency may be degraded. The first contact portion 291 disposed in the through hole 220 may also have a width or a diameter in the range of about 5 μm to about 200 μm.

The first contact portions 291 may be spaced apart from each other on the top surface of the first conductive semiconductor layer 211. Since the first contact portions 291 are distributed on the light emitting structure 210, current applied to the first conductive semiconductor layer 211 may be spread. Thus, the degradation of the first conductive semiconductor layer 211 can be prevented and the combination efficiency of the electrons and holes in the active layer 212 can be improved.

For example, the first contact portions 291 disposed on the top surface of the first conductive semiconductor layer 211 may extend from the peripheral portion of the through hole 220 in the range of about 5 μm to about 50 μm.

A first insulating layer 231 may be disposed around the first contact portion 291. A first region of the first insulating layer 231 may be disposed in the light emitting structure 210. A second region of the first insulating layer 231 may be disposed on a top surface of the light emitting structure 210. The second region of the first insulating layer 231 may be disposed between the first conductive semiconductor layer 211 and the first contact portion 291. The first region of the first insulating layer 231 may insulate the first contact portion 291 from the active layer 212. The first region of the first insulating layer 231 may electrically insulate the first contact portion 291 from the second conductive semiconductor layer 213.

The first insulating layer 231 may be disposed through the second conductive semiconductor layer 213, the active layer 212 and the first conductive semiconductor layer 211. The first insulating layer 231 may be disposed around the first contact portion 291.

In addition, the light emitting device according to the embodiment may include a second contact portion 292. The second contact portion 292 may be spaced apart from the light emitting structure 210. The second contact portion 292 may be electrically connected to the second electrode 282. The second contact portion 292 may be electrically connected to the second electrode 282 by passing through the channel layer 230. The second contact portion 292 may be electrically connected to the first metal layer 235. The second contact portion 292 may come into contact with the top surface of the first metal layer 235.

The light emitting device according to the embodiment may include the second insulating layer 240 disposed between the first metal layer 235 and the second metal layer 250. The second insulating layer 240 may insulate the first metal layer 235 from the second metal layer 250. The second insulating layer 240 may insulate the first metal layer 235 from the conductive support member 270. For example, the second insulating layer 240 may be realized by using oxide or nitride. For example, the second insulating layer 240 may include at least one selected from the group consisting of $SiO_2$, $Si_xO_y$, $Si_3N_4$, $Si_xN_y$, $SiO_xN_y$, $Al_2O_3$, $TiO_2$, and AlN.

A portion of the second insulating layer 240 may surround a peripheral portion of the second metal layer 250. An upper portion of the second insulating layer 240 may make contact with the bottom surface of the first insulating layer 231.

The second insulating layer 240 may be disposed between the first and second electrodes 281 and 282. The second insulating layer 240 may electrically insulate the first electrode 281 from the second electrode 282.

According to the embodiment, power may be applied to the light emitting structure 210 through the first electrode 281 and the second electrode 282. For example, in the light emitting device according to the embodiment, the power may be applied to the light emitting structure 210 through the conductive support member 270 of the first electrode 281 and the second contact portion 292.

Accordingly, power may be supplied to the first conductive semiconductor layer 211 through a scheme of attaching the conductive support member 270 to the bonding pad. According to the embodiment, the second contact portion 292 may be electrically connected to the second electrode 282. Therefore, the second contact portion 292 is connected to a power pad through a wire bonding scheme, thereby supplying power to the second conductive semiconductor layer 213.

According to the light emitting device of the embodiment, power may be supplied to the light emitting structure 210 through the conductive support member 270 and the second contact portion 292. Therefore, according to the embodiment, current concentration can be prevented, and the electrical reliability can be improved.

In the light emitting device according to the embodiment, the through holes 220 are formed from the top surface of the light emitting structure 210. Thus, the manufacturing process can be simplified and the product yield can be improved. In addition, according to the light emitting device of the embodiment, an area of the electrode disposed on the top surface of the light emitting structure 210 can be reduced so that a protective layer may be omitted from the top surface or lateral side of the light emitting structure 210. Therefore, the extraction efficiency of light emitted to the outside from the light emitting structure 210 can be improved.

According to the embodiment, the second insulating layer 240 makes contact with the lower portion of the light emitting structure 210 so that the delamination phenomenon can be diminished. In addition, the second insulating layer 240 may serve as a current blocking layer. Further, since an additional current blocking layer is not formed at the region where the first contact portion 291 is exposed to the lower portion of the light emitting structure 210, the ohmic contact layer 215 and the reflective layer 217 can be uniformly formed at the lower central region of the light emitting structure 210 without bending. Therefore, the thickness of the second insulating layer 240 can be reduced. For example, the second insulating layer 240 may have the thickness in the range of 300 nm to 3000 nm so that the overall thickness of the light emitting device can be reduced.

Hereinafter, a method of fabricating the light emitting device according to the embodiment will be described with reference to FIGS. 17 to 20. The description that has been described with reference to FIGS. 1 to 7 may be simplified or omitted in order to avoid redundancy.

Figure 17:
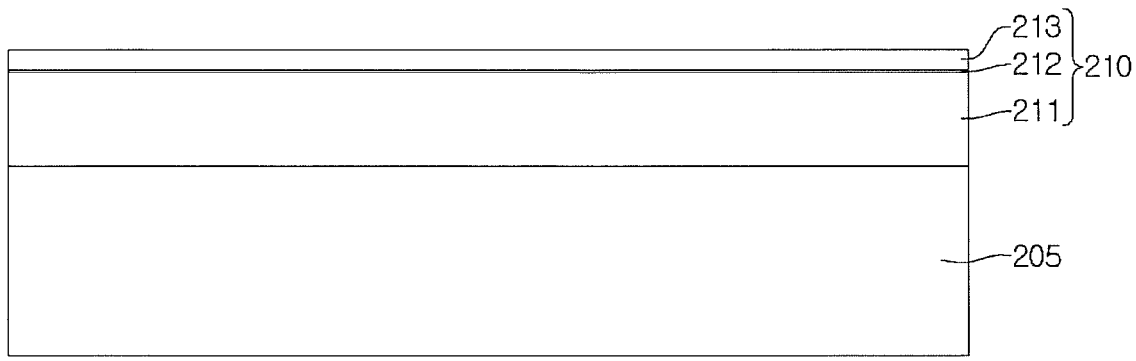
FIGS. 17 to 20 are sectional views showing a method of fabricating a light emitting device according to the embodiment.

According to the method of fabricating the light emitting device of the embodiment, as shown in FIG. 17, the first conductive semiconductor layer 211, the active layer 212, and the second conductive semiconductor layer 213 may be formed on a substrate 205. The first conductive semiconductor layer 211, the active layer 212, and the second conductive semiconductor layer 213 may be defined as the light emitting structure 210.

Figure 18:
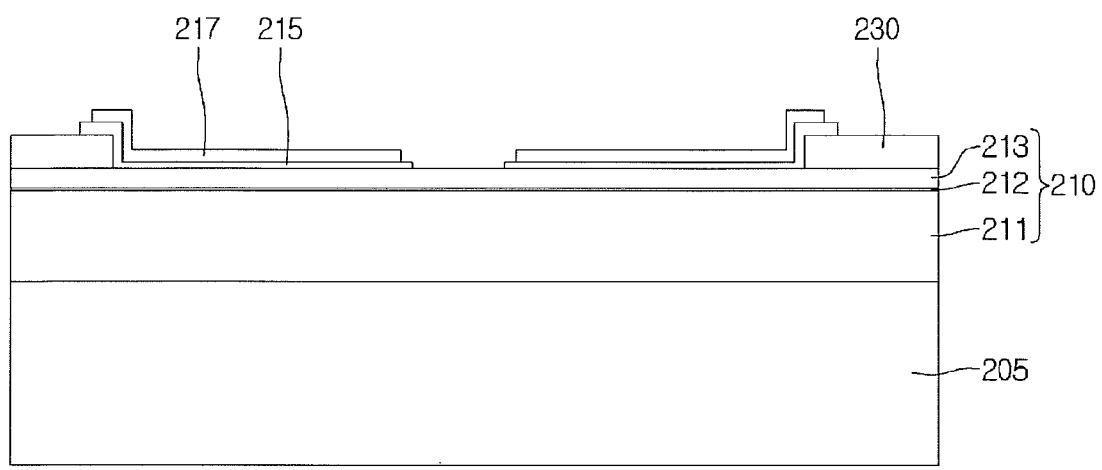

Next, as shown in FIG. 18, the channel layer 230 may be formed on the light emitting structure 210. The channel layer 230 may be formed by using an insulating material.

Then, as shown in FIG. 18, the ohmic contact layer 215 and the reflective layer 217 may be formed in the light emitting structure 210.

The ohmic contact layer 215 may be disposed between the reflective layer 217 and the second conductive semiconductor layer 213. The ohmic contact layer 215 may make contact with the second conductive semiconductor layer 213.

Figure 19:
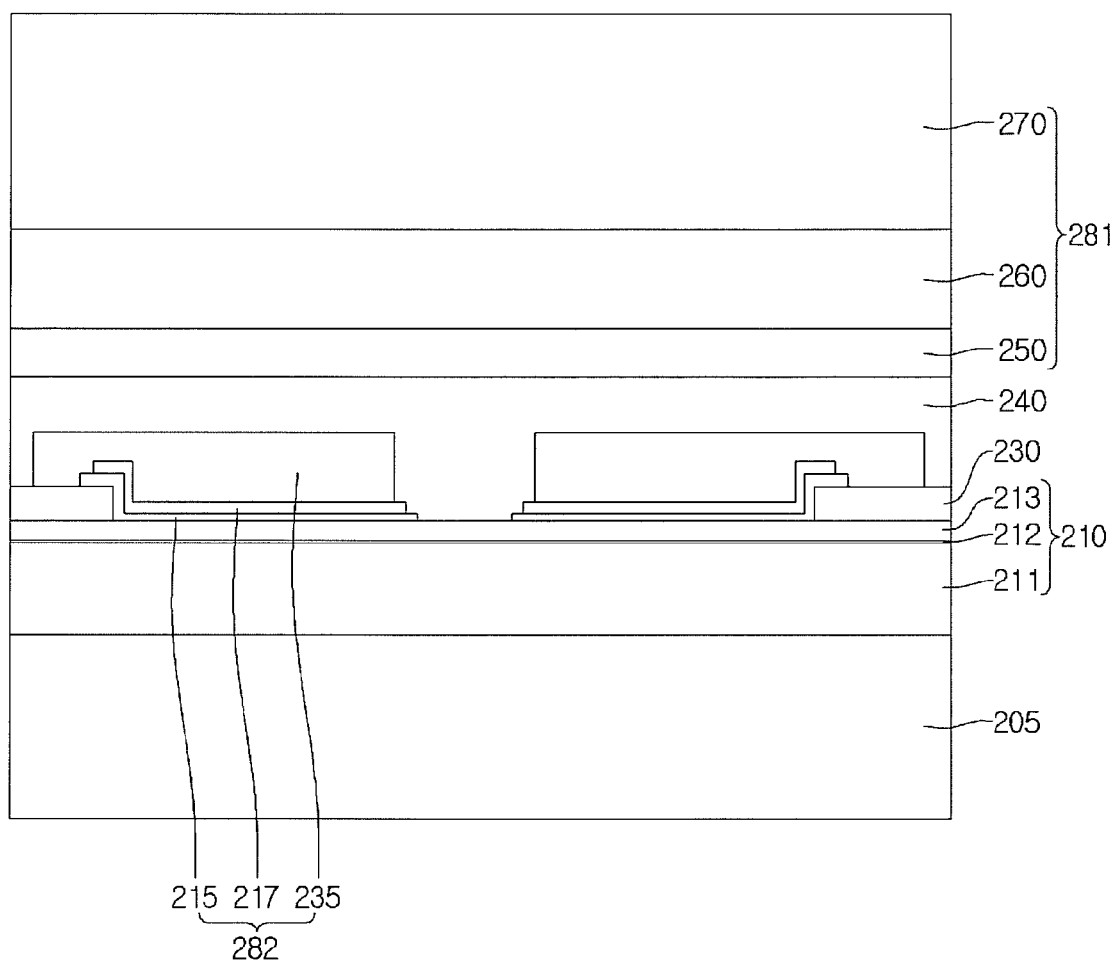

Then, as shown in FIG. 19, the first metal layer 235, the second insulating layer 240, the second metal layer 250, the bonding layer 260, and the conductive support member 270 may be formed on the reflective layer 217.

The first metal layer 235 may include at least one selected from the group consisting of Au, Cu, Ni, Ti, Ti—W, Cr, W, Pt, V, Fe, and Mo. According to the embodiment, the second electrode 282 may include at least one of the reflective layer 217, the ohmic contact layer 215, and the first metal layer 235. For example, the second electrode 282 may include all of the reflective layer 217, the ohmic contact layer 215, and the first metal layer 235 or may selectively include one or two of the reflective layer 217, the ohmic contact layer 215, and the first metal layer 235.

The second insulating layer 240 may be formed on the first metal layer 235. The second insulating layer 240 may be formed by using oxide or nitride. The second metal layer 250 may be formed on the second insulating layer 240. The second metal layer 250 may serve as a diffusion barrier layer. The bonding layer 260 and the conductive support member 270 may be provided on the second metal layer 250.

The second metal layer 250 may prevent a material included in the bonding layer 260 from being diffused to the reflective layer 217 in the process of providing the bonding layer 260. The second metal layer 250 may prevent a material, such as Sn, included in the bonding layer 260 from exerting an influence on the reflective layer 217.

According to the embodiment, the first electrode 281 may include at least one of the second metal layer 250, the bonding layer 260 and the conductive support member 270. The first electrode 281 may include all of the second metal layer 250, the bonding layer 260 and the conductive support member 270. In addition, the first electrode 281 may selectively include one or two of the second metal layer 250, the bonding layer 260 and the conductive support member 270.

Next, the substrate 205 is removed from the first conductive semiconductor layer 211. According to one example, the substrate 205 may be removed through a laser lift off (LLO) process.

Figure 20:
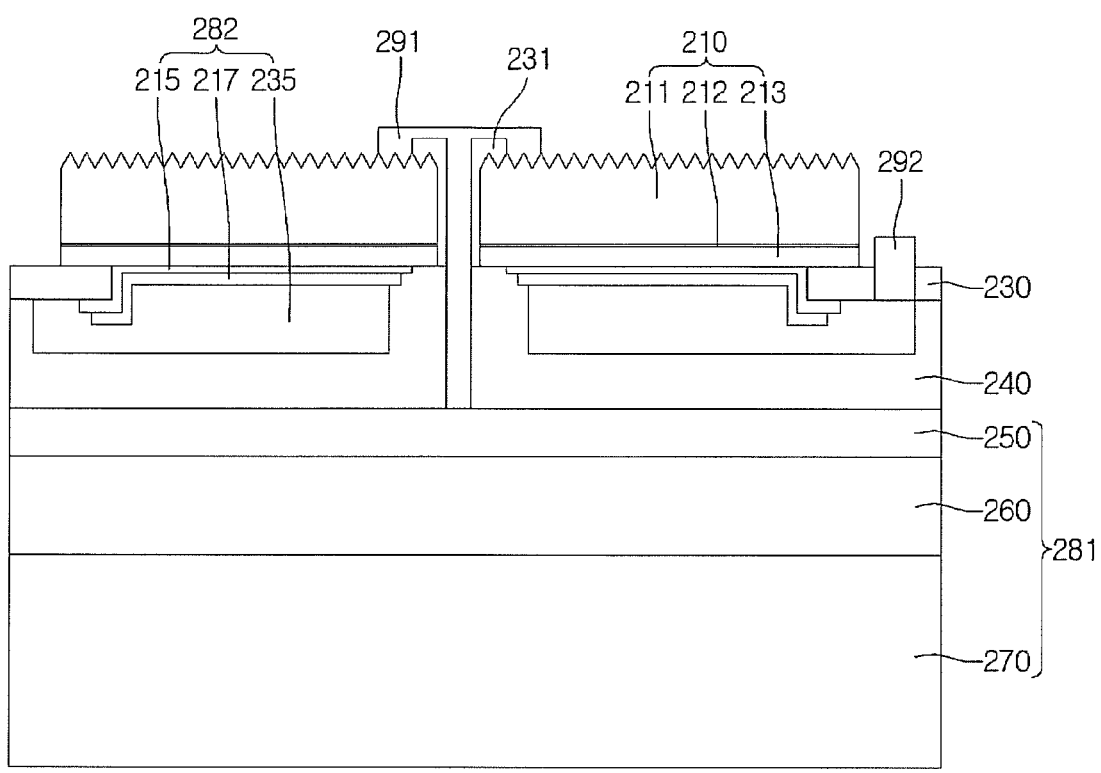

In addition, as shown in FIG. 20, the lateral side of the light emitting structure 210 is etched through an isolation etching process to expose a portion of the channel layer 230.

Then, as shown in FIG. 20, the first insulating layer 231 and the first and second contact portions 291 and 292 may be formed.

First, the through hole 220 may be disposed through the light emitting structure 210. The first insulating layer 231 may be formed in the through hole 220. Then, the first contact portion 291 may be formed in the through hole 220.

The first contact portion 291 may be disposed through the light emitting structure 210. The first contact portion 291 may be disposed through the first conductive semiconductor layer 211, the active layer 212 and the second conductive semiconductor layer 213.

For example, as shown in FIG. 16, a plurality of through holes 220 may be formed in the light emitting structure 210. The first contact portion 291 may be disposed along the through holes 220 of the light emitting structure 210.

A first region of the first contact portion 291 may be electrically connected to the first electrode 281 and a second region of the first contact portion 291 may make contact with a top surface of the first conductive semiconductor layer 211. For instance, the first region of the first contact portion 291 may make contact with a top surface of the second electrode 281. The first region of the first contact portion 291 may make contact with a top surface of the second metal layer 250.

Although only one first contact portion 291 is illustrated in the light emitting device shown in FIG. 20, the light emitting structure 210 according to the embodiment may be formed with a plurality of through holes 220 as shown in FIG. 16 and the first contact portion 291 may be formed in each through hole 220.

Meanwhile, the through hole 220 may have a width or a diameter in the range of about 5 µm to about 200 µm. If the through hole 220 has a width or a diameter less than about 5 µm, the process to form the first contact portion 291 may be difficult. In addition, if the through hole 220 has a width or a diameter greater about 200 µm, the light emitting area of the light emitting structure 210 is reduced so that the light extraction efficiency may be degraded. The first contact portion 291 disposed in the through hole 220 may also have a width or a diameter in the range of about 5 µm to about 200 µm.

The first contact portions 291 may be spaced apart from each other on the top surface of the first conductive semiconductor layer 211. Since the first contact portions 291 are distributed on the light emitting structure 210, current applied to the first conductive semiconductor layer 211 may be spread. Thus, the degradation of the first conductive semiconductor layer 211 can be prevented and the combination efficiency of the electrons and holes in the active layer 212 can be improved.

For example, the first contact portions 291 disposed on the top surface of the first conductive semiconductor layer 211 may extend from the peripheral portion of the through hole 220 in the range of about 5 µm to about 50 µm.

A first region of the first insulating layer 231 may be disposed in the light emitting structure 210. A second region of the first insulating layer 231 may be disposed on a top surface of the light emitting structure 210. The second region of the first insulating layer 231 may be disposed between the first conductive semiconductor layer 211 and the first contact portion 291.

The first region of the first insulating layer 231 may insulate the first contact portion 291 from the active layer 212 and the second conductive semiconductor layer 213. The first region of the first insulating layer 231 may electrically insulate the first contact portion 291 from the active layer 212. The first region of the first insulating layer 231 may electrically insulate the first contact portion 291 from the second conductive semiconductor layer 213.

The first insulating layer 231 may be disposed through the second conductive semiconductor layer 213, the active layer 212 and the first conductive semiconductor layer 211. The first insulating layer 231 may be disposed around the first contact portion 291.

In addition, the light emitting device according to the embodiment may include a second contact portion 292. The second contact portion 292 may be spaced apart from the light emitting structure 210. The second contact portion 292 may be electrically connected to the second electrode 282. The second contact portion 292 may be electrically connected to the second electrode 282 by passing through the channel layer 230. The second contact portion 292 may be electrically connected to the first metal layer 235. The second contact portion 292 may come into contact with the top surface of the first metal layer 235.

The second electrode 282 according to the embodiment may be disposed under the light emitting structure 210. The second electrode 282 may be electrically connected to the second conductive semiconductor layer 213. The first electrode 281 may be disposed under the light emitting structure 210. The first electrode 281 may be electrically connected to the first conductive semiconductor layer 211. A bottom surface of the first electrode 281 may be located lower than a bottom surface of the second electrode 282.

The second insulating layer 240 may be disposed under the light emitting structure 210. The second insulating layer 240 may be disposed under the second conductive semiconductor layer 213. A first region of the second insulating layer 240 may make contact with a bottom surface of the light emitting structure 210. The first region of the second insulating layer 240 may make contact with a bottom surface of the second conductive semiconductor layer 213.

The second electrode 282 may be disposed under the light emitting structure 210. The second electrode 282 may be electrically connected to the second conductive semiconductor layer 213. A bottom surface of the second electrode 282 may be located higher than a top surface of the first electrode 281.

According to the embodiment, power may be applied to the light emitting structure 210 through the first electrode 281 and the second electrode 282. For example, in the light emitting device according to the embodiment, the power may be applied to the light emitting structure 210 through the conductive support member 270 of the first electrode 281 and the second contact portion 292.

Accordingly, power may be supplied to the first conductive semiconductor layer 211 through a scheme of attaching the conductive support member 270 to the bonding pad. According to the embodiment, the second contact portion 292 may be electrically connected to the second electrode 282. Therefore, the second contact portion 292 is connected to a power pad through a wire bonding scheme, thereby supplying power to the second conductive semiconductor layer 213.

According to the light emitting device of the embodiment, power may be supplied to the light emitting structure 210 through the conductive support member 270 and the second contact portion 292. Therefore, according to the embodiment, current concentration can be prevented, and the electrical reliability can be improved.

In the light emitting device according to the embodiment, the through holes 220 are formed from the top surface of the light emitting structure 210. Thus, the manufacturing process can be simplified and the product yield can be improved. In addition, according to the light emitting device of the embodiment, an area of the electrode disposed on the top surface of the light emitting structure 210 can be reduced so that a protective layer may be omitted from the top surface or lateral side of the light emitting structure 210. Therefore, the extraction efficiency of light emitted to the outside from the light emitting structure 210 can be improved.

According to the embodiment, the second insulating layer 240 makes contact with the lower portion of the light emitting structure 210 so that the delamination phenomenon can be diminished. In addition, the second insulating layer 240 may serve as a current blocking layer. Further, since an additional current blocking layer is not formed at the region where the first contact portion 291 is exposed to the lower portion of the light emitting structure 210, the ohmic contact layer 215 and the reflective layer 217 can be uniformly formed at the lower central region of the light emitting structure 210 without bending. Therefore, the thickness of the second insulating layer 240 can be reduced. For example, the second insulating layer 240 may have the thickness in the range of 300 nm to 3000 nm so that the overall thickness of the light emitting device can be reduced.

Figure 21:
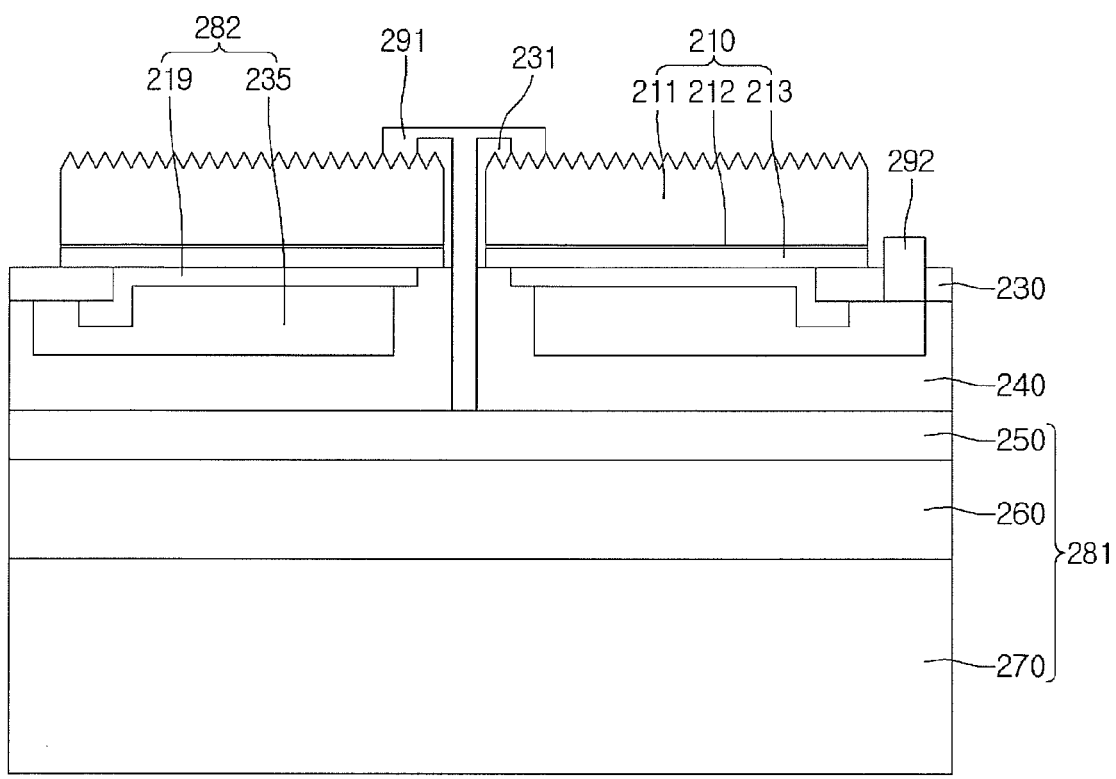
FIG. 21 is a sectional view showing a light emitting device according to still another embodiment.

FIG. 21 is a sectional view showing another example of a light emitting device according to the embodiment. In the description about the light emitting device shown in FIG. 21, the description that has been described with reference to FIGS. 15 and 16 may be simplified or omitted in order to avoid redundancy.

According to the light emitting device of the embodiment, an ohmic reflective layer 219 may be provided under the light emitting structure 210. The ohmic reflective layer 219 may be realized such that the ohmic reflective layer 219 may serve as both of the reflective layer 217 and the ohmic contact layer 215. Accordingly, the ohmic reflective layer 219 may make ohmic-contact with the second conductive semiconductor layer 213, and reflect the light incident thereto from the light emitting structure 210.

In this case, the ohmic reflective layer 219 may include multiple layers. For example, the ohmic reflective layer 219 may have a structure in which an Ag layer and a Ni layer are alternately formed, or may include a Ni/Ag/Ni layer, a Ti layer, or a Pt layer.

According to the light emitting device of the embodiment, the conductive support member 270 provided under the ohmic reflective layer 219 may be electrically connected to the first conductive semiconductor layer 211 provided on the ohmic reflective layer 219.

The first contact portion 291 may be disposed through the light emitting structure 210. The first contact portion 291 may be disposed through the first conductive semiconductor layer 211, the active layer 212 and the second conductive semiconductor layer 213.

A first region of the first contact portion 291 may be electrically connected to the first electrode 281 and a second region of the first contact portion 291 may make contact with a top surface of the first conductive semiconductor layer 211. For instance, the first region of the first contact portion 291 may make contact with a top surface of the first electrode 281. The first region of the first contact portion 291 may make contact with a top surface of the second metal layer 250.

Although only one first contact portion 291 is illustrated in the light emitting device shown in FIG. 21, the light emitting structure 210 according to the embodiment may be formed with a plurality of through holes 220 as shown in FIG. 16 and the first contact portions 291 may be formed in the through holes 220, respectively.

The first insulating layer 231 may be disposed around the first contact portion 291. A first region of the first insulating layer 231 may be disposed in the light emitting structure 210. A second region of the first insulating layer 231 may be disposed on a top surface of the light emitting structure 210. The second region of the first insulating layer 231 may be disposed between the first conductive semiconductor layer 211 and the first contact portion 291.

The first region of the first insulating layer 231 may insulate the first contact portion 291 from the active layer 212 and the second conductive semiconductor layer 213. The first region of the first insulating layer 231 may electrically insulate the first contact portion 291 from the active layer 212. The first region of the first insulating layer 231 may electrically insulate the first contact portion 291 from the second conductive semiconductor layer 213.

The first insulating layer 231 may be disposed through the second conductive semiconductor layer 213, the active layer 212 and the first conductive semiconductor layer 211. The first insulating layer 231 may be disposed around the first contact portion 291.

In addition, the light emitting device according to the embodiment may include a second contact portion 292. The second contact portion 292 may be spaced apart from the light emitting structure 210. The second contact portion 292 may be electrically connected to the second electrode 282. The second contact portion 292 may be electrically connected to the second electrode 282 by passing through the channel layer 230. The second contact portion 292 may be electrically connected to the first metal layer 235. The second contact portion 292 may come into contact with the top surface of the first metal layer 235.

The second electrode 282 according to the embodiment may be disposed under the light emitting structure 210. The second electrode 282 may be electrically connected to the second conductive semiconductor layer 213. The first electrode 281 may be disposed under the light emitting structure 210. The first electrode 281 may be electrically connected to the first conductive semiconductor layer 211. A bottom surface of the first electrode 281 may be located lower than a bottom surface of the second electrode 282.

The second insulating layer 240 may be disposed under the light emitting structure 210. The second insulating layer 240 may be disposed under the second conductive semiconductor layer 213. A first region of the second insulating layer 240 may make contact with a bottom surface of the light emitting structure 210. The first region of the second insulating layer 240 may make contact with a bottom surface of the second conductive semiconductor layer 213.

According to the embodiment, power may be applied to the light emitting structure 210 through the first electrode 281 and the second electrode 282. For example, in the light emitting device according to the embodiment, the power may be applied to the light emitting structure 210 through the conductive support member 270 of the first electrode 281 and the second contact portion 292.

Figure 22:
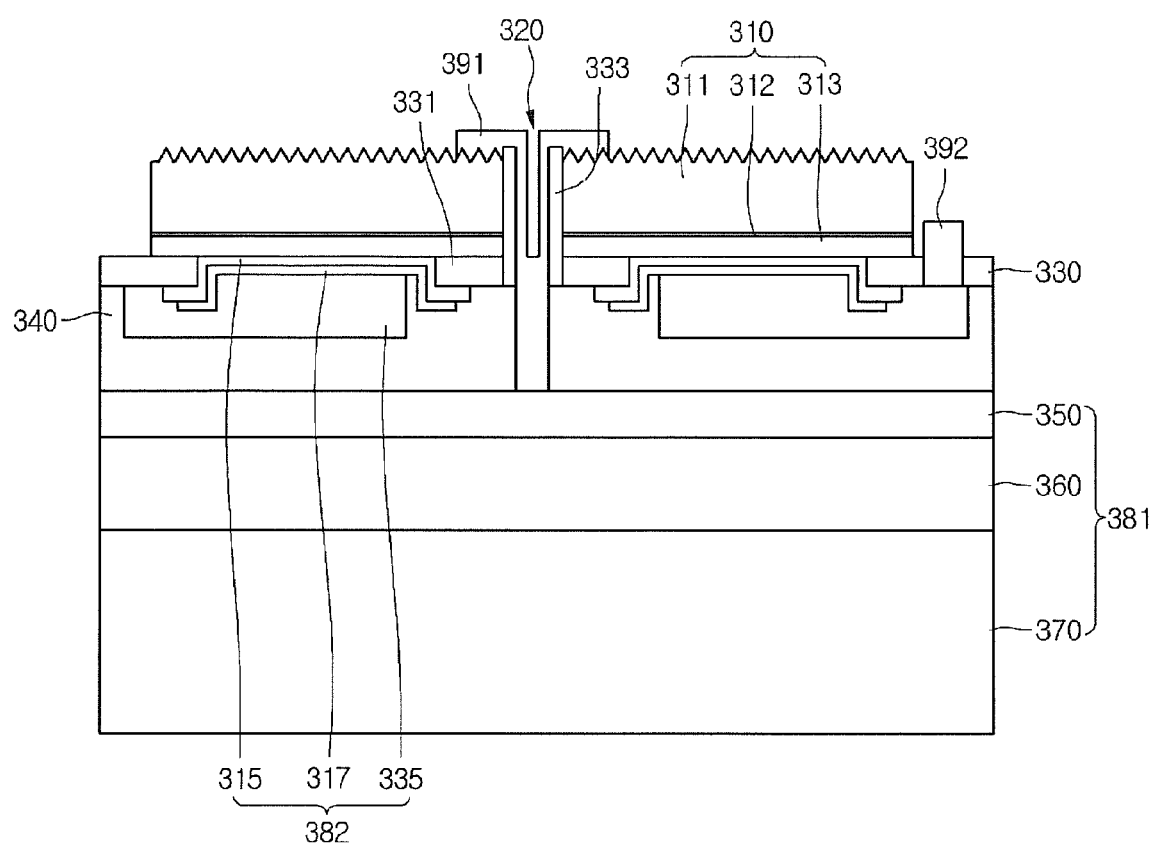
FIG. 22 is a sectional view showing a light emitting device according to still another embodiment.
Figure 23:
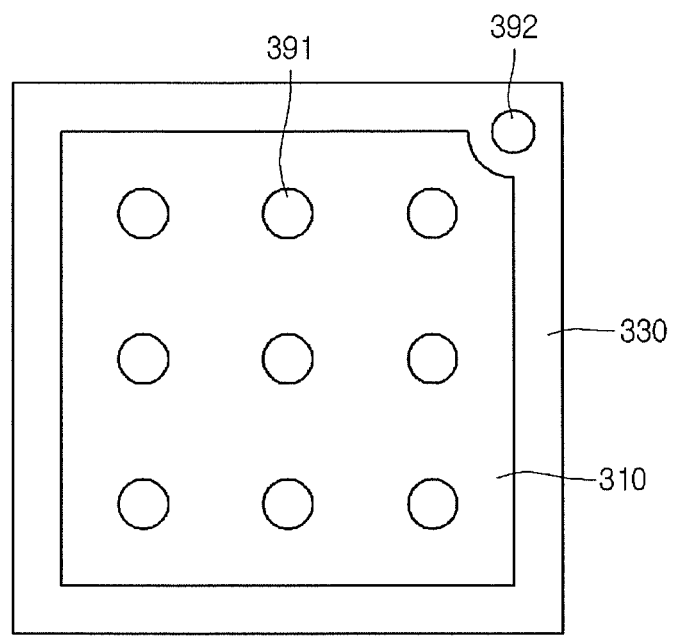
FIG. 23 is a view showing an arrangement of a first contact portion of a light emitting device shown in FIG. 22.

FIG. 22 is a sectional view showing a light emitting device according to the embodiment and FIG. 23 is a view showing an arrangement of the first contact portion of the light emitting device shown in FIG. 22. The description about the structures and elements that have been described with reference to FIGS. 1 to 7 may be simplified or omitted in order to avoid redundancy.

As shown in FIGS. 22 and 23, the light emitting device according to the embodiment may include a light emitting structure 310, a first semiconductor layer 330, a first electrode 381, a second electrode 382 and a first contact portion 391.

The light emitting structure 310 may include a first conductive semiconductor layer 311, an active layer 312, and a second conductive semiconductor layer 313. The active layer 312 may be disposed between the first conductive semiconductor layer 311 and the second conductive semiconductor layer 313. The active layer 312 may be provided under the first conductive semiconductor layer 311, and the second conductive semiconductor layer 313 may be provided under the active layer 312.

The light emitting device according to the embodiment may include a reflective layer 317. The reflective layer 317 may be electrically connected to the second conductive semiconductor layer 313. The reflective layer 317 may be disposed under the light emitting structure 310. The reflective layer 317 may be disposed under the second conductive semiconductor layer 313. The reflective layer 317 may reflect light incident thereto from the light emitting structure 310 to increase the quantity of light extracted to an outside.

The light emitting device according to the embodiment may include an ohmic contact layer 315 disposed between the reflective layer 317 and the second conductive semiconductor layer 313. The ohmic contact layer 315 may make contact with the second conductive semiconductor layer 313. The ohmic contact layer 315 may make ohmic contact with the light emitting structure 310. The ohmic contact layer 315 may include a region that makes ohmic-contact with the light emitting structure 310. The ohmic contact layer 315 may include a region that makes ohmic-contact with the second conductive semiconductor layer 313.

The light emitting device according to the embodiment may include a first metal layer 335 provided under the reflective layer 317. The first metal layer 335 may include at least one of Au, Cu, Ni, Ti, Ti—W, Cr, W, Pt, V, Fe, and Mo.

According to the embodiment, the second electrode 382 may include at least one of the reflective layer 317, the ohmic contact layer 315, and the first metal layer 335. For example, the second electrode 382 may include all of the reflective layer 317, the first metal layer 335, and the ohmic contact layer 315, or may include one or two selected from the reflective layer 317, the first metal layer 335, and the ohmic contact layer 315.

The second electrode 382 according to the embodiment may be disposed under the light emitting structure 310. The second electrode 382 may be electrically connected to the second conductive semiconductor layer 313.

The light emitting device according to the embodiment may include the first semiconductor layer 330 provided around a lower portion of the light emitting structure 310. One end of the first semiconductor layer 330 may be provided under the second conductive semiconductor layer 313. The one end of the first semiconductor layer 330 may make contact with a bottom surface of the second conductive semiconductor layer 313. The one end of the first semiconductor layer 330 may be disposed between the second conductive semiconductor layer 313 and the reflective layer 317. The one end of the first semiconductor layer 330 may be disposed between the second conductive semiconductor layer 313 and the ohmic contact layer 315.

The first semiconductor layer 330 may be exposed at the lower peripheral portion of the light emitting structure 310. The first semiconductor layer 330 may extend outward from the sidewall of the light emitting structure 310. The lateral side of the first semiconductor layer 330 may come into contact with the lateral side of the second electrode 382. The lateral side of the first semiconductor layer 330 may come into contact with the lateral side of the ohmic contact layer 315. A portion of the first semiconductor layer 330 may be disposed on a top surface of the second electrode 382. A portion of the first semiconductor layer 330 may come into contact with a top surface of the first metal layer 335.

The first semiconductor layer 330 may be referred to as an isolation layer. The first semiconductor layer 330 may serve as an etching stopper when an isolation process is performed with respect to the light emitting structure 310 later. In addition, the first semiconductor layer 330 may prevent the electrical characteristic of the light emitting device from being degraded caused by the isolation process.

The first semiconductor layer 330 may come into schottky-contact with the light emitting structure 310. The first semiconductor layer 330 may come into schottky-contact with the second conductive semiconductor layer 313. In addition, the first semiconductor layer 330 may have the insulating property. For instance, the first semiconductor layer 330 may be implemented to have the specific resistance of 10-1 Ωm or less. For example, the first semiconductor layer 330 may be formed by using a semiconductor material, such as AlInGaN, AlN, or ZnO. In addition, the first semiconductor layer 330 may be prepared as an undoped semiconductor layer.

For example, the first semiconductor layer 330 may have a thickness in the range of 10 nm to 1000 nm. Since the first semiconductor layer 330 including the semiconductor material is prepared as the channel layer, the channel layer according to the embodiment may have a slim thickness.

The light emitting device according to the embodiment may include the first contact portion 391. The first contact portion 391 may be disposed through the light emitting structure 310. The first contact portion 391 may be disposed through the first conductive semiconductor layer 311, the active layer 312 and the second conductive semiconductor layer 313.

For example, as shown in FIG. 23, a plurality of first contact portions 391 may be formed in the light emitting structure 310. The first contact portions 391 may be disposed along the through holes 320 of the light emitting structure 310. A first region of the first contact portion 391 may be electrically connected to the first electrode 381 and a second region of the first contact portion 391 may make contact with a top surface of the first conductive semiconductor layer 311. For instance, the first region of the first contact portion 391 may make contact with a second metal layer 350. The first region of the first contact portion 391 may make contact with the top surface of the second metal layer 350. For example, when the light emitting structure 310 is grown into a GaN semiconductor layer, the first contact portion 391 may make contact with an n face of the first conductive semiconductor layer 311.

Although only one first contact portion 391 is illustrated in the light emitting device shown in FIG. 22, the light emitting structure 310 according to the embodiment may be formed with a plurality of first contact portions 391 as shown in FIG. 23 and the first contact portions 391 may be formed in the through holes 320, respectively.

The first contact portions 391 may be spaced apart from each other on the top surface of the first conductive semiconductor layer 311. Since the first contact portions 391 are distributed on the light emitting structure 310, current applied to the first conductive semiconductor layer 311 may be spread. Thus, the degradation of the first conductive semiconductor layer 311 can be prevented and the combination efficiency of the electrons and holes in the active layer 312 can be improved.

The light emitting device according to the embodiment may include a first insulating layer 333. For example, the first insulating layer 333 may be realized by using oxide or nitride. For example, the first insulating layer 333 may include at least one selected from the group consisting of SiO2, SixOy, Si3N4, SixNy, SiOxNy, Al2O3, TiO2, and AlN. The first insulating layer 333 may be disposed in the light emitting structure 310. The first insulating layer 333 may be disposed around the first contact portion 391. The first insulating layer 333 may surround the lateral side of the first contact portion 391. The first insulating layer 333 may be disposed through the first conductive semiconductor layer 311, the active layer 312 and the second conductive semiconductor layer 313.

A second semiconductor layer 331 may be disposed around the first contact portion 391. The second semiconductor layer 331 may be disposed around the lateral side of the first contact portion 391. The second semiconductor layer 331 may be disposed around the first insulating layer 333. The second semiconductor layer 331 may surround the lateral side of the first insulating layer 333. The second semiconductor layer 331 may be disposed under the light emitting structure 310. The second semiconductor layer 331 may be disposed under the second conductive semiconductor layer 313. The second semiconductor layer 331 may make contact with a bottom surface of the second conductive semiconductor layer 313.

The second semiconductor layer 331 may come into schottky-contact with the light emitting structure 310. The second semiconductor layer 331 may come into schottky-contact with the second conductive semiconductor layer 313. In addition, the second semiconductor layer 331 may have the insulating property. For instance, the second semiconductor layer 331 may be implemented to have the specific resistance of 10-1 Ωm or less. For example, the second semiconductor layer 331 may be formed by using a semiconductor material, such as AlInGaN, AlN, or ZnO. In addition, the second semiconductor layer 331 may be prepared as an undoped semiconductor layer. For example, the second semiconductor layer 331 may have a thickness in the range of 10 nm to 1000 nm.

A second insulating layer 340 may be disposed between the first metal layer 335 and the first contact portion 391. The second insulating layer 340 may be formed by using oxide or nitride. For example, the second insulating layer 340 may include at least one selected from the group consisting of SiO2, SixOy, Si3N4, SixNy, SiOxNy, Al2O3, TiO2, and AlN. The second insulating layer 340 may be disposed under the first metal layer 335. The second insulating layer 340 may be disposed under the first insulating layer 333. The second insulating layer 340 may be disposed under the first semiconductor layer 330. The second insulating layer 340 may be disposed under the second semiconductor layer 331.

The second metal layer 350 may be formed under the first contact portion 391. The second metal layer 350 may be electrically connected to the first contact portion 391. A top surface of the second metal layer 350 may come into contact with a bottom surface of the first contact portion 391. The second metal layer 350 may be formed under the second insulating layer 340.

The second metal layer 350 may include at least one of Cu, Ni, Ti, Ti—W, Cr, W, Pt, V, Fe, and Mo. The second metal layer 350 may serve as a diffusion barrier layer. The bonding layer 360 and the conductive support member 370 may be provided under the second metal layer 350.

According to the embodiment, the first electrode 381 may include at least one of the second metal layer 350, the bonding layer 360 and the conductive support member 370. The first electrode 381 may include all of the second metal layer 350, the bonding layer 360 and the conductive support member 370. In addition, the first electrode 381 may selectively include one or two of the second metal layer 350, the bonding layer 360 and the conductive support member 370.

The first electrode 381 may be disposed under the light emitting structure 310. The first electrode 381 may be electrically connected to the first conductive semiconductor layer 311. A bottom surface of the first electrode 381 may be located lower than a bottom surface of the second electrode 382. A top surface of the first electrode 381 may be located lower than the bottom surface of the second electrode 382. A bottom surface of the first contact portion 391 may be located lower than the bottom surface of the second electrode 382.

In addition, the light emitting device according to the embodiment may include a second contact portion 392. The second contact portion 392 may be spaced apart from the light emitting structure 310. The second contact portion 392 may be electrically connected to the second electrode 382. The second contact portion 392 may be electrically connected to the second electrode 382 by passing through the first semiconductor layer 330. The second contact portion 392 may be electrically connected to the first metal layer 335. The second contact portion 392 may come into contact with the top surface of the first metal layer 335. The second contact portion 392 may include at least one of Cr, V, W, Ti, Zn, Ni, Cu, Al, Au, and Mo. The second contact portion 392 may be formed by using a material the same as a material of the first contact portion 391. In addition, the second contact portion 392 may be formed by using a material different from a material of the first contact portion 391.

The light emitting device according to the embodiment may include the second insulating layer 340 disposed between the first metal layer 335 and the second metal layer 350. The second insulating layer 340 may insulate the first metal layer 335 from the second metal layer 350. The second insulating layer 340 may insulate the first metal layer 335 from the conductive support member 370.

A portion of the second insulating layer 340 may surround a peripheral portion of the second metal layer 350. An upper portion of the second insulating layer 340 may make contact with the bottom surface of the first insulating layer 331.

The second insulating layer 340 may be disposed between the first and second electrodes 381 and 382. The second insulating layer 340 may electrically insulate the first electrode 381 from the second electrode 382.

According to the embodiment, power may be applied to the light emitting structure 310 through the first electrode 381 and the second electrode 382. For example, in the light emitting device according to the embodiment, the power may be applied to the light emitting structure 310 through the conductive support member 370 of the first electrode 381 and the second contact portion 392.

Accordingly, power may be supplied to the first conductive semiconductor layer 311 through a scheme of attaching the conductive support member 370 to the bonding pad. According to the embodiment, the second contact portion 392 may be electrically connected to the second electrode 382. Therefore, the second contact portion 392 is connected to a power pad through a wire bonding scheme, thereby supplying power to the second conductive semiconductor layer 313.

According to the light emitting device of the embodiment, power may be supplied to the light emitting structure 310 through the conductive support member 370 and the second contact portion 392. Therefore, according to the embodiment, current concentration can be prevented, and the electrical reliability can be improved.

In the light emitting device according to the embodiment, the through holes 320 are formed from the top surface of the light emitting structure 310. Thus, the manufacturing process can be simplified and the product yield can be improved. In addition, according to the light emitting device of the embodiment, an area of the electrode disposed on the top surface of the light emitting structure 310 can be reduced so that a protective layer may be omitted from the top surface or lateral side of the light emitting structure 310. Therefore, the extraction efficiency of light emitted to the outside from the light emitting structure 310 can be improved.

The light emitting device according to the embodiment includes the first semiconductor layer 330 disposed around the lower portion of the light emitting structure 310. Thus, the light emitting structure 310 and the first semiconductor layer 330 serving as the channel layer or the isolation layer may include the semiconductor layer so that the interfacial crack can be reduced.

Hereinafter, a method of fabricating the light emitting device according to the embodiment will be described with reference to FIGS. 24 to 27. The description that has been described with reference to FIGS. 1 to 7 may be simplified or omitted in order to avoid redundancy.

Figure 24:
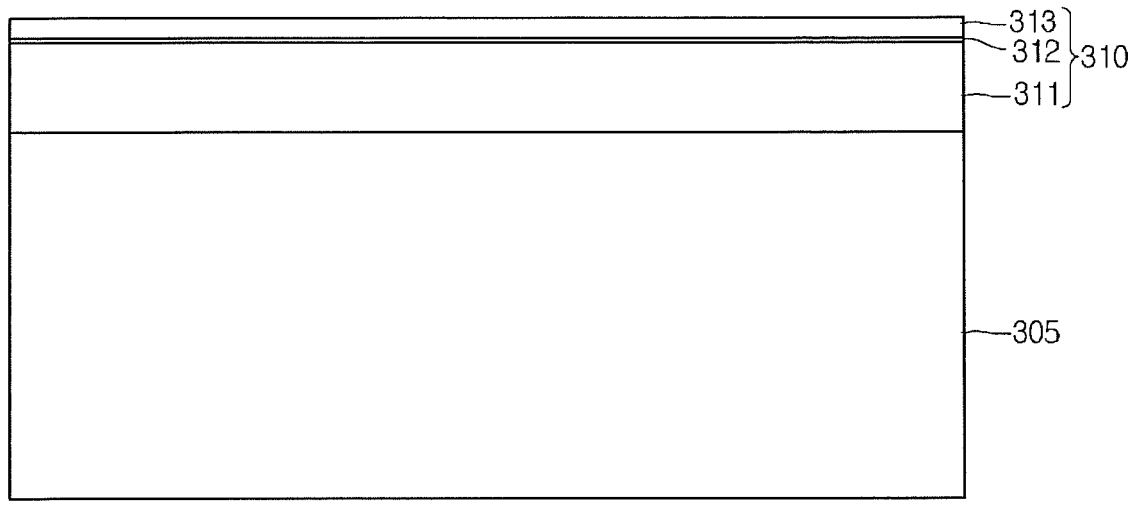
FIGS. 24 to 27 are sectional views showing a method of fabricating a light emitting device according to the embodiment.

According to the method of fabricating the light emitting device of the embodiment, as shown in FIG. 24, the first conductive semiconductor layer 311, the active layer 312, and the second conductive semiconductor layer 313 may be formed on a substrate 305. The first conductive semiconductor layer 311, the active layer 312, and the second conductive semiconductor layer 313 may be defined as the light emitting structure 310.

Figure 25:
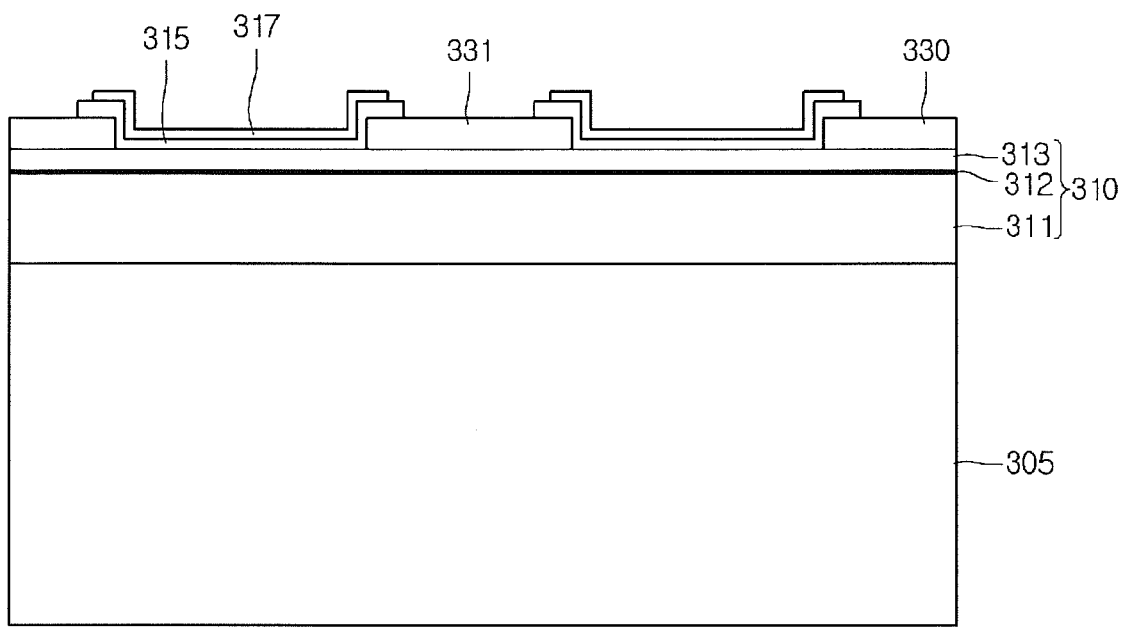

Next, as shown in FIG. 25, the first and second semiconductor layers 310 and 331 may be formed on the light emitting structure 310. The first and second semiconductor layers 310 and 331 may be formed by using the same material or mutually different materials.

For example, the first and second semiconductor layers 310 and 331 may be grown on the light emitting structure 310. The first and second semiconductor layers 310 and 331 may come into schottky-contact with the light emitting structure 330. The first and second semiconductor layers 310 and 331 may come into schottky-contact with the second conductive semiconductor layer 313. In addition, the first and second semiconductor layers 330 and 331 may have the insulating property. For instance, the first and second semiconductor layers 330 and 331 may be implemented to have the specific resistance of 10-1 Ωm or less. For example, the first and second semiconductor layers 330 and 331 may be formed by using a semiconductor material, such as AlInGaN, AlN, or ZnO. In addition, the first and second semiconductor layers 330 and 331 may be prepared as undoped semiconductor layers.

For example, the first semiconductor layer 330 may have a thickness in the range of 10 nm to 1000 nm. Since the first semiconductor layer 330 including the semiconductor material is prepared as the channel layer, the channel layer according to the embodiment may have a slim thickness.

Then, as shown in FIG. 25, the ohmic contact layer 315 and the reflective layer 317 may be formed in the light emitting structure 310.

The ohmic contact layer 315 may be disposed between the reflective layer 317 and the second conductive semiconductor layer 313. The ohmic contact layer 315 may make contact with the second conductive semiconductor layer 313.

Figure 26:
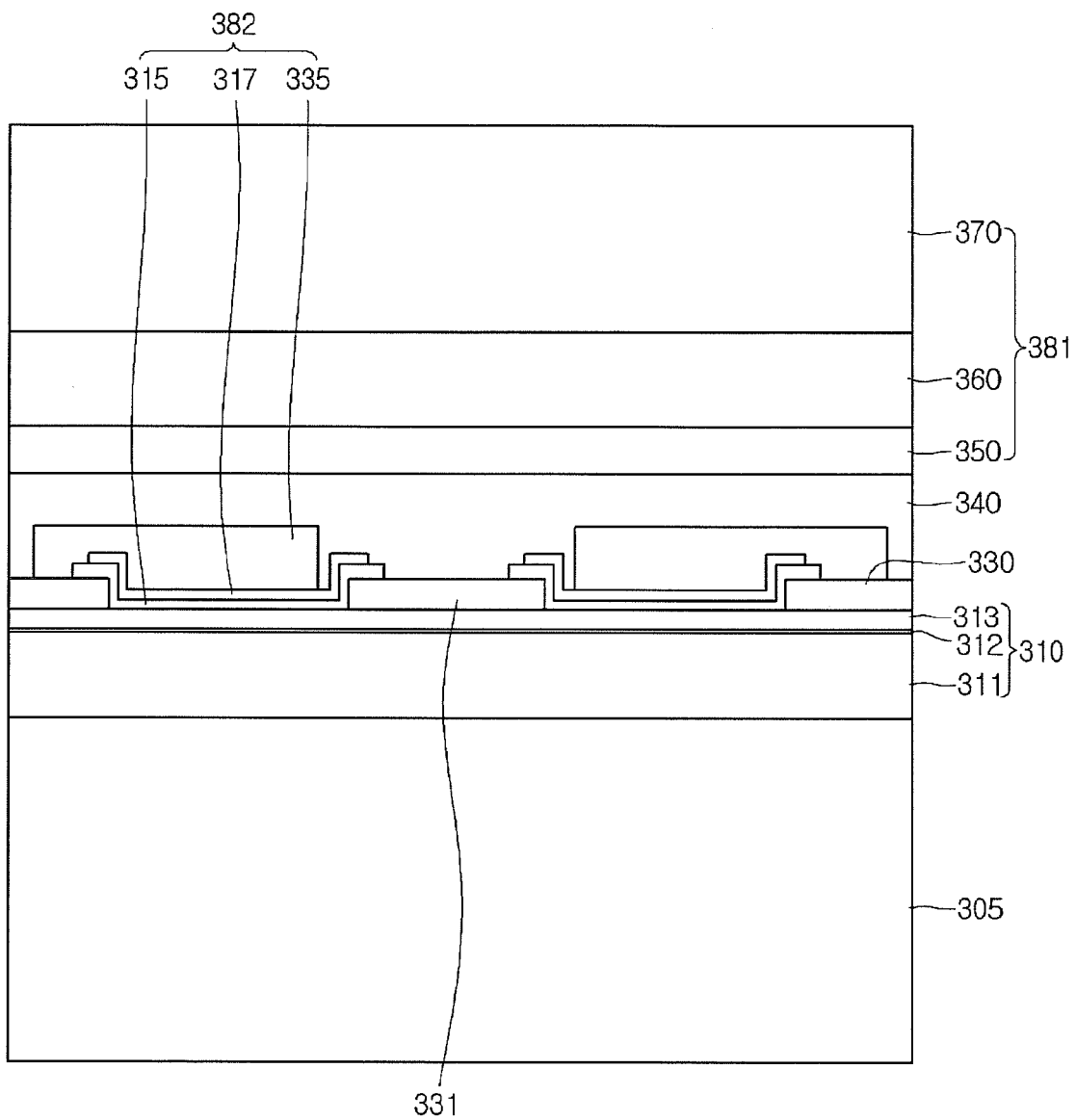

Then, as shown in FIG. 26, the first metal layer 335, the second insulating layer 340, the second metal layer 350, the bonding layer 360, and the conductive support member 370 may be formed on the reflective layer 317.

The first metal layer 335 may include at least one selected from the group consisting of Au, Cu, Ni, Ti, Ti—W, Cr, W, Pt, V, Fe, and Mo. According to the embodiment, the second electrode 382 may include at least one of the reflective layer 317, the ohmic contact layer 315, and the first metal layer 335. For example, the second electrode 382 may include all of the reflective layer 317, the ohmic contact layer 315, and the first metal layer 335 or may selectively include one or two of the reflective layer 317, the ohmic contact layer 315, and the first metal layer 335.

The second insulating layer 340 may be formed on the first metal layer 335. The second insulating layer 340 may be formed by using oxide or nitride. The second metal layer 350 may be formed on the second insulating layer 340. The second metal layer 350 may serve as a diffusion barrier layer. The bonding layer 360 and the conductive support member 370 may be provided on the second metal layer 350.

According to the embodiment, the first electrode 381 may include at least one of the second metal layer 350, the bonding layer 360 and the conductive support member 370. The first electrode 381 may include all of the second metal layer 350, the bonding layer 360 and the conductive support member 370. In addition, the first electrode 381 may selectively include one or two of the second metal layer 350, the bonding layer 360 and the conductive support member 370.

Next, the substrate 305 is removed from the first conductive semiconductor layer 311. According to one example, the substrate 305 may be removed through a laser lift off (LLO) process.

In addition, as shown in FIG. 20, the lateral side of the light emitting structure 310 is etched through an isolation etching process to expose a portion of the first semiconductor layer 330.

Figure 27:
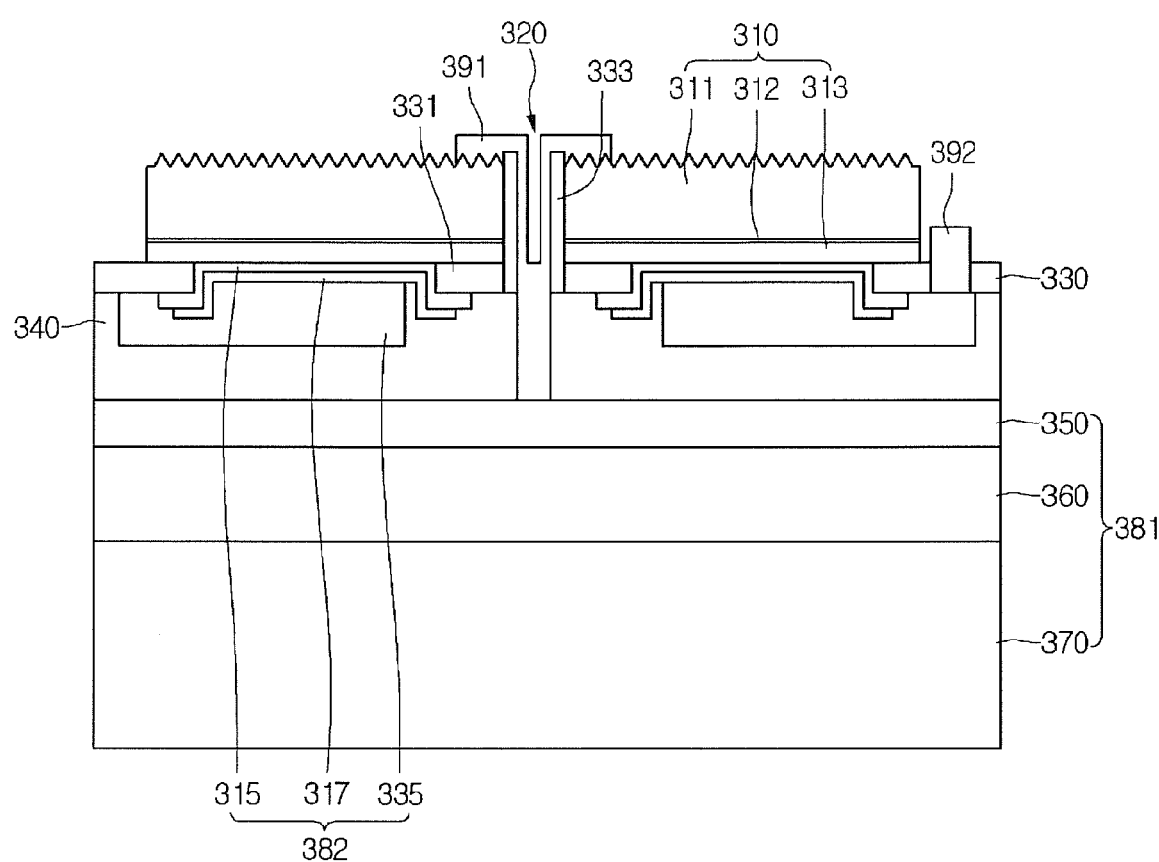

Then, as shown in FIG. 27, the first insulating layer 333 and the first and second contact portions 391 and 392 may be formed.

The first insulating layer 333 may be disposed through the light emitting structure 310. The first insulating layer 333 may come into contact with the second insulating layer 340 by passing through the light emitting structure 310. The first insulating layer 333 may come into contact with the lateral side of the second semiconductor layer 331 by passing through the light emitting structure 310.

The first contact portion 391 may be disposed through the light emitting structure 310. The first contact portion 391 may be disposed through the first conductive semiconductor layer 311, the active layer 312 and the second conductive semiconductor layer 313.

For example, as shown in FIG. 23, a plurality of first contact portions 391 may be formed in the light emitting structure 310. The first contact portion 391 may be disposed along the through holes 320 of the light emitting structure 310. A first region of the first contact portion 391 may be electrically connected to the first electrode 381 and a second region of the first contact portion 391 may make contact with a top surface of the first conductive semiconductor layer 311.

For instance, the first region of the first contact portion 391 may make contact with the second metal layer 350. The first region of the first contact portion 391 may make contact with a top surface of the second metal layer 250.

The first contact portions 391 may be spaced apart from each other on the top surface of the first conductive semiconductor layer 311. Since the first contact portions 391 are distributed on the light emitting structure 310, current applied to the first conductive semiconductor layer 311 may be spread. Thus, the degradation of the first conductive semiconductor layer 311 can be prevented and the combination efficiency of the electrons and holes in the active layer 312 can be improved.

A portion of the first insulating layer 333 may be disposed in the light emitting structure 310. A portion of the first insulating layer 333 may be disposed around the first contact portion 391. For instance, the first insulating layer 333 may surround the first contact portion 391. A portion of the first contact portion 391 may be disposed through the first conductive semiconductor layer 311, the active layer 312 and the second conductive semiconductor layer 313.

In addition, the light emitting device according to the embodiment may include the second contact portion 392. The second contact portion 392 may be spaced apart from the light emitting structure 110. The second contact portion 392 may be electrically connected to the second electrode 382. The second contact portion 392 may be electrically connected to the second electrode 382 by passing through the first semiconductor layer 330. The second contact portion 392 may be electrically connected to the first metal layer 335. The second contact portion 392 may come into contact with the top surface of the first metal layer 335.

Meanwhile, the above fabrication process is illustrative purpose only and may be variously modified according to the designs.

The second electrode 382 according to the embodiment may be disposed under the light emitting structure 310. The second electrode 382 may be electrically connected to the second conductive semiconductor layer 313. The first electrode 381 may be disposed under the light emitting structure 310. The first electrode 381 may be electrically connected to the first conductive semiconductor layer 311. A bottom surface of the first electrode 381 may be located lower than a bottom surface of the second electrode 382.

The second insulating layer 340 may be disposed between the first and second electrodes 381 and 382. The second insulating layer 340 may electrically insulate the first electrode 381 from the second electrode 382.

According to the embodiment, power may be applied to the light emitting structure 310 through the first electrode 381 and the second electrode 382. For example, in the light emitting device according to the embodiment, the power may be applied to the light emitting structure 310 through the conductive support member 370 of the first electrode 381 and the second contact portion 392.

In the light emitting device according to the embodiment, the through holes 320 are formed from the top surface of the light emitting structure 310. Thus, the manufacturing process can be simplified and the product yield can be improved. In addition, according to the light emitting device of the embodiment, an area of the electrode disposed on the top surface of the light emitting structure 310 can be reduced so that a protective layer may be omitted from the top surface or lateral side of the light emitting structure 310. Therefore, the extraction efficiency of light emitted to the outside from the light emitting structure 310 can be improved.

The light emitting device according to the embodiment includes the first semiconductor layer 330 disposed around the lower portion of the light emitting structure 310. Thus, the light emitting structure 310 and the first semiconductor layer 330 serving as the channel layer or the isolation layer may include the semiconductor layer so that the interfacial crack can be reduced.

Figure 28:
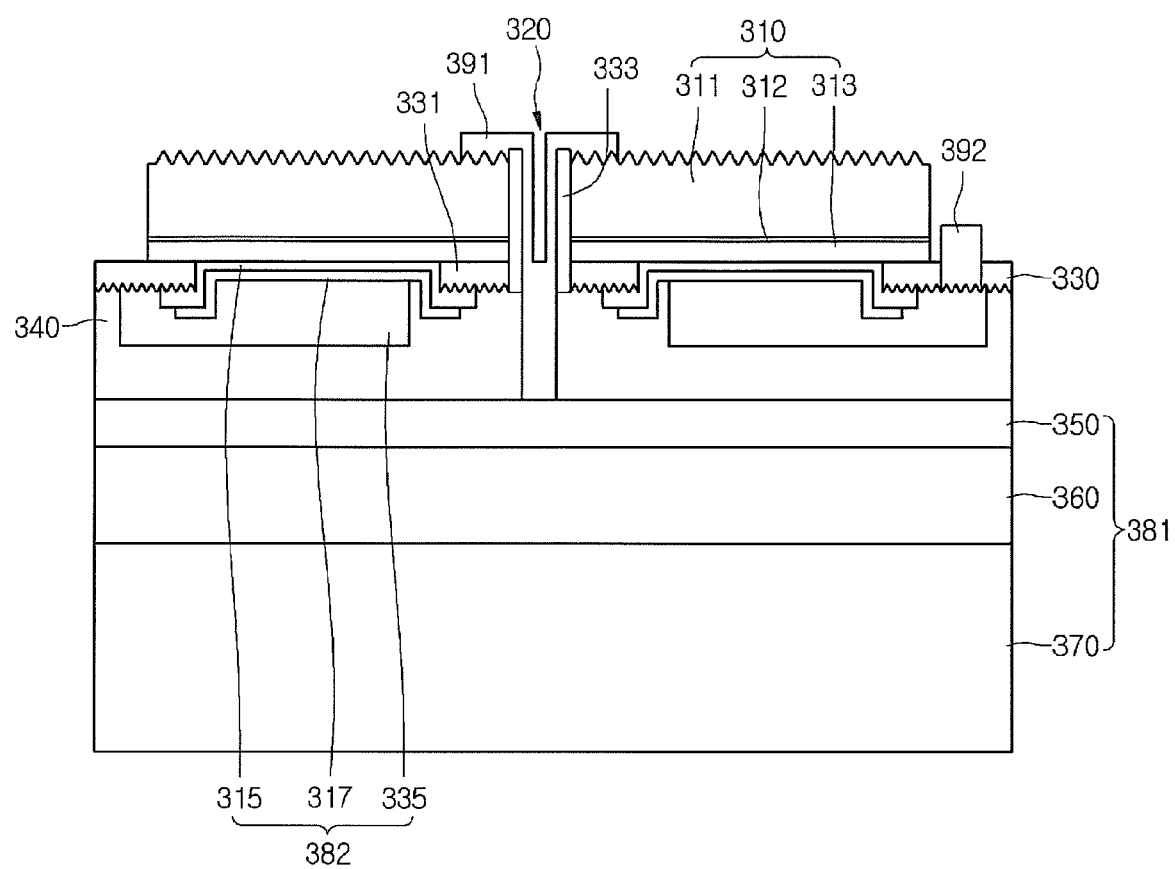
FIGS. 28 and 29 are sectional views showing a light emitting device according to still another embodiment.

FIG. 28 is a sectional view showing another example of a light emitting device according to the embodiment. In the description about the light emitting device shown in FIG. 28, the description that has been described with reference to FIGS. 22 and 23 will be omitted in order to avoid redundancy.

The light emitting device according to the embodiment may include the first semiconductor layer 330 provided around a lower portion of the light emitting structure 310. One end of the first semiconductor layer 330 may be provided under the second conductive semiconductor layer 313. The one end of the first semiconductor layer 330 may make contact with a bottom surface of the second conductive semiconductor layer 313. The one end of the first semiconductor layer 330 may be disposed between the second conductive semiconductor layer 313 and the reflective layer 317. The one end of the first semiconductor layer 330 may be disposed between the second conductive semiconductor layer 313 and the ohmic contact layer 315.

The first semiconductor layer 330 may be exposed at the lower peripheral portion of the light emitting structure 310. The first semiconductor layer 330 may extend outward from the sidewall of the light emitting structure 310. The lateral side of the first semiconductor layer 330 may come into contact with the lateral side of the second electrode 382. The lateral side of the first semiconductor layer 330 may come into contact with the lateral side of the ohmic contact layer 315. A portion of the first semiconductor layer 330 may be disposed on a top surface of the second electrode 382. A portion of the first semiconductor layer 330 may come into contact with a top surface of the first metal layer 335.

The first semiconductor layer 330 may be referred to as an isolation layer. The first semiconductor layer 330 may serve as an etching stopper when an isolation process is performed with respect to the light emitting structure 310 later. In addition, the first semiconductor layer 330 may prevent the electrical characteristic of the light emitting device from being degraded caused by the isolation process.

The first semiconductor layer 330 may come into schottky-contact with the light emitting structure 310. The first semiconductor layer 330 may come into schottky-contact with the second conductive semiconductor layer 313. In addition, the first semiconductor layer 330 may have the insulating property. For instance, the first semiconductor layer 330 may be implemented to have the specific resistance of 10-1 $\Omega$m or less. For example, the first semiconductor layer 330 may be formed by using a semiconductor material, such as AlInGaN, AlN, or ZnO. In addition, the first semiconductor layer 330 may be prepared as an undoped semiconductor layer.

For example, the first semiconductor layer 330 may have a thickness in the range of 10 nm to 1000 nm. Since the first semiconductor layer 330 including the semiconductor material is prepared as the channel layer, the channel layer according to the embodiment may have a slim thickness.

A roughness may be formed at a bottom surface of the first semiconductor layer 330. The interfacial bonding property of the first semiconductor layer 330 can be improved due to the roughness. For example, the roughness may be formed at the first semiconductor layer 330 to have a step difference in the range of 5 nm to 50 nm.

The light emitting device according to the embodiment may include the first contact portion 391. The first contact portion 391 may be disposed through the light emitting structure 310. The first contact portion 391 may be disposed through the first conductive semiconductor layer 311, the active layer 312 and the second conductive semiconductor layer 313.

For example, as shown in FIG. 23, a plurality of first contact portions 391 may be formed in the light emitting structure 310. The first contact portions 391 may be disposed along the through holes 320 of the light emitting structure 310. A first region of the first contact portion 391 may be electrically connected to the first electrode 381 and a second region of the first contact portion 391 may make contact with a top surface of the first conductive semiconductor layer 311. For instance, the first region of the first contact portion 391 may make contact with a second metal layer 350. The first region of the first contact portion 391 may make contact with the top surface of the second metal layer 350. For example, when the light emitting structure 310 is grown into a GaN semiconductor layer, the first contact portion 391 may make contact with an n face of the first conductive semiconductor layer 311.

Although only one first contact portion 391 is illustrated in the light emitting device shown in FIG. 28, the light emitting structure 310 according to the embodiment may be formed with a plurality of first contact portions 391 as shown in FIG. 23 and the first contact portions 391 may be formed in the through holes 320, respectively.

The first contact portions 391 may be spaced apart from each other on the top surface of the first conductive semiconductor layer 311. Since the first contact portions 391 are distributed on the light emitting structure 310, current applied to the first conductive semiconductor layer 311 may be spread. Thus, the degradation of the first conductive semiconductor layer 311 can be prevented and the combination efficiency of the electrons and holes in the active layer 312 can be improved.

The light emitting device according to the embodiment may include a first insulating layer 333. For example, the first insulating layer 333 may be realized by using oxide or nitride. The first insulating layer 333 may be disposed in the light emitting structure 310. The first insulating layer 333 may be disposed around the first contact portion 391. The first insulating layer 333 may surround the lateral side of the first contact portion 391. The first insulating layer 333 may be disposed through the first conductive semiconductor layer 311, the active layer 312 and the second conductive semiconductor layer 313.

A second semiconductor layer 331 may be disposed around the first contact portion 391. The second semiconductor layer 331 may be disposed around the lateral side of the first contact portion 391. The second semiconductor layer 331 may be disposed around the first insulating layer 333. The second semiconductor layer 331 may surround the lateral side of the first insulating layer 333. The second semiconductor layer 331 may be disposed under the light emitting structure 310. The second semiconductor layer 331 may be disposed under the second conductive semiconductor layer 313. The second semiconductor layer 331 may make contact with a bottom surface of the second conductive semiconductor layer 313.

The second semiconductor layer 331 may come into schottky-contact with the light emitting structure 310. The second semiconductor layer 331 may come into schottky-contact with the second conductive semiconductor layer 313. In addition, the second semiconductor layer 331 may have the insulating property. For instance, the second semiconductor layer 331 may be implemented to have the specific resistance of 10-1 Ωm or less. For example, the second semiconductor layer 331 may be formed by using a semiconductor material, such as AlInGaN, AlN, or ZnO. In addition, the second semiconductor layer 331 may be prepared as an undoped semiconductor layer. For example, the second semiconductor layer 331 may have a thickness in the range of 10 nm to 1000 nm.

A roughness may be formed at a bottom surface of the second semiconductor layer 331. The interfacial bonding property of the second semiconductor layer 331 can be improved due to the roughness. For example, the roughness may be formed at the second semiconductor layer 331 to have a step difference in the range of 5 nm to 50 nm.

A second insulating layer 340 may be disposed between the first metal layer 335 and the first contact portion 391. The second insulating layer 340 may be formed by using oxide or nitride. The second insulating layer 340 may be disposed under the first metal layer 335. The second insulating layer 340 may be disposed under the first insulating layer 333. The second insulating layer 340 may be disposed under the first semiconductor layer 330. The second insulating layer 340 may be disposed under the second semiconductor layer 331.

The second metal layer 350 may be formed under the first contact portion 391. The second metal layer 350 may be electrically connected to the first contact portion 391. A top surface of the second metal layer 350 may come into contact with a bottom surface of the first contact portion 391. The second metal layer 350 may be formed under the second insulating layer 340.

The second metal layer 350 may include at least one of Cu, Ni, Ti, Ti—W, Cr, W, Pt, V, Fe, and Mo. The second metal layer 350 may serve as a diffusion barrier layer. The bonding layer 360 and the conductive support member 370 may be provided under the second metal layer 350.

According to the embodiment, the first electrode 381 may include at least one of the second metal layer 350, the bonding layer 360 and the conductive support member 370. The first electrode 381 may include all of the second metal layer 350, the bonding layer 360 and the conductive support member 370. In addition, the first electrode 381 may selectively include one or two of the second metal layer 350, the bonding layer 360 and the conductive support member 370.

The first electrode 381 may be disposed under the light emitting structure 310. The first electrode 381 may be electrically connected to the first conductive semiconductor layer 311. A bottom surface of the first electrode 381 may be located lower than a bottom surface of the second electrode 382. A top surface of the first electrode 381 may be located lower than the bottom surface of the second electrode 382. A bottom surface of the first contact portion 391 may be located lower than the bottom surface of the second electrode 382.

In addition, the light emitting device according to the embodiment may include a second contact portion 392. The second contact portion 392 may be spaced apart from the light emitting structure 310. The second contact portion 392 may be electrically connected to the second electrode 382. The second contact portion 392 may be electrically connected to the second electrode 382 by passing through the first semiconductor layer 330. The second contact portion 392 may be electrically connected to the first metal layer 335. The second contact portion 392 may come into contact with the top surface of the first metal layer 335.

A portion of the second insulating layer 340 may surround a peripheral portion of the second metal layer 350. An upper portion of the second insulating layer 340 may make contact with the bottom surface of the first insulating layer 331.

The second insulating layer 340 may be disposed between the first and second electrodes 381 and 382. The second insulating layer 340 may electrically insulate the first electrode 381 from the second electrode 382.

According to the embodiment, power may be applied to the light emitting structure 310 through the first electrode 381 and the second electrode 382. For example, in the light emitting device according to the embodiment, the power may be applied to the light emitting structure 310 through the conductive support member 370 of the first electrode 381 and the second contact portion 392.

In the light emitting device according to the embodiment, the through holes 320 are formed from the top surface of the light emitting structure 310. Thus, the manufacturing process can be simplified and the product yield can be improved. In addition, according to the light emitting device of the embodiment, an area of the electrode disposed on the top surface of the light emitting structure 310 can be reduced so that a protective layer may be omitted from the top surface or lateral side of the light emitting structure 310. Therefore, the extraction efficiency of light emitted to the outside from the light emitting structure 310 can be improved.

The light emitting device according to the embodiment includes the first semiconductor layer 330 disposed around the lower portion of the light emitting structure 310. Thus, the light emitting structure 310 and the first semiconductor layer 330 serving as the channel layer or the isolation layer may include the semiconductor layer so that the interfacial crack can be reduced.

Figure 29:
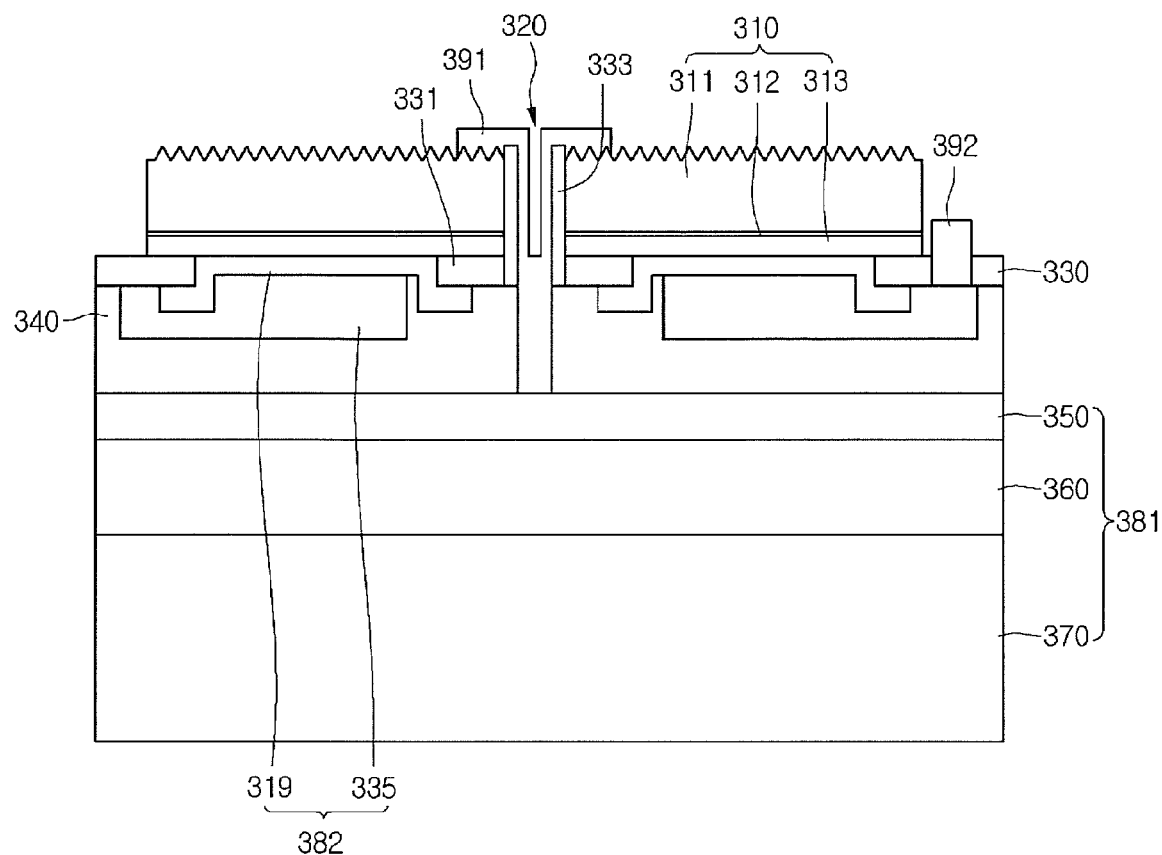

FIG. 29 is a sectional view showing another example of a light emitting device according to the embodiment. In the following description about the light emitting device shown in FIG. 29, components and structures the same as those described with reference to FIGS. 22 and 23 will be omitted in order to avoid redundancy.

According to the light emitting device of the embodiment, an ohmic reflective layer 319 may be provided under the light emitting structure 310. The ohmic reflective layer 319 may be realized such that the ohmic reflective layer 319 may serve as both of the reflective layer 317 and the ohmic contact layer 315. Accordingly, the ohmic reflective layer 319 may make ohmic-contact with the second conductive semiconductor layer 313, and reflect the light incident thereto from the light emitting structure 310.

In this case, the ohmic reflective layer 319 may include multiple layers. For example, the ohmic reflective layer 319 may have a structure in which an Ag layer and a Ni layer are alternately formed, or may include a Ni/Ag/Ni layer, a Ti layer, or a Pt layer.

According to the light emitting device of the embodiment, the conductive support member 370 provided under the ohmic reflective layer 319 may be electrically connected to the first conductive semiconductor layer 311 provided on the ohmic reflective layer 319.

The second electrode 382 according to the embodiment may include at least one of the ohmic reflective layer 319 and the first metal layer 335. In the light emitting device according to the embodiment, the conductive support member 370 provided under the second electrode 382 may be electrically connected to the first conductive semiconductor layer 311 provided on the second electrode 382 through the first contact portion 391.

The light emitting device according to the embodiment may include the first semiconductor layer 330 provided around a lower portion of the light emitting structure 310. One end of the first semiconductor layer 330 may be provided under the second conductive semiconductor layer 313. The one end of the first semiconductor layer 330 may make contact with a bottom surface of the second conductive semiconductor layer 313. The one end of the first semiconductor layer 330 may be disposed between the second conductive semiconductor layer 313 and the ohmic reflective layer 319.

The first semiconductor layer 330 may be exposed at the lower peripheral portion of the light emitting structure 310. The first semiconductor layer 330 may extend outward from the sidewall of the light emitting structure 310. The lateral side of the first semiconductor layer 330 may come into contact with the lateral side of the second electrode 382. The lateral side of the first semiconductor layer 330 may come into contact with the lateral side of the ohmic reflective layer 319. A portion of the first semiconductor layer 330 may be disposed on a top surface of the second electrode 382. A portion of the first semiconductor layer 330 may come into contact with a top surface of the first metal layer 335.

Although only one first contact portion 391 is illustrated in the light emitting device shown in FIG. 22, the light emitting structure 310 according to the embodiment may be formed with a plurality of first contact portions 391 as shown in FIG. 23 and the first contact portions 391 may be formed in the through holes 320, respectively.

The first contact portions 391 may be spaced apart from each other on the top surface of the first conductive semiconductor layer 311. Since the first contact portions 391 are distributed on the light emitting structure 310, current applied to the first conductive semiconductor layer 311 may be spread. Thus, the degradation of the first conductive semiconductor layer 311 can be prevented and the combination efficiency of the electrons and holes in the active layer 312 can be improved.

The light emitting device according to the embodiment may include a first insulating layer 333. For example, the first insulating layer 333 may be realized by using oxide or nitride. The first insulating layer 333 may be disposed in the light emitting structure 310. The first insulating layer 333 may be disposed around the first contact portion 391. The first insulating layer 333 may surround the lateral side of the first contact portion 391. The first insulating layer 333 may be disposed through the first conductive semiconductor layer 311, the active layer 312 and the second conductive semiconductor layer 313.

A second semiconductor layer 331 may be disposed around the first contact portion 391. The second semiconductor layer 331 may be disposed around the lateral side of the first contact portion 391. The second semiconductor layer 331 may be disposed around the first insulating layer 333. The second semiconductor layer 331 may surround the lateral side of the first insulating layer 333. The second semiconductor layer 331 may be disposed under the light emitting structure 310. The second semiconductor layer 331 may be disposed under the second conductive semiconductor layer 313. The second semiconductor layer 331 may make contact with a bottom surface of the second conductive semiconductor layer 313.

A second insulating layer 340 may be disposed between the first metal layer 335 and the first contact portion 391. The second insulating layer 340 may be formed by using oxide or nitride. For example, the second insulating layer 340 may be disposed under the first metal layer 335. The second insulating layer 340 may be disposed under the first insulating layer 333. The second insulating layer 340 may be disposed under the first semiconductor layer 330. The second insulating layer 340 may be disposed under the second semiconductor layer 331.

The second metal layer 350 may be formed under the first contact portion 391. The second metal layer 350 may be electrically connected to the first contact portion 391. A top surface of the second metal layer 350 may come into contact with a bottom surface of the first contact portion 391. The second metal layer 350 may be formed under the second insulating layer 340.

The second metal layer 350 may include at least one of Cu, Ni, Ti, Ti—W, Cr, W, Pt, V, Fe, and Mo. The second metal layer 350 may serve as a diffusion barrier layer. The bonding layer 360 and the conductive support member 370 may be provided under the second metal layer 350.

According to the embodiment, the first electrode 381 may include at least one of the second metal layer 350, the bonding layer 360 and the conductive support member 370. The first electrode 381 may include all of the second metal layer 350, the bonding layer 360 and the conductive support member 370. In addition, the first electrode 381 may selectively include one or two of the second metal layer 350, the bonding layer 360 and the conductive support member 370.

The first electrode 381 may be disposed under the light emitting structure 310. The first electrode 381 may be electrically connected to the first conductive semiconductor layer 311. A bottom surface of the first electrode 381 may be located lower than a bottom surface of the second electrode 382. A top surface of the first electrode 381 may be located lower than the bottom surface of the second electrode 382. A bottom surface of the first contact portion 391 may be located lower than the bottom surface of the second electrode 382.

In addition, the light emitting device according to the embodiment may include a second contact portion 392. The second contact portion 392 may be spaced apart from the light emitting structure 310. The second contact portion 392 may be electrically connected to the second electrode 382. The second contact portion 392 may be electrically connected to the second electrode 382 by passing through the first semiconductor layer 330. The second contact portion 392 may be electrically connected to the first metal layer 335. The second contact portion 392 may come into contact with the top surface of the first metal layer 335.

The light emitting device according to the embodiment may include the second insulating layer 340 disposed between the first metal layer 335 and the second metal layer 350. The second insulating layer 340 may insulate the first metal layer 335 from the second metal layer 350. The second insulating layer 340 may insulate the first metal layer 335 from the conductive support member 370. For example, the second insulating layer 340 may be formed by using oxide or nitride.

A portion of the second insulating layer 340 may surround a peripheral portion of the second metal layer 350. An upper portion of the second insulating layer 340 may make contact with the bottom surface of the first insulating layer 331.

The second insulating layer 340 may be disposed between the first and second electrodes 381 and 382. The second insulating layer 340 may electrically insulate the first electrode 381 from the second electrode 382.

According to the embodiment, power may be applied to the light emitting structure 310 through the first electrode 381 and the second electrode 382. For example, in the light emitting device according to the embodiment, the power may be applied to the light emitting structure 310 through the conductive support member 370 of the first electrode 381 and the second contact portion 392.

In the light emitting device according to the embodiment, the through holes 320 are formed from the top surface of the light emitting structure 310. Thus, the manufacturing process can be simplified and the product yield can be improved. In addition, according to the light emitting device of the embodiment, an area of the electrode disposed on the top surface of the light emitting structure 310 can be reduced so that a protective layer may be omitted from the top surface or lateral side of the light emitting structure 310. Therefore, the extraction efficiency of light emitted to the outside from the light emitting structure 310 can be improved.

The light emitting device according to the embodiment includes the first semiconductor layer 330 disposed around the lower portion of the light emitting structure 310. Thus, the light emitting structure 310 and the first semiconductor layer 330 serving as the channel layer or the isolation layer may include the semiconductor layer so that the interfacial crack can be reduced.

Figure 30:
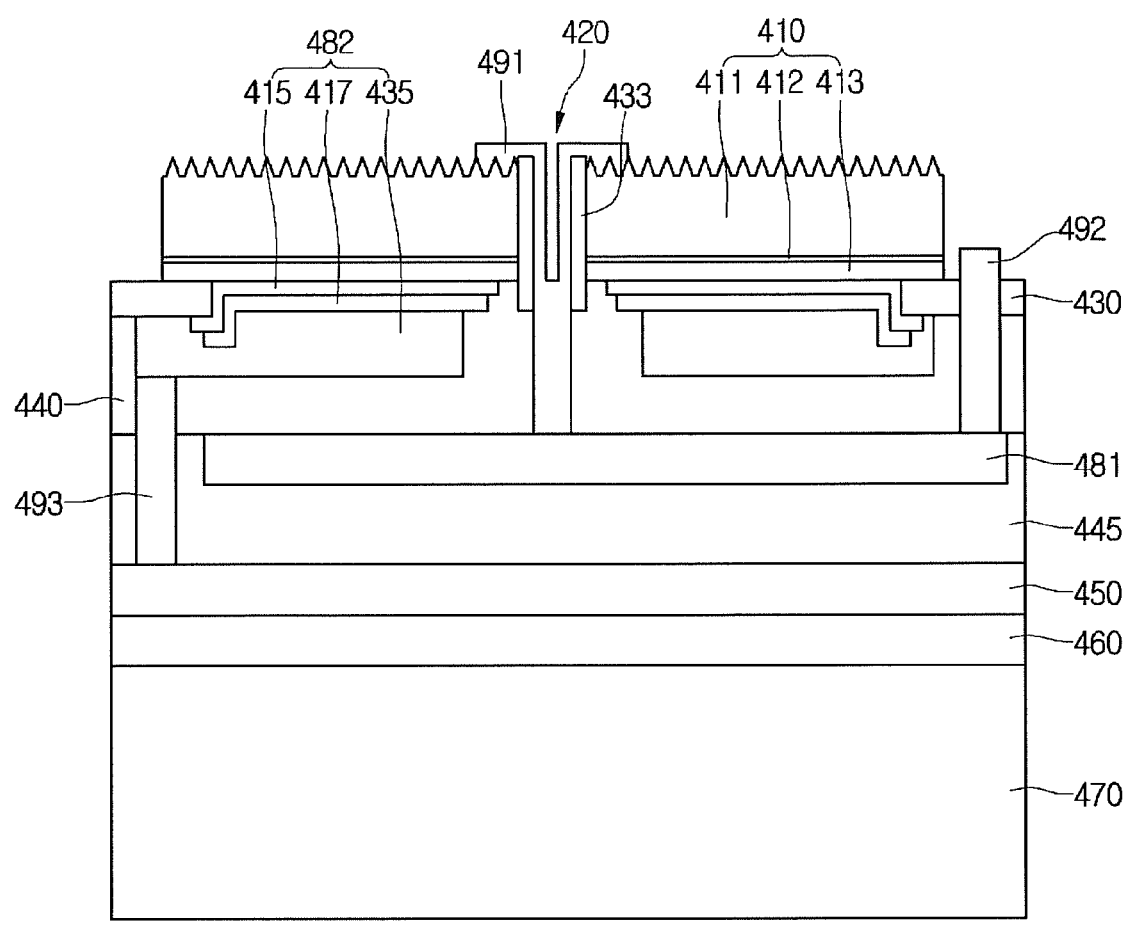
FIG. 30 is a sectional view showing a light emitting device according to still another embodiment.
Figure 31:
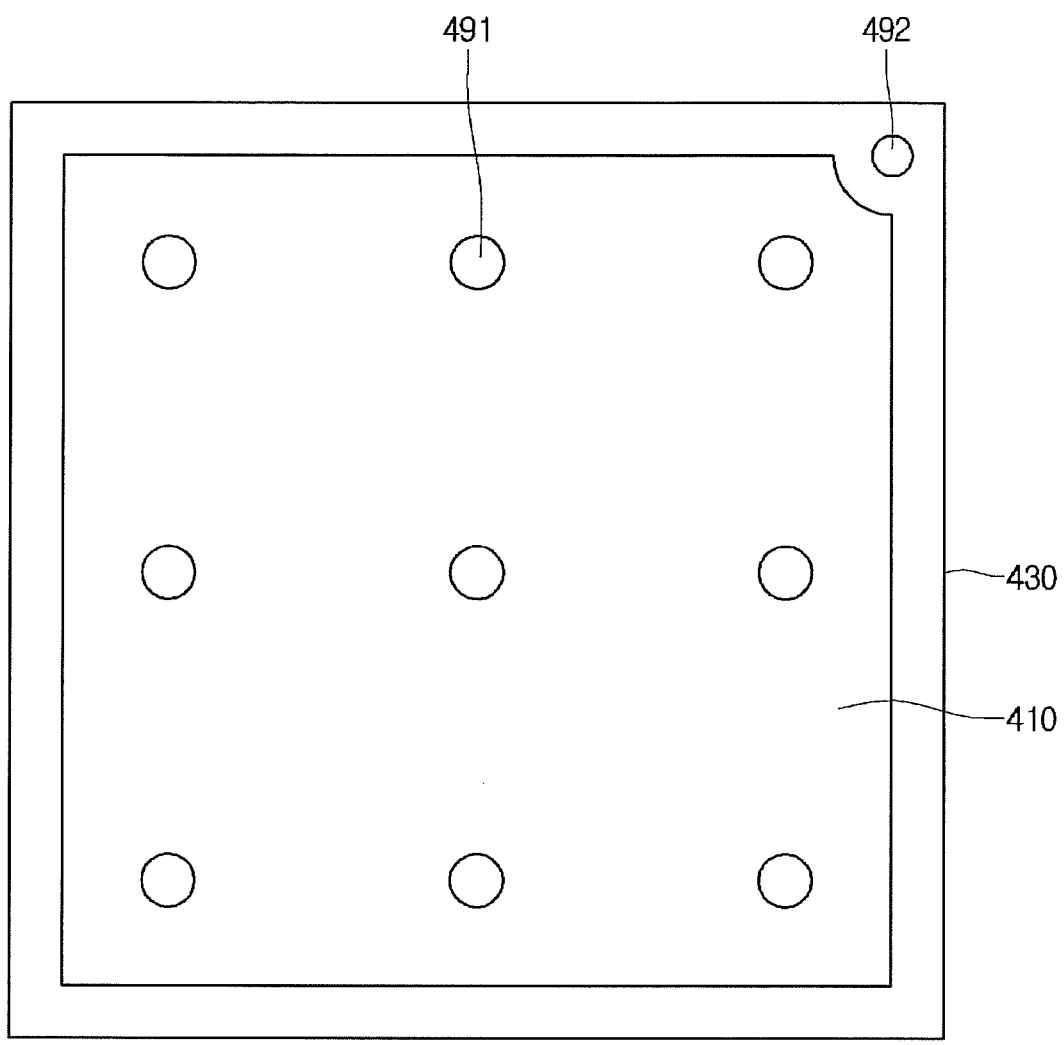
FIG. 31 is a view showing an arrangement of a first contact portion of a light emitting device shown in FIG. 30.

FIG. 30 is a sectional view showing a light emitting device according to still another embodiment and FIG. 31 is a view showing an arrangement of a first contact portion of the light emitting device shown in FIG. 30. The description that has been described with reference to FIGS. 1 to 7 may be simplified or omitted in order to avoid redundancy.

As shown in FIGS. 30 and 31, the light emitting device according to the embodiment may include a light emitting structure 410, a first electrode 481, a second electrode 482, a conductive support member 470, a first contact portion 491, a second contact portion 492 and a third contact portion 493.

The light emitting structure 410 may include a first conductive semiconductor layer 411, an active layer 412, and a second conductive semiconductor layer 413. The active layer 412 may be disposed between the first conductive semiconductor layer 411 and the second conductive semiconductor layer 413. The active layer 412 may be provided under the first conductive semiconductor layer 411, and the second conductive semiconductor layer 413 may be provided under the active layer 412.

The light emitting device according to the embodiment may include a reflective layer 417. The reflective layer 417 may be electrically connected to the second conductive semiconductor layer 413. The reflective layer 417 may be disposed under the light emitting structure 410. The reflective layer 417 may be disposed under the second conductive semiconductor layer 413. The reflective layer 417 may reflect light incident thereto from the light emitting structure 410 to increase the quantity of light extracted to an outside.

The light emitting device according to the embodiment may include an ohmic contact layer 415 disposed between the reflective layer 417 and the second conductive semiconductor layer 413. The ohmic contact layer 415 may make contact with the second conductive semiconductor layer 413. The ohmic contact layer 415 may make ohmic contact with the light emitting structure 410. The ohmic contact layer 415 may include a region that makes ohmic-contact with the light emitting structure 410. The ohmic contact layer 415 may include a region that makes ohmic-contact with the second conductive semiconductor layer 413.

The light emitting device according to the embodiment may include a first metal layer 435 provided under the reflective layer 417. The first metal layer 435 may include at least one of Au, Cu, Ni, Ti, Ti—W, Cr, W, Pt, V, Fe, and Mo.

According to the embodiment, the second electrode 482 may include at least one of the reflective layer 417, the ohmic contact layer 415, and the first metal layer 435. For example, the second electrode 482 may include all of the reflective layer 417, the first metal layer 435, and the ohmic contact layer 415, or may include one or two selected from the reflective layer 417, the first metal layer 435, and the ohmic contact layer 415.

The second electrode 482 according to the embodiment may be disposed under the light emitting structure 410. The second electrode 482 may be electrically connected to the second conductive semiconductor layer 413.

The light emitting device according to the embodiment may include a channel layer 430 provided around a lower portion of the light emitting structure 410. A portion of the channel layer 430 may be provided under the second conductive semiconductor layer 413. A portion of the channel layer 430 may make contact with a bottom surface of the second conductive semiconductor layer 413. A portion of the channel layer 430 may be disposed between the second conductive semiconductor layer 413 and the reflective layer 417. A portion of the channel layer 430 may be disposed between the second conductive semiconductor layer 413 and the ohmic contact layer 415.

The light emitting device according to the embodiment may include the first contact portion 491. The first contact portion 491 may be disposed through the light emitting structure 410. The first contact portion 491 may be disposed through the first conductive semiconductor layer 411, the active layer 412 and the second conductive semiconductor layer 413.

For example, as shown in FIG. 31, a plurality of contact portions 491 may be formed in the light emitting structure 410. The first contact portions 491 may be disposed along the through holes 420 of the light emitting structure 410. A first region of the first contact portion 491 may be electrically connected to the first electrode 481 and a second region of the first contact portion 491 may make contact with a top surface of the first conductive semiconductor layer 411. For instance, the first region of the first contact portion 491 may make contact with the first electrode 481. The first region of the first contact portion 491 may make contact with a top surface of the first electrode 481. When the light emitting structure 410 is grown into a GaN semiconductor layer, the first contact portion 491 may make contact with an n face of the first conductive semiconductor layer 411.

Although only one first contact portion 491 is illustrated in the light emitting device shown in FIG. 30, the light emitting structure 410 according to the embodiment may be formed with a plurality of first contact portions 491 as shown in FIG. 31 and the first contact portions 491 may be formed in the through holes 420, respectively.

The light emitting device according to the embodiment may include a first insulating layer 433. For example, the first insulating layer 433 may be realized by using oxide or nitride. The first insulating layer 433 may be disposed in the light emitting structure 410. The first insulating layer 433 may be disposed around the first contact portion 491. The first insulating layer 433 may surround the lateral side of the first contact portion 491. The first insulating layer 433 may be disposed through the first conductive semiconductor layer 411, the active layer 412 and the second conductive semiconductor layer 413. A bottom surface of the first insulating layer 433 may be located lower than a bottom surface of the second conductive semiconductor layer 413.

A second insulating layer 440 may be disposed between the first metal layer 435 and the first contact portion 491. The second insulating layer 440 may be formed by using oxide or nitride. The second insulating layer 440 may be disposed under the first metal layer 435. The second insulating layer 440 may be disposed under the first insulating layer 433. The second insulating layer 440 may be disposed under the channel layer 430.

The first electrode 481 may be disposed under the first contact portion 491. The first electrode 481 may include at least one of Au, Cu, Ni, Ti, Ti—W, Cr, W, Pt, V, Fe, and Mo. For example, a bottom surface of the first contact portion 491 may be arranged on the same plane with a top surface of the first electrode 481. The bottom surface of the first contact portion 491 may be located lower than a bottom surface of the second electrode 482. The top surface of the first electrode 481 may be located lower than the bottom surface of the second electrode 482. The second insulating layer 440 may be disposed between the first and second electrodes 481 and 482.

The light emitting device according to the embodiment may include a third insulating layer 445 disposed under the first electrode 481. The third insulating layer 445 may be formed by using oxide or nitride.

A second metal layer 450 may be disposed under the third insulating layer 445. The second metal layer 450 may be electrically connected to the second electrode 482. The second metal layer 450 may be electrically connected to the first metal layer 435. The third contact portion 493 may be disposed between the second metal layer 450 and the second electrode 482. The second metal layer 450 may be electrically connected to the second electrode 482 through the third contact portion 493. The second metal layer 450 may be electrically connected to the first metal layer 435 through the third contact portion 493.

A top surface of the third contact portion 493 may be located higher than a top surface of the first electrode 481. A bottom surface of the third contact portion 493 may be located lower than a bottom surface of the first electrode 481.

The second metal layer 450 may include at least one of Au, Cu, Ni, Ti, Ti—W, Cr, W, Pt, V, Fe, and Mo. The second metal layer 450 may serve as a diffusion barrier layer. The bonding layer 460 and the conductive support member 470 may be provided under the second metal layer 450. The conductive support member 470 may be disposed under the first electrode 481. The third contact portion 493 may be electrically connected to the second electrode 482 and the conductive support member 470.

The first electrode 481 may be disposed under the light emitting structure 410. The first electrode 481 may be electrically connected to the first conductive semiconductor layer 411. A bottom surface of the first electrode 481 may be located lower than a bottom surface of the second electrode 482. A top surface of the first electrode 481 may be located lower than the bottom surface of the second electrode 482. A bottom surface of the first contact portion 491 may be located lower than the bottom surface of the second electrode 482.

In addition, the light emitting device according to the embodiment may include a second contact portion 492. The second contact portion 492 may be spaced apart from the light emitting structure 410. The second contact portion 492 may be exposed at a lower peripheral portion of the light emitting structure 410. The second contact portion 492 may be electrically connected to the first electrode 481. The second contact portion 492 may be electrically connected to the first electrode 481 by passing through the channel layer 430. For instance, a bottom surface of the second contact portion 492 may come into contact with the top surface of the first electrode 481. The second contact portion 492 may include at least one of Cr, V, W, Ti, Zn, Ni, Cu, Al, Au, and Mo. The second contact portion 492 may be formed by using a material the same as a material of the first contact portion 491. In addition, the second contact portion 492 may be formed by using a material different from a material of the first contact portion 491.

The light emitting device according to the embodiment may include the second insulating layer 440 disposed between the first metal layer 435 and the second metal layer 450. A portion of the second insulating layer 440 may surround a peripheral portion of the first contact portion 491. An upper portion of the second insulating layer 440 may make contact with the bottom surface of the first insulating layer 431. A portion of the second insulating layer 440 may surround a peripheral portion of the third contact portion 493. The second insulating layer 440 may be disposed between the first and second electrodes 481 and 482. The second insulating layer 440 may electrically insulate the first electrode 481 from the second electrode 482.

According to the embodiment, power may be applied to the light emitting structure 410 through the first electrode 481 and the second electrode 482. For example, in the light emitting device according to the embodiment, the power may be applied to the light emitting structure 410 through the second contact portion 492 electrically connected to the first electrode 481 and the conductive support member 470 electrically connected to the second electrode 482.

In the light emitting device according to the embodiment, the through holes 420 are formed from the top surface of the light emitting structure 410. Thus, the manufacturing process can be simplified and the product yield can be improved. In addition, according to the light emitting device of the embodiment, an area of the electrode disposed on the top surface of the light emitting structure 410 can be reduced so that a protective layer may be omitted from the top surface or lateral side of the light emitting structure 410. Therefore, the extraction efficiency of light emitted to the outside from the light emitting structure 410 can be improved.

Meanwhile, according to the embodiment, a plurality of second contact portions 492 and third contact portions 493 may be provided. In this case, the second contact portions 492 may be electrically connected to the first electrode 481, respectively. The second contact portions 492 may come into contact with the first electrode 481. In addition, the third contact portions 493 may be electrically connected to the second electrode 482, respectively. The third contact portions 493 may come into contact with the second electrode 482. Further, the third contact portions 493 may come into contact with at least one of the second metal layer 450, the bonding layer 460 and the conductive support member 470.

Hereinafter, a method of fabricating the light emitting device according to the embodiment will be described with reference to FIGS. 32 to 35. The description that has been described with reference to FIGS. 1 to 7 may be simplified or omitted in order to avoid redundancy.

Figure 32:
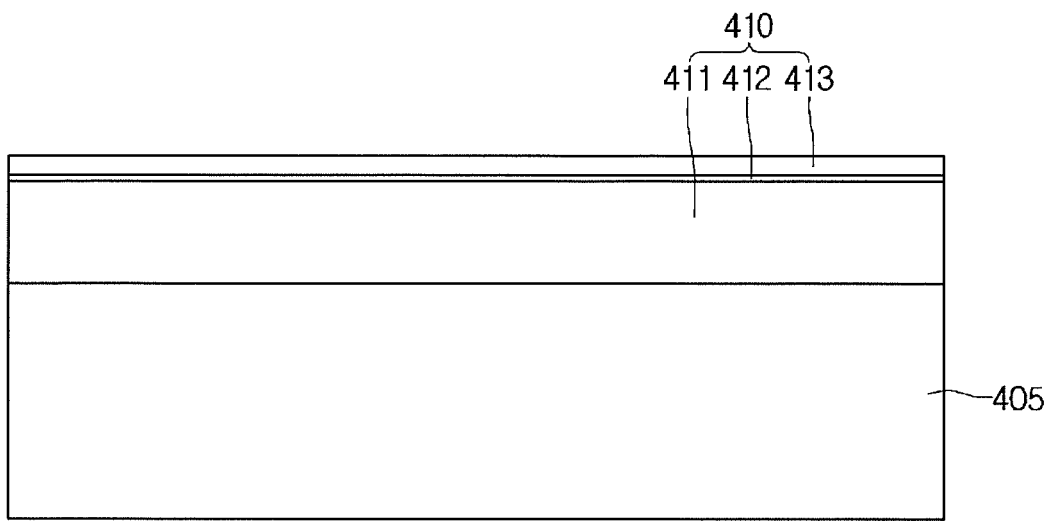
FIGS. 32 to 35 are sectional views showing a method of fabricating a light emitting device according to the embodiment.

According to the method of fabricating the light emitting device of the embodiment, as shown in FIG. 32, the first conductive semiconductor layer 411, the active layer 412, and the second conductive semiconductor layer 413 may be formed on a substrate 405. The first conductive semiconductor layer 411, the active layer 412, and the second conductive semiconductor layer 413 may be defined as the light emitting structure 410.

Figure 33:
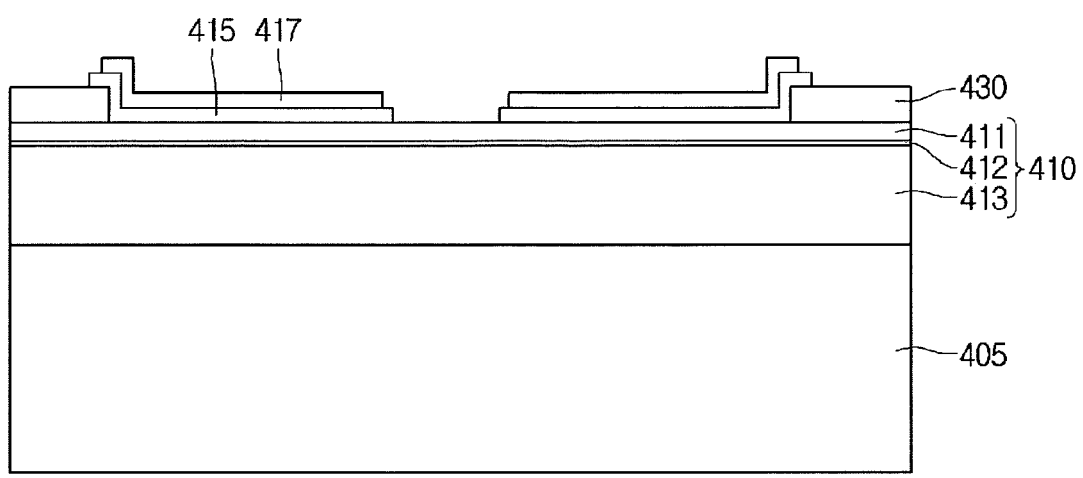

Next, as shown in FIG. 33, the channel layer 430 may be formed on the light emitting structure 410. The channel layer 430 may be formed by using an insulating material. For instance, the channel layer 430 may be formed by using oxide or nitride.

Then, as shown in FIG. 33, the ohmic contact layer 415 and the reflective layer 417 may be formed in the light emitting structure 410.

The ohmic contact layer 415 may be disposed between the reflective layer 417 and the second conductive semiconductor layer 413. The ohmic contact layer 415 may make contact with the second conductive semiconductor layer 413.

The ohmic contact layer 415 may make ohmic-contact with the light emitting structure 410. The reflective layer 417 may be electrically connected to the second conductive semiconductor layer 413. The ohmic contact layer 415 may include a region that makes ohmic-contact with the light emitting structure 410.

Figure 34:
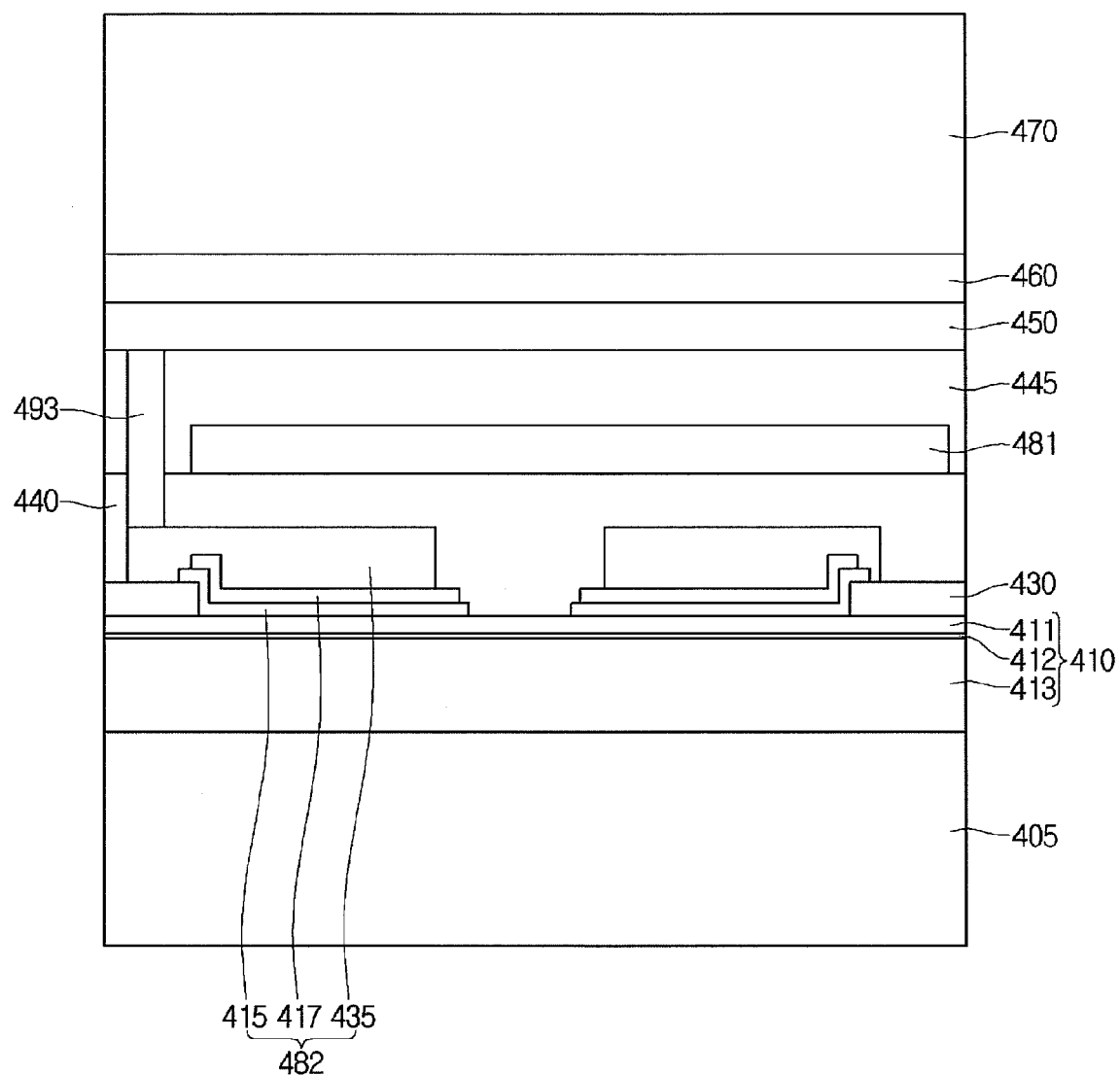

Then, as shown in FIG. 34, the first metal layer 435, the second insulating layer 440, the first electrode 481, the third insulating layer 445, the third contact portion 493, the second metal layer 450, the bonding layer 460, and the conductive support member 470 may be formed on the reflective layer 417.

The first metal layer 435 may include at least one selected from the group consisting of Au, Cu, Ni, Ti, Ti—W, Cr, W, Pt, V, Fe, and Mo. According to the embodiment, the second electrode 482 may include at least one of the reflective layer 417, the ohmic contact layer 415, and the first metal layer 435. For example, the second electrode 482 may include all of the reflective layer 417, the ohmic contact layer 415, and the first metal layer 435 or may selectively include one or two of the reflective layer 417, the ohmic contact layer 415, and the first metal layer 435.

The second insulating layer 440 may be formed on the first metal layer 435. The second insulating layer 440 may be formed by using oxide or nitride.

The first electrode 481 may be formed on the second insulating layer 440. The first electrode 481 may include at least one of Au, Cu, Ni, Ti, Ti—W, Cr, W, Pt, V, Fe, and Mo.

The third insulating layer 445 may be formed on the first electrode 481. The third insulating layer 445 may be formed by using oxide or nitride.

Then, the third contact portion 493 may be disposed through the second insulating layer 440 and the third insulating layer 445. The third contact portion 493 may come into contact with the second electrode 482. The third contact portion 493 may come into contact with the first metal layer 435.

The second metal layer 450 may be formed on the third contact portion 493 and the third insulating layer 445. The second metal layer 450 may include at least one of Cu, Ni, Ti, Ti—W, Cr, W, Pt, V, Fe, and Mo. The second metal layer 450 may serve as a diffusion barrier layer. The bonding layer 460 and the conductive support member 470 may be provided on the second metal layer 450.

Next, the substrate 405 is removed from the first conductive semiconductor layer 411. According to one example, the substrate 405 may be removed through a laser lift off (LLO) process.

Figure 35:
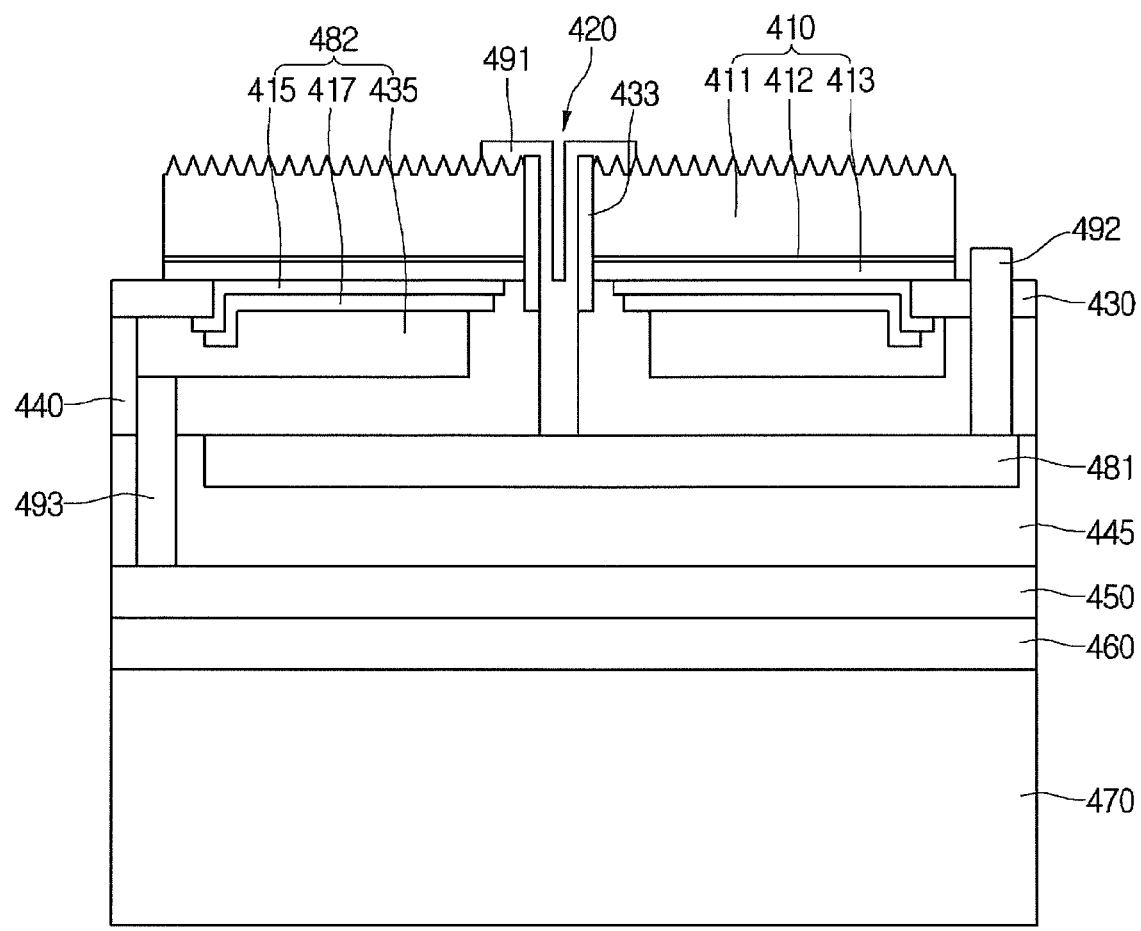

In addition, as shown in FIG. 35, the lateral side of the light emitting structure 410 is etched through an isolation etching process to expose a portion of the channel layer 430.

Then, as shown in FIG. 35, the first insulating layer 433, the first contact portion 491 and the second contact portion 492 may be formed.

The first insulating layer 433 may be disposed through the light emitting structure 410. The first insulating layer 433 may come into contact with the second insulating layer 440 by passing through the light emitting structure 410.

The first contact portion 491 may be disposed through the light emitting structure 410. The first contact portion 491 may be disposed through the first conductive semiconductor layer 411, the active layer 412 and the second conductive semiconductor layer 413.

For example, as shown in FIG. 31, a plurality of first contact portions 491 may be formed in the light emitting structure 410. The first contact portions 491 may be disposed along the through holes 420 of the light emitting structure 410. A first region of the first contact portion 491 may be electrically connected to the first electrode 481 and a second region of the first contact portion 491 may make contact with a top surface of the first conductive semiconductor layer 411. For instance, the first region of the first contact portion 491 may make contact with the first electrode 481. The first region of the first contact portion 491 may make contact with a top surface of the first electrode 481.

The first contact portions 491 may be spaced apart from each other on the top surface of the first conductive semiconductor layer 411. Since the first contact portions 491 are distributed on the light emitting structure 410, current applied to the first conductive semiconductor layer 411 may be spread. Thus, the degradation of the first conductive semiconductor layer 411 can be prevented and the combination efficiency of the electrons and holes in the active layer 412 can be improved.

The light emitting device according to the embodiment may include a first insulating layer 433. For example, the first insulating layer 433 may be realized by using oxide or nitride. The first insulating layer 433 may be disposed in the light emitting structure 410. The first insulating layer 433 may be disposed around the first contact portion 491. The first insulating layer 433 may surround the lateral side of the first contact portion 491. The first insulating layer 433 may be disposed through the first conductive semiconductor layer 411, the active layer 412 and the second conductive semiconductor layer 413. A bottom surface of the first insulating layer 433 may be located lower than a bottom surface of the second conductive semiconductor layer 413.

The first electrode 481 may be disposed under the first contact portion 491. For example, a bottom surface of the first contact portion 491 may be arranged on the same plane with a top surface of the first electrode 481. The bottom surface of the first contact portion 491 may be located lower than a bottom surface of the second electrode 482. The top surface of the first electrode 481 may be located lower than the bottom surface of the second electrode 482. The second insulating layer 440 may be disposed between the first and second electrodes 481 and 482.

In addition, the light emitting device according to the embodiment may include the second contact portion 492. The second contact portion 492 may be spaced apart from the light emitting structure 410. The second contact portion 492 may be exposed at a lower peripheral portion of the light emitting structure 410. The second contact portion 492 may be electrically connected to the first electrode 481. The second contact portion 492 may be electrically connected to the first electrode 481 by passing through the channel layer 430. For instance, a bottom surface of the second contact portion 492 may come into contact with the top surface of the first electrode 481.

Meanwhile, the above fabrication process is illustrative purpose only and may be variously modified according to the designs.

According to the embodiment, power may be applied to the light emitting structure 410 through the first electrode 481 and the second electrode 482. For example, in the light emitting device according to the embodiment, the power may be applied to the light emitting structure 410 through the second contact portion 492 electrically connected to the first electrode 481 and the conductive support member 470 electrically connected to the second electrode 482.

In the light emitting device according to the embodiment, the through holes 420 are formed from the top surface of the light emitting structure 410. Thus, the manufacturing process can be simplified and the product yield can be improved. In addition, according to the light emitting device of the embodiment, an area of the electrode disposed on the top surface of the light emitting structure 410 can be reduced so that a protective layer may be omitted from the top surface or lateral side of the light emitting structure 410. Therefore, the extraction efficiency of light emitted to the outside from the light emitting structure 410 can be improved.

Meanwhile, according to the embodiment, a plurality of second contact portions 492 and third contact portions 493 may be provided. In this case, the second contact portions 492 may be electrically connected to the first electrode 481, respectively. The second contact portions 492 may come into contact with the first electrode 481. In addition, the third contact portions 493 may be electrically connected to the second electrode 482, respectively. The third contact portions 493 may come into contact with the second electrode 482. Further, the third contact portions 493 may come into contact with at least one of the second metal layer 450, the bonding layer 460 and the conductive support member 470.

Figure 36:
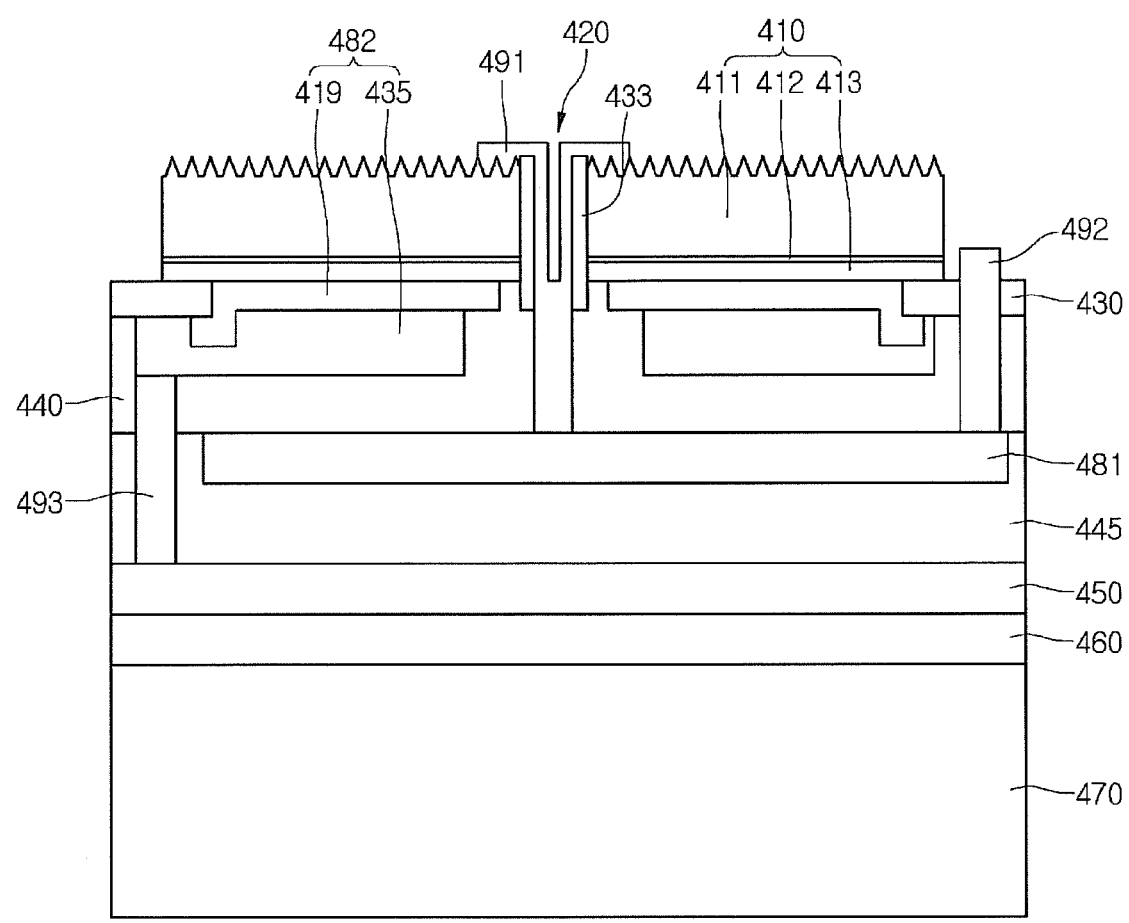
FIG. 36 is a sectional view showing a light emitting device according to still another embodiment.

FIG. 36 is a sectional view showing another example of a light emitting device according to the embodiment. In the description about the light emitting device shown in FIG. 36, the description that has been described with reference to FIGS. 30 and 31 may be omitted in order to avoid redundancy.

According to the light emitting device of the embodiment, an ohmic reflective layer 419 may be provided under the light emitting structure 410. The ohmic reflective layer 419 may be realized such that the ohmic reflective layer 419 may serve as both of the reflective layer 417 and the ohmic contact layer 415. Accordingly, the ohmic reflective layer 419 may make ohmic-contact with the second conductive semiconductor layer 413, and reflect the light incident thereto from the light emitting structure 410.

In this case, the ohmic reflective layer 419 may include multiple layers. For example, the ohmic reflective layer 419 may have a structure in which an Ag layer and a Ni layer are alternately formed, or may include a Ni/Ag/Ni layer, a Ti layer, or a Pt layer.

The second electrode 482 according to the embodiment may include at least one of the ohmic reflective layer 419 and the first metal layer 435.

The light emitting device according to the embodiment may include the first contact portion 491. The first contact portion 491 may be disposed through the light emitting structure 410. The first contact portion 491 may be disposed through the first conductive semiconductor layer 411, the active layer 412 and the second conductive semiconductor layer 413.

For example, as shown in FIG. 31, a plurality of contact portions 491 may be formed in the light emitting structure 410. The first contact portions 491 may be disposed along the through holes 420 of the light emitting structure 410. A first region of the first contact portion 491 may be electrically connected to the first electrode 481 and a second region of the first contact portion 491 may make contact with a top surface of the first conductive semiconductor layer 411. For instance, the first region of the first contact portion 491 may make contact with the first electrode 481. The first region of the first contact portion 491 may make contact with a top surface of the first electrode 481. When the light emitting structure 410 is grown into a GaN semiconductor layer, the first contact portion 491 may make contact with an n face of the first conductive semiconductor layer 411.

Although only one first contact portion 491 is illustrated in the light emitting device shown in FIG. 36, the light emitting structure 410 according to the embodiment may be formed with a plurality of first contact portions 491 as shown in FIG. 31 and the first contact portions 491 may be formed in the through holes 420, respectively.

The first contact portions 491 may be spaced apart from each other on the top surface of the first conductive semiconductor layer 411. Since the first contact portions 491 are distributed on the light emitting structure 410, current applied to the first conductive semiconductor layer 411 may be spread. Thus, the degradation of the first conductive semiconductor layer 411 can be prevented and the combination efficiency of the electrons and holes in the active layer 412 can be improved.

The light emitting device according to the embodiment may include a first insulating layer 433. For example, the first insulating layer 433 may be realized by using oxide or nitride. The first insulating layer 433 may be disposed in the light emitting structure 410. The first insulating layer 433 may be disposed around the first contact portion 491. The first insulating layer 433 may surround the lateral side of the first contact portion 491. The first insulating layer 433 may be disposed through the first conductive semiconductor layer 411, the active layer 412 and the second conductive semiconductor layer 413. A bottom surface of the first insulating layer 433 may be located lower than a bottom surface of the second conductive semiconductor layer 413.

A second insulating layer 440 may be disposed between the first metal layer 435 and the first contact portion 491. The second insulating layer 440 may be formed by using oxide or nitride. The second insulating layer 440 may be disposed under the first metal layer 435. The second insulating layer 440 may be disposed under the first insulating layer 433. The second insulating layer 440 may be disposed under the channel layer 430.

The first electrode 481 may be disposed under the first contact portion 491. The first electrode 481 may include at least one of Au, Cu, Ni, Ti, Ti—W, Cr, W, Pt, V, Fe, and Mo. For example, a bottom surface of the first contact portion 491 may be arranged on the same plane with a top surface of the first electrode 481. The bottom surface of the first contact portion 491 may be located lower than a bottom surface of the second electrode 482. The top surface of the first electrode 481 may be located lower than the bottom surface of the second electrode 482. The second insulating layer 440 may be disposed between the first and second electrodes 481 and 482.

The light emitting device according to the embodiment may include a third insulating layer 445 disposed under the first electrode 481. The third insulating layer 445 may be formed by using oxide or nitride.

A second metal layer 450 may be disposed under the third insulating layer 445. The second metal layer 450 may be electrically connected to the second electrode 482. The second metal layer 450 may be electrically connected to the first metal layer 435. The third contact portion 493 may be disposed between the second metal layer 450 and the second electrode 482. The second metal layer 450 may be electrically connected to the second electrode 482 through the third contact portion 493. The second metal layer 450 may be electrically connected to the first metal layer 435 through the third contact portion 493.

A top surface of the third contact portion 493 may be located higher than a top surface of the first electrode 481. A bottom surface of the third contact portion 493 may be located lower than a bottom surface of the first electrode 481.

The second metal layer 450 may include at least one of Au, Cu, Ni, Ti, Ti—W, Cr, W, Pt, V, Fe, and Mo. The second metal layer 450 may serve as a diffusion barrier layer. The bonding layer 460 and the conductive support member 470 may be provided under the second metal layer 450. The conductive support member 470 may be disposed under the first electrode 481. The third contact portion 493 may be electrically connected to the second electrode 482 and the conductive support member 470.

The first electrode 481 may be disposed under the light emitting structure 410. The first electrode 481 may be electrically connected to the first conductive semiconductor layer 411. A bottom surface of the first electrode 481 may be located lower than a bottom surface of the second electrode 482. A top surface of the first electrode 481 may be located lower than the bottom surface of the second electrode 482. A bottom surface of the first contact portion 491 may be located lower than the bottom surface of the second electrode 482.

In addition, the light emitting device according to the embodiment may include a second contact portion 492. The second contact portion 492 may be spaced apart from the light emitting structure 410. The second contact portion 492 may be exposed at a lower peripheral portion of the light emitting structure 410. The second contact portion 492 may be electrically connected to the first electrode 481. The second contact portion 492 may be electrically connected to the first electrode 481 by passing through the channel layer 430. For instance, a bottom surface of the second contact portion 492 may come into contact with the top surface of the first electrode 481.

The light emitting device according to the embodiment may include the second insulating layer 440 disposed between the first metal layer 435 and the second metal layer 450. A portion of the second insulating layer 440 may surround a peripheral portion of the first contact portion 491. An upper portion of the second insulating layer 440 may make contact with the bottom surface of the first insulating layer 431. A portion of the second insulating layer 440 may surround a peripheral portion of the third contact portion 493. The second insulating layer 440 may be disposed between the first and second electrodes 481 and 482. The second insulating layer 440 may electrically insulate the first electrode 481 from the second electrode 482.

According to the embodiment, power may be applied to the light emitting structure 410 through the first electrode 481 and the second electrode 482. For example, in the light emitting device according to the embodiment, the power may be applied to the light emitting structure 410 through the second contact portion 492 electrically connected to the first electrode 481 and the conductive support member 470 electrically connected to the second electrode 482.

In the light emitting device according to the embodiment, the through holes 420 are formed from the top surface of the light emitting structure 410. Thus, the manufacturing process can be simplified and the product yield can be improved. In addition, according to the light emitting device of the embodiment, an area of the electrode disposed on the top surface of the light emitting structure 410 can be reduced so that a protective layer may be omitted from the top surface or lateral side of the light emitting structure 410. Therefore, the extraction efficiency of light emitted to the outside from the light emitting structure 410 can be improved.

Meanwhile, according to the embodiment, a plurality of second contact portions 492 and third contact portions 493 may be provided. In this case, the second contact portions 492 may be electrically connected to the first electrode 481, respectively. The second contact portions 492 may come into contact with the first electrode 481. In addition, the third contact portions 493 may be electrically connected to the second electrode 482, respectively. The third contact portions 493 may come into contact with the second electrode 482. Further, the third contact portions 493 may come into contact with at least one of the second metal layer 450, the bonding layer 460 and the conductive support member 470.

Figure 37:
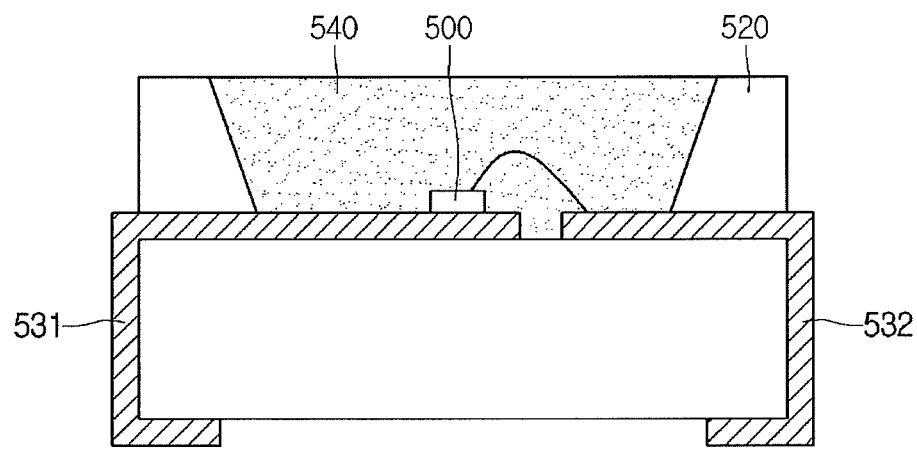
FIG. 37 is a sectional view showing a light emitting device package according to the embodiment.

FIG. 37 is a sectional view showing a light emitting device package to which the light emitting device according to the embodiment is applied.

Referring to FIG. 37, the light emitting device package according to the embodiment may include a body 520, first and second lead electrodes 531 and 532 formed on the body 520, a light emitting device 500 provided on the body 520 and electrically connected to the first and second lead electrodes 531 and 532 and a molding member 540 that surrounds the light emitting device 500.

The body 520 may include silicon, synthetic resin or metallic material, and an inclined surface may be formed in the vicinity of the light emitting device 500.

The first and second lead electrodes 531 and 532 are electrically isolated from each other to supply power to the light emitting device 500. The first and second lead electrode 531 and 532 can improve the light efficiency by reflecting the light emitted from the light emitting device 500. Further, the first and second lead electrodes 531 and 532 dissipate heat generated from the light emitting device 500 to the outside.

The light emitting device 500 can be installed on the body 520 or the first or second lead electrode 531 or 532.

The light emitting device 500 may be electrically connected to the first and second lead electrodes 531 and 532 through one of a wire scheme, a flip-chip scheme, and a die-bonding scheme.

The molding member 540 may surround the light emitting device 500 to protect the light emitting device 500. In addition, the molding member 540 may include phosphors to change the wavelength of the light emitted from the light emitting device 500.

A plurality of light emitting device or light emitting device packages according to the embodiment may be arrayed on a substrate, and an optical member including a lens, a light guide plate, a prism sheet, or a diffusion sheet may be provided on the optical path of the light emitted from the light emitting device package. The light emitting device package, the substrate, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can include a light emitting device, or a light emitting device package according to the embodiment. For example, the lighting apparatus may include a lamp, a signal lamp, an electric sign board and a headlight of a vehicle.

Figure 39:
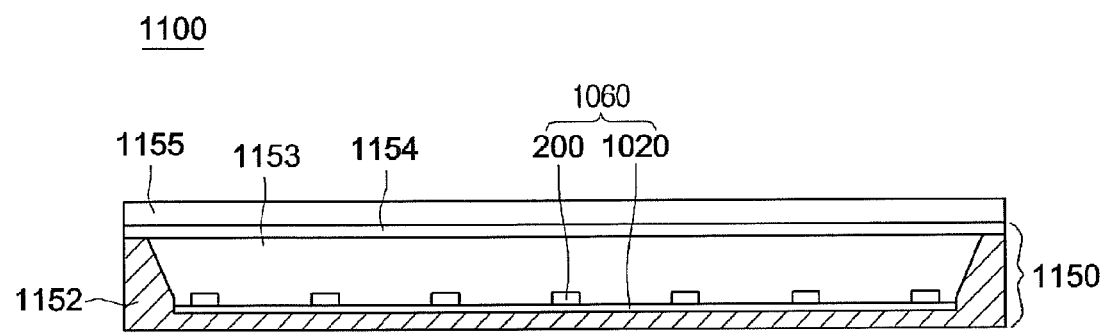
FIG. 39 is a sectional view showing another example of the display device according to the embodiment.
Figure 40:
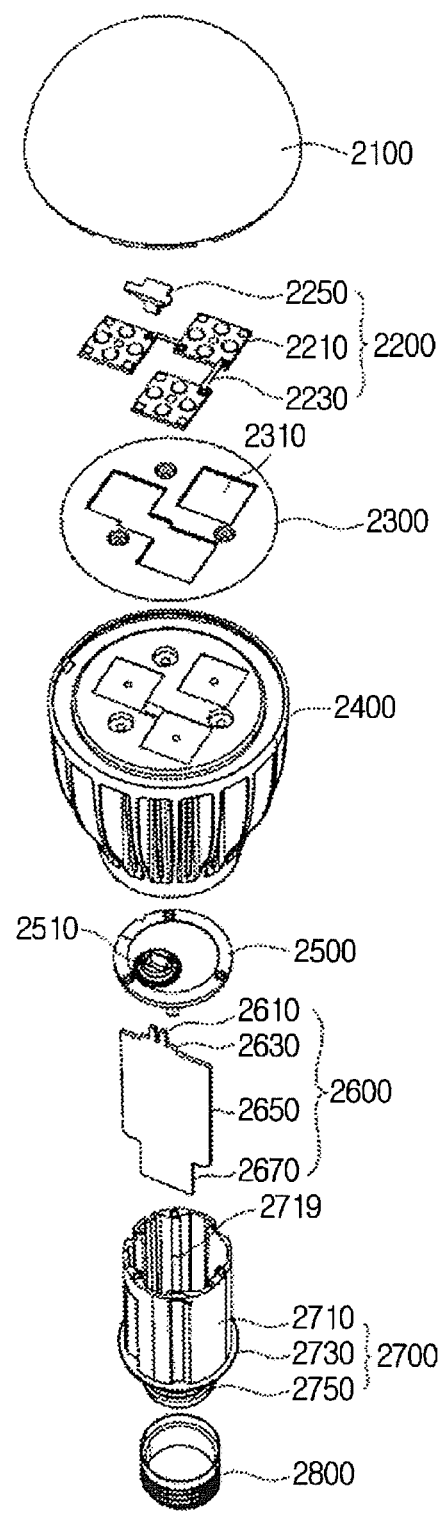
FIG. 40 is an exploded perspective view showing a light unit according to the embodiment.

The light emitting device according to the embodiment may be applied to the light unit. The light unit has a structure in which a plurality of light emitting devices are arrayed. The light unit may include a display device as shown in FIGS. 38 and 39 and the lighting apparatus as shown in FIG. 40.

Figure 38:
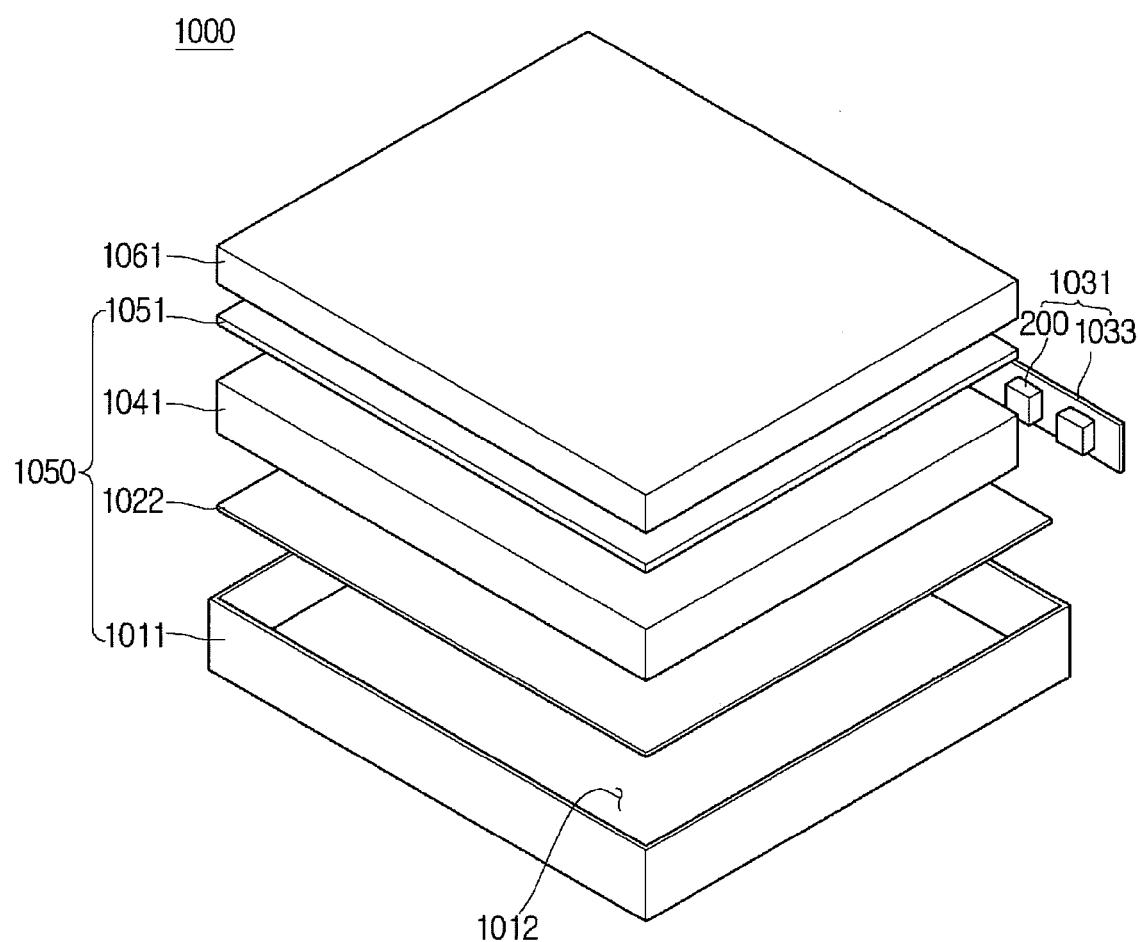
FIG. 38 is an exploded perspective view showing a display device according to the embodiment.

Referring to FIG. 38, a display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may include transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) including a circuit pattern. In addition, the board 1033 may also include a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and includes at least one transmissive sheet. For example, the optical sheet 1051 includes at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 39 is a sectional view showing another example of a display device according to the embodiment.

Referring to FIG. 39, the display device 1100 includes a bottom cover 1152, a board 1020 on which the light emitting devices 100 are arrayed, an optical member 1154, and a display panel 1155. The board 1020 and the light emitting device packages 200 may constitute a light emitting module 1060. In addition, the bottom cover 1152, at least one light emitting module 1060, and the optical member 1154 may constitute the light unit. The bottom cover 1152 can be provided therein with a receiving section 1153, but the embodiment is not limited thereto.

In this case, the optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 40 is a perspective view showing a lighting apparatus according to the embodiment.

Referring to FIG. 40, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500. The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device capable of improving light extraction efficiency and product yield, a light emitting device package, and a light unit.

A light emitting device according to the embodiment includes a light emitting structure comprising a first conductive semiconductor layer, an active layer under the first conductive semiconductor layer, and a second conductive semiconductor layer under the active layer; a first electrode electrically connected to the first conductive semiconductor layer and disposed under the light emitting structure; a second electrode electrically connected to the second conductive semiconductor layer and disposed under the light emitting structure; a first contact portion disposed through the light emitting structure and including a first region electrically connected to the first electrode and a second region making contact with a top surface of the first conductive semiconductor layer; and an insulating ion implantation layer disposed around the first contact portion to insulate the first contact portion from the second conductive semiconductor layer.

A light emitting device according to the embodiment includes a light emitting structure comprising a first conductive semiconductor layer, an active layer, and a second conductive semiconductor layer; a first electrode electrically connected to the first conductive semiconductor layer and disposed under the light emitting structure; a second electrode electrically connected to the second conductive semiconductor layer and disposed under the light emitting structure; a plurality of first contact portions disposed through the light emitting structure and including a first region electrically connected to the first electrode and a second region making contact with a top surface of the first conductive semiconductor layer; and an insulating ion implantation layer disposed around the first contact portion to insulate the first contact portion from the second conductive semiconductor layer, wherein the first contact portions are spaced apart from each other and disposed on a top surface of the first conductive semiconductor layer.

A light emitting device according to the embodiment includes a light emitting structure comprising a first conductive semiconductor layer, an active layer, and a second conductive semiconductor layer; a first electrode electrically connected to the first conductive semiconductor layer and disposed under the light emitting structure; a second electrode electrically connected to the second conductive semiconductor layer and disposed under the light emitting structure; a plurality of first contact portions disposed through the light emitting structure and including a first region electrically connected to the first electrode and a second region making contact with a top surface of the first conductive semiconductor layer; and an insulating ion implantation layer disposed around the first contact portion to insulate the first contact portion from the second conductive semiconductor layer, wherein the insulating ion implantation layer is disposed through the active layer and the second conductive semiconductor layer, and wherein the plurality of first contact portions have widths in a range of about 3 μm to about 5 μm.

The light emitting device, the light emitting device package and the light unit according to the embodiment can improve the light extraction efficiency and product yield.

Any reference in this specification to "one embodiment," "an embodiment," "example embodiment," etc., means that a particular feature, structure, or characteristic described in connection with the embodiment is included in at least one embodiment of the application. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive semiconductor layer, an active layer under the first conductive semiconductor layer, and a second conductive semiconductor layer under the active layer;
a first electrode electrically connected to the first conductive semiconductor layer and provided under the light emitting structure;
a second electrode electrically connected to the second conductive semiconductor layer and provided under the light emitting structure;
a first contact portion provided through the light emitting structure and including a first region electrically connected to the first electrode and a second region that makes contact with a top surface of the first conductive semiconductor layer; and
an insulating ion implantation layer provided around the first contact portion to insulate the first contact portion from the second conductive semiconductor layer, wherein the first contact portion includes a conductive ion implantation layer.

2. The light emitting device of claim 1, further including a second contact portion spaced apart from the light emitting structure and electrically connected to the second electrode.

3. The light emitting device of claim 1, wherein the first contact portion is provided through the first conductive semiconductor layer, the active layer, and the second conductive semiconductor layer.

4. The light emitting device of claim 1, wherein a bottom surface of the first contact portion is arranged on a same plane with a bottom surface of the second conductive semiconductor layer.

5. The light emitting device of claim 1, wherein a bottom surface of the first electrode is provided lower than a bottom surface of the second electrode.

6. The light emitting device of claim 1, wherein the second electrode includes an ohmic contact layer and a reflective layer.

7. The light emitting device of claim 1, wherein the insulating ion implantation layer is provided between the active layer and the first contact portion.

8. The light emitting device of claim 1, wherein the insulating ion implantation layer is provided through the active layer and the second conductive semiconductor layer.

9. The light emitting device of claim 1, wherein a top surface of the first electrode is arranged on a same plane with a top surface of the second electrode.

10. The light emitting device of claim 1, further including a channel layer exposed at a lower peripheral portion of the light emitting structure and that makes contact with a bottom surface of the second conductive semiconductor layer.

11. The light emitting device of claim 1, wherein the insulating ion implantation layer is formed by implanting at least one of an N ion, an O ion, or an Ar ion.

12. The light emitting device of claim 1, further including an insulating layer between the first electrode and second electrode.

13. The light emitting device of claim 12, wherein a top surface of the insulating layer makes contact with a bottom surface of the insulating ion implantation layer.

14. The light emitting device of claim 1, wherein the conductive ion implantation layer is formed by implanting at least one of a Ti ion, an Al ion, or an Au ion.

15. The light emitting device of claim 1, wherein the first contact portion provided in the light emitting structure has a width in a range of 3 μm to 5 μm.

16. A light emitting device comprising:
- a light emitting structure including a first conductive semiconductor layer, an active layer, and a second conductive semiconductor layer;
- a first electrode electrically connected to the first conductive semiconductor layer and provided under the light emitting structure;
- a second electrode electrically connected to the second conductive semiconductor layer and provided under the light emitting structure;
- a plurality of first contact portions provided through the light emitting structure and including a first region electrically connected to the first electrode and a second region that makes contact with a top surface of the first conductive semiconductor layer; and
- an insulating ion implantation layer provided around the first contact portion to insulate the first contact portion from the second conductive semiconductor layer, wherein the first contact portions are spaced apart from each other and provided on the top surface of the first conductive semiconductor layer, and wherein each of the first contact portions includes a conductive ion implantation layer.

17. The light emitting device of claim 16, further including a second contact portion spaced apart from the light emitting structure and electrically connected to the second electrode.

18. The light emitting device of claim 16, wherein the first contact portions are provided through the first conductive semiconductor layer, the active layer, and the second conductive semiconductor layer.

19. A light emitting device comprising:
- a light emitting structure including a first conductive semiconductor layer, an active layer, and a second conductive semiconductor layer;
- a first electrode electrically connected to the first conductive semiconductor layer and provided under the light emitting structure;
- a second electrode electrically connected to the second conductive semiconductor layer and provided under the light emitting structure;
- a plurality of first contact portions provided through the light emitting structure and including a first region electrically connected to the first electrode and a second region that makes contact with a top surface of the first conductive semiconductor layer; and
- an insulating ion implantation layer provided around the first contact portion to insulate the first contact portion from the second conductive semiconductor layer, wherein the insulating ion implantation layer is provided through the active layer and the second conductive semiconductor layer, wherein each of the first contact portions includes a conductive ion implantation layer, and wherein the plurality of first contact portions have widths in a range of about 3 μm to about 5 μm.

* * * * *